United States Patent [19]

Nakagawa et al.

[11] Patent Number: 5,008,726
[45] Date of Patent: Apr. 16, 1991

[54] PIN JUNCTION PHOTOVOLTAIC ELEMENT WITH P OR N-TYPE SEMICONDUCTOR LAYER COMPRISING NON-SINGLE CRYSTAL MATERIAL CONTAINING ZN, SE, TE, H IN AMOUNT OF 1 TO 4 ATOMIC % AND A DOPAND AND I-TYPE SEMICONDUCTOR LAYER COMPRISING NON-SINGLE CRYSTAL SI(H,F) MATERIAL

[75] Inventors: Katsumi Nakagawa, Nagahama; Shunichi Ishihara, Hikone; Masahiro Kanai, Tokyo; Tsutomu Murakami, Nagahama; Kozo Arao, Hikone; Yasushi Fujioka; Akira Sakai, both of Nagahama, all of Japan

[73] Assignee: Canon Kabushiki Kaisha, Tokyo, Japan

[21] Appl. No.: 273,070

[22] Filed: Nov. 18, 1988

[30] Foreign Application Priority Data

Nov. 20, 1987 [JP] Japan .................................. 62-291684

[51] Int. Cl.$^5$ ..................... H01L 27/14; H01L 31/00; H01L 29/18; H01L 29/161
[52] U.S. Cl. .................................. 357/30; 357/11; 357/16; 357/17
[58] Field of Search ..................... 357/16, 30 B, 11, 17

[56] References Cited

U.S. PATENT DOCUMENTS

| | | | |
|---|---|---|---|
| 4,105,472 | 8/1978 | Lancaster | 357/30 B |
| 4,105,477 | 8/1978 | Johnson et al. | 357/30 B |
| 4,105,478 | 8/1978 | Johnson | 357/30 B |
| 4,217,374 | 8/1980 | Ovshinsky et al. | 427/39 |
| 4,345,107 | 8/1982 | Fulop et al. | 357/30 B |
| 4,465,527 | 8/1984 | Nishizawa | 148/171 |
| 4,525,687 | 6/1985 | Chemla et al. | 357/17 |
| 4,851,302 | 7/1989 | Nakagawa et al. | 428/658 |

FOREIGN PATENT DOCUMENTS

| | | | |
|---|---|---|---|
| 52-024483 | 2/1977 | Japan | 357/30 B |
| 61-120480 | 6/1986 | Japan | 357/16 |

OTHER PUBLICATIONS

Kamins et al, "Hydrogenation of Transistor Fabricated in Polycrystalline Silicon Film", 1980, pp. 159–161.
Larsen et al, "Electrical Transport & Photoelectronic Properties of ZnTe:Al Crystal", 4-8-71, pp. 172–181.
Bleicher, "Group II-VI Compounds in Optoelectronics", Funk-Technik, vol., 31, No. 20, pp. 644, 645, 648, 649, 652 (Oct. 1976).

*Primary Examiner*—Andrew J. James
*Assistant Examiner*—Daniel Kim
*Attorney, Agent, or Firm*—Fitzpatrick, Cella, Harper & Scinto

[57] ABSTRACT

An improved pin junction photovoltaic element which causes photoelectromotive force by the junction of a p-type semiconductor layer, an i-type semiconductor layer and an n-type semiconductor layer, characterized in that at least one of said p-type semiconductor layer and said n-type semiconductor layer comprises a p-typed or n-typed $ZSnSe_{1-x}Te_x$:H:M film, where M is a dopant of p-type or n-type: the quantitative ratio of the Se to the Te is in the range of from 1:9 to 3:7 in terms of atomic ratio: the amount of the H is in the range of from 1 to 4 atomic %: and said film contains crystal grain domains in a proportion of 65 to 85 vol % per unit volume; and said i-type semiconductor layer comprises a non-single crystal Si(H,F) film or a non-single crystal Si(C,Ge)(H,F) film.

8 Claims, 16 Drawing Sheets

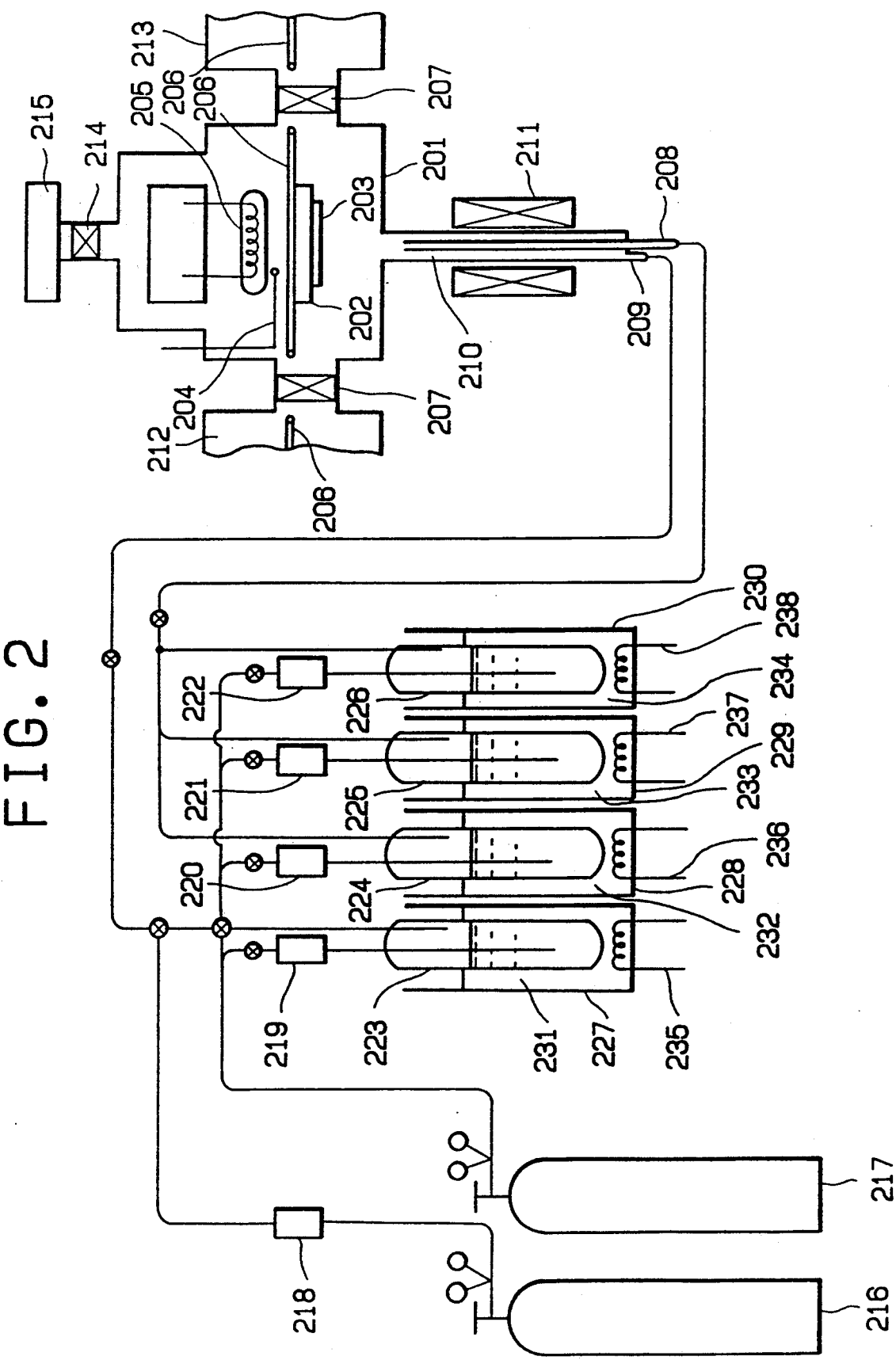

Dark conductivity of n-type doped film (when the hydrogen(H) content is 2 atomic %)

PIN JUNCTION PHOTOVOLTAIC ELEMENT WITH P OR N-TYPE SEMICONDUCTOR LAYER COMPRISING NON-SINGLE CRYSTAL MATERIAL CONTAINING ZN, SE, TE, H IN AMOUNT OF 1 TO 4 ATOMIC % AND A DOPAND AND I-TYPE SEMICONDUCTOR LAYER COMPRISING NON-SINGLE CRYSTAL SI(H,F) MATERIAL

FIELD OF THE INVENTION

The present invention relates to an improved photo-voltaic element which is usable as a power source for electric appliances and also as a power generator. More particularly, it relates to an improved pin junction photo-voltaic element with a p-type or n-type semiconductor layer comprising a non-single crystal material containing zinc atoms, selenium atoms, tellurium atoms, hydrogen atoms in an amount of 1 to 4 atomic % and a dopant and an i-type semiconductor layer comprising a non-single crystal Si(H,F) material which exhibits a high photoelectric conversion efficiency particularly for short-wavelength light.

BACKGROUND OF THE INVENTION

There have been proposed a variety of pin junction photo-voltaic elements for solar cells and for power sources in various electric appliances. Such photo-voltaic elements are formed by ion implantation or thermal diffusion of an impurity into a single crystal substrate of silicon (Si) or gallium arsenide (GaAs), or by epitaxial growth of an impurity-doped layer on said single crystal substrate. However, there is a disadvantage for these photo-voltaic elements that their production cost unavoidably becomes costly because of using said specific single crystal substrate. Because of this, they have not yet gained general acceptance for use as solar cells or as power sources in electric appliances.

Recently, there has been proposed a photo-voltaic element in which there is utilized a pin junction of amorphous silicon (hereinafter referred to as "A-Si") deposited film formed on an inexpensive non-single crystal substrate of glass, metal, ceramic or synthetic resin by way of the glow discharge decomposition method. This photo-voltaic element has a nearly satisfactory performance and is of low production cost and because of this, it has been recognized as usable as a power source for some kinds of appliances such as electronic calculators and wrist watches.

However, for this photo-voltaic element, there is a disadvantage that the output voltage is low because the band gap of the A-Si film constituting the element is about 1.7 eV, which is not large enough. There is another disadvantage that its photoelectric conversion efficiency is low for a light source such as fluorescent light which contains short-wavelength light in a dominant proportion, so that its application is limited to appliances with very small power consumption.

There is a further disadvantage for said photo-voltaic element that the constituent A-Si film is often effected by the so-called Staebler-Wronski effect, in which the film is deteriorated upon continuous irradiation with intense light for a long period of time.

For a photo-voltaic element to be utilized as a power supplying solar cell, it is necessary to convert efficiently and continuously the light energy of sunlight into electric energy, and hence, it is desired to have such a layer structure that permits photoelectric conversion for sunlight over as broad a spectrum range as possible.

Now, in the case of a photo-voltaic element which is made using a semiconductor material having a small energy band gap, the wavelength region of light to be absorbed by the layer is extended from the short wavelength side to the long-wavelength side. However, in this case, it is the long-wavelength component of sunlight alone that contributes to photoelectric conversion, and the energy of the short-wavelength component is not utilized for photoelectric conversion. This is because the amount of energy to be outputted by the photoelectric conversion is decided upon the energy band gap of the semiconductor material as used.

On the other hand, in the case of a photo-voltaic element which is made using a semiconductor material having a large energy band gap, the wavelength component which is absorbed by the layer and comes to contribute to photoelectric conversion is the short wavelength light having an energy exceeding the energy band gap of the semiconductor material as used, and the long-wavelength component is not utilized for photoelectric conversion.

In a photo-voltaic element, the maximum voltage or open-circuit voltage (Voc) to be outputted is determined upon the energy band gap values of the semiconductor materials to be joined together. In view of this, in order to obtain a high Voc, semiconductor materials having a great energy band gap are desired to be used.

Therefore, there is eventually a limit for the photoelectric conversion efficiency for a photo-voltaic element, which is prepared by using the sole semiconductor material.

The foregoing led to an idea of forming a plurality of photo-voltaic elements using a plurality of semiconductor materials each having a different energy band gap, so that the individual photo-voltaic elements become responsible for the different wavelength regions of sunlight. This idea was expected to contribute to an improvement in the photoelectric conversion efficiency.

However, there is a disadvantage for the solar cell having such a structure as mentioned above in that the high photoelectric conversion as a whole is possible only in the case where the individual photo-voltaic elements have good characteristics, because it is of such structure that a plurality of photo-voltaic elements are stacked to form an electrically serial structure.

Unfortunately, for the photo-voltaic element having the foregoing structure, there has not yet been realized any desirable one wherein the respective constitutent elements as stacked have satisfactory values of energy band gap and satisfactory characteristics as desired and that provides a high Voc as the photo-voltaic element.

There have been proposed direct transition-type semiconductor films having a wide band gap, such as ZnSe (having a band gap of 2.67 eV) and ZnTe (having a band gap of 2.26 eV) and mixed crystal thereof $ZnSe_{1-x}Te_x$ (where $0 < X < 1$). Public attention has been focused on these semiconductor films. These semiconductor films are, in general, formed on a single crystal substrate by way of epitaxial growth. The as-grown film of ZnSe exhibits n-type conductivity and the as-grown film of ZnTe exhibits p-type conductivity. However for any of these films, it is generally recognized that it is difficult for the film to be controlled to exhibit the opposite conductivity. Further, in order to carry out the epitaxial growth upon the film formation, it is required to use a specific single crystal substrate and to maintain the substrate at elevated temperature. And in this film formation, the deposition rate is low. Because of this, it is impossible to perform epitaxial growth on a commercially available substrate which is inexpensive and low heat-resistant such as glass and synthetic resin. These factors make it difficult to develop practically applicable semiconductor films using the foregoing commerically available substrates.

Even in the case where a semiconductor film should be fortunately formed on such commercially available substrate, the film will be such that is usable only in very limited applications.

There have been various proposals to form a direct transition-type semiconductor film on a non-single crystal substrate such as glass, metal, ceramics and synthetic resin. However, under any of such proposals, it is difficult to obtain a desired direct transition-type semiconductor film having satisfactory electrical characteristics because the resulting film is accompanied with defects of various kinds which make the film poor in electrical characteristics and on account of this, it is difficult for the film to be controlled by doping it with an impurity.

In the meantime, an amorphous film comprised of Zn and Se elements can be found in prior art references. As such prior art references, there are U.S. Pat. No. 4,217,374 (hereinafter, called "literature 1") and U.S. Pat. No. 4,226,898 (hereinafter, called "literature 2"). And ZnSe compound is described in Japanese Patent Laid-open No. 189649/1986 (hereinafter, called "literature 3") and Japanese Patent Laid-open No. 189650/1986 (hereinafter, called "literature 4").

Now, literature 1 discloses amorphous semiconductor films containing selenium (Se) or tellurium (Te), and zinc (Zn), hydrogen (H) and lithium (Li); but the subject lies in amorphous selenium semiconductor film or in amorphous tellurium semiconductor film, and the Zn described therein is merely an additive as well as Li and H. And as for the Zn and the Li, likewise in the case of the H, they are used to reduce the local state density in the energy band gap without changing the inherent characteristics of the film. In other words, the incorporation of Zn into the amorphous Se or the amorphous Te in literature 1 is not intended to positively form a ZnSe compound or a ZnTe compound. Incidentally, literature 1 mentions nothing about the formation of a ZnSe compound, ZnTe compound, $ZnSe_{1-x}Te_x$ compound, ZnSe crystal grains, ZnTe crystal grains or $ZnSe_{1-x}Te_x$ crystal grains. And as for the addition of Li, it should be noted that it is not added as a dopant.

Literature 2 does mention amorphous semiconductor films containing Se or Te, and Zn, and H. However, it deals mainly with amorphous silicon, and it defines Se and Te as elements to form a compound with said silicon. As for the Zn, it defines as an element to sensitize the photoconductivity and reduce the local state density in the energy gap. In other words, the additions of Zn and Se are not intended to form a ZnSe compound, ZnTe compound or $ZnSe_{1-x}Te_x$ compound. Incidentally, literature 2 mentions nothing about the formation of a ZnSe compound, ZnTe compound, $ZnSe_{1-x}Te_x$ compound, ZnSe crystal grains, ZnTe crystal grains or $ZnSe_{1-x}Te_x$ crystal grains.

Literature 3 and literature 4 are concerned with the deposition of a ZnSe film by HR-CVD method (hydrogen radical assisted CVD method). That is, they disclose methods of improving the deposition rate and the productivity of a deposited film; and they merely mention productivity of a deposited film; and they merely mention deposited films of non-doped ZnSe.

Against this background, there is an increased social demand to provide an inexpensive photo-voltaic element having a high photoelectric conversion efficiency, particularly, for short-wavelength light which may be practically usable as a solar cell and also as a power source in various electric appliances.

SUMMARY OF THE INVENTION

The present invention is aimed at solving the aforementioned problems relating to photo-voltaic elements for use in solar cells and other appliances and satisfying the foregoing social demands.

It is therefore an object of the present invention to provide an improved pin junction photo-voltaic element usable in devices typified by a solar cell with the use of an improved functional deposited film which may be desirably formed even on a commercially available inexpensive non-single crystal substrate of glass, metal, ceramic or synthetic resin and which may form a desired pin junction with other films to be formed on such substrate.

Another object of the present invention is to provide an improved pin junction photo-voltaic element which provides a high photoelectric conversion particularly for short-wavelength light and which is usable in devices typified by a solar cell.

A further object of the present invention is to provide an improved pin junction photo-voltaic element with a p-type or n-type semiconductor layer comprising a non-single crystal material containing zinc atoms, selenium atoms, tellurium atoms, hydrogen atoms in an amount of 1 to 4 atomic % and a dopant of p-type or n-type and an i-type semiconductor layer comprising a silicon-containing non-single crystal film, which exhibits a high photoelectric conversion efficiency particularly for short-wavelength light and which is effectively usable particularly as a solar cell.

BRIEF DESCRIPTION OF THE DRAWINGS

FIG. 2 is a schematic diagram to illustrate a representative apparatus suitable for practicing the later described process (1) of forming a constituent layer for any of the above photo-voltaic elements according to the present invention.

DETAILED DESCRIPTION OF THE INVENTION

Figure 1A:
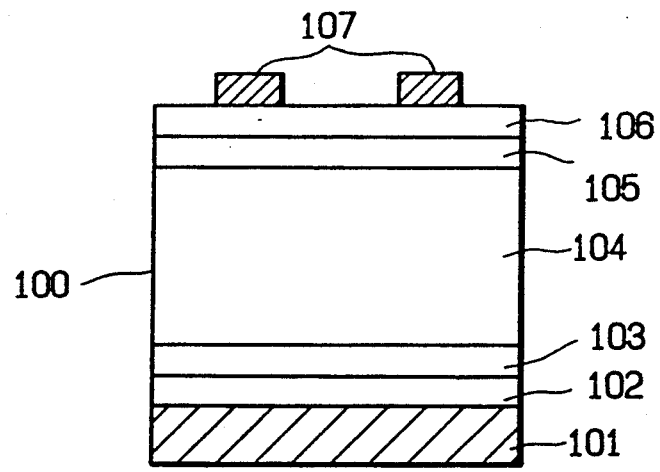
FIG. 1(A) is a schematic cross-sectional view of a typical pin junction photo-voltaic element according to the present invention.

The present inventors have made extensive studies for overcoming the foregoing problems not only on the known ZnSe films but also on the known $ZnSe_{1-x}Te_x$ film for use in various appliances such as solar cells and attaining the objects as described above and as a result, have accomplished the present invention based on the findings obtained through various experiments as below described.

That is, as a result that $ZnSe_{1-x}Te_x$ deposited film was made in which the quantitative ratio of Se to Te was controlled to a specific value, a specific amount of hydrogen atoms being incorporated and the proportion of crystal grain domains per unit volume being controlled to a specific value (this deposited film is hereinafter referred to as "$ZnSe_{1-x}Te_x$:H film"), the present inventors have found that (a) said $ZnSe_{1-x}Te_x$:H film is a non-single crystal film which may be formed in a desired state even on a non-single crystal substrate of glass, metal, ceramic or synthetic resin: (b) the $ZnSe_{1-x}Te_x$:H film formed on such non-single crystal substrate is accompanied with very few defects: (c) it can be easily and efficiently doped with a dopant of p-type or n-type: and (d) when doped with a p-type dopant, there is afforded a desirable p-type $ZnSe_{1-x}Te_x$:H semiconductor film having a wealth of many practically applicable semiconductor characteristics.

The present inventors have found further that in the case of using the foregoing $ZnSe_{1-x}Te_x$:H film as a member for pin junction in the preparation of a pin junction photo-voltaic element, there is afforded a pin junction photo-voltaic element which efficiently and stably generates a desired photoelectromotive force.

The present invention has been completed on the basis of these findings, and it provides pin junction photo-voltaic elements as below mentioned; (1) a pin junction photo-voltaic element which comprises a p-type semiconductor layer, an i-type semiconductor layer and an n-type semiconductor layer being stacked, characterized in that at least said p-type semiconductor layer or said n-type semiconductor layer comprises a deposited film comprised of zinc atoms, selenium atoms, tellurium atoms and at least hydrogen atoms and which contains a p-type or n-type dopant: the quantitative ratio of said selenium atoms to said tellurium atoms in said deposited film is in the range of from 1:9 to 3:7 in terms of atomic ratio: said deposited film contains said hydrogen atoms in an amount of 1 to 4 atomic %: and said deposited film contains crystal grain domains in a proportion of 65 to 85 vol % per unit volume; and said i-type semiconductor layer comprises (a) a non-single crystal film containing silicon atoms as the matrix and at least one kind selected from the group consisting of hydrogen atoms and fluorine atoms or (b) a non-single crystal film containing silicon atoms, at least one kind selected from the group consisting of carbon atoms and germanium atoms, and at least one kind selected from the group consisting of hydrogen atoms and fluorine atoms;

(2) the pin junction photo-voltaic element as defined in the above (1), wherein said p-type dopant is a member selected from the group consisting of Group I elements and Group V elements of the Periodic Table; and (3) the pin junction photo-voltaic element as defined in the above (2), wherein said member is lithium.

The experiments carried out by the present inventors to obtain the foregoing findings will be detailed in the following.

Experiment A

Observations on the proportion of crystal grain domains as formed in a $ZnSe_{1-x}Te_x$ deposited film when hydrogen atoms are introduced thereinto (1) Preparation of samples (i) There were provided two kinds of substrates; (a) a p-type round silicon wafer of 0.5 mm in thickness and 1 inch in diameter (having an electrical resistivity ($\rho$) of about $10^{-1}$ $\Omega$—cm), on which is formed an $SiO_2$ film of about 5000 Å in thickness, by way of the known thermal oxidation treatment in an oxygen gas stream at 1000° C. and (b) a square quartz glass of 2.5 cm by 2.5 cm in size.

(ii) The above-mentioned two substrates were placed side by side on the substrate holder 202 of the known apparatus as shown in FIG. 2. On every substrate was formed a $ZnSe_{1-x}Te_x$:H film under the conditions shown in Table 1. Thus, there were obtained samples Nos. 1-12 [on substrates (a)] and samples Nos. 1'12' [on substrates (b)].

(iii) Each of samples Nos. 1-12 (deposited on silicon wafers) was cut in half. Each of the cut halves was cut to a 5 mm square size which matches the holder of the known transmission electron microscope (TEM). The cut piece was fixed to a glass plate, measuring 50 mm by 50 mm and 1 mm thick, by the aid of wax, with the deposited film in contact with the glass surface so that the deposited film is visible through the opposite side of the glass plate.

(iv) The exposed part comprising silicon single crystal wafer of the sample as prepared in (iii) was etched with an aqueous solution contining HF, HNO$_3$, and CH$_3$COOH. The etching rate was properly controlled by chaning the concentration of HF in the etching solution. Etching was continued until the silicon single crystal wafer was completely removed. In this case, the progress of the etching was confirmed by observing the light passing through the deposited film.

(v) After etching, the wax was removed by the aid of an organic solvent (toluene), and the deposited film was separated from the glass plate, followed by rinsing and air drying. Thus there was obtained a film specimen composed of an SiO$_2$ film and a ZnSe$_{1-x}$Te$_x$:H film thereon.

(2) Examination of the film specimens prepared in (1)

Each film specimen of samples Nos. 1-12 formed on silicon wafers in the above step (1) was examined by fixing it to the sample holder of the TEM (acceleration voltage: 200 KeV) to form a transmission image and observing the resultant transmission image. As a result, it was found for the resultant transmission image that there is a lattice image with very few lattice defects in the part of the ZnSe$_{1-x}$Te$_x$:H film where crystal grain domains exist. It was also found that the lattice images are uniformly distributed throughout the ZnSe$_{1-x}$Te$_x$:H film.

The lattice image was utilized to determine the proportion of crystal grain domains in a certain area of the film specimen. Thus the proportion in terms of volume percentage (vol%) of the crystal grain domains present in the deposited film was calculated.

For the purpose of reference, the direction of the crystal grain and the size of the crystal grain domain were measured by the aid of X-ray diffraction.

(3) Determination of the amount of hydrogen atoms (H) in the deposited film (i) Each of samples Nos. 1'-12' deposited on quartz substrates in the above-mentioned step (1)-(i) was cut in half. Each of the cut halves was placed in a vacuum chamber and heated therein from room temperature to 1000° C. During the heating process, the amount of hydrogen atoms (H) released from the specimen was determined by means of a mass spectrometer. The resulting data were compared with those of the standard sample prepared by implanting a known amount of hydrogen atoms into a hydrogen-free sample.

(ii) Each deposited film of samples Nos. 1-12 used for the TEM observation was examined for the distribution of Zn atoms, Se atoms, and Te atoms by the aid of a known X-ray microanalyzer (hereinafter referred to as "XMA", made by Shimazu Seisakusho Ltd.), and was also subjected to elemental analysis. The results obtained were as shown in Table 2.

The above analysis was carried out on the assumption that the matrix is comprised of Zn, Se, and Te, and hydrogen atoms (H), and others in the film were excluded from calculations.

The data obtained for all of samples Nos. 1-12 indicate that Zn atoms, Se atoms, and Te atoms are uniformly distributed in the entire layer region of the deposited film and that the ratio of Zn atoms versus the sum of Se atoms and Te atoms is stoichiometrically about 1:1, and the ratio of Se atoms to Te atoms is 2:8.

(4) Results

Figure 5:
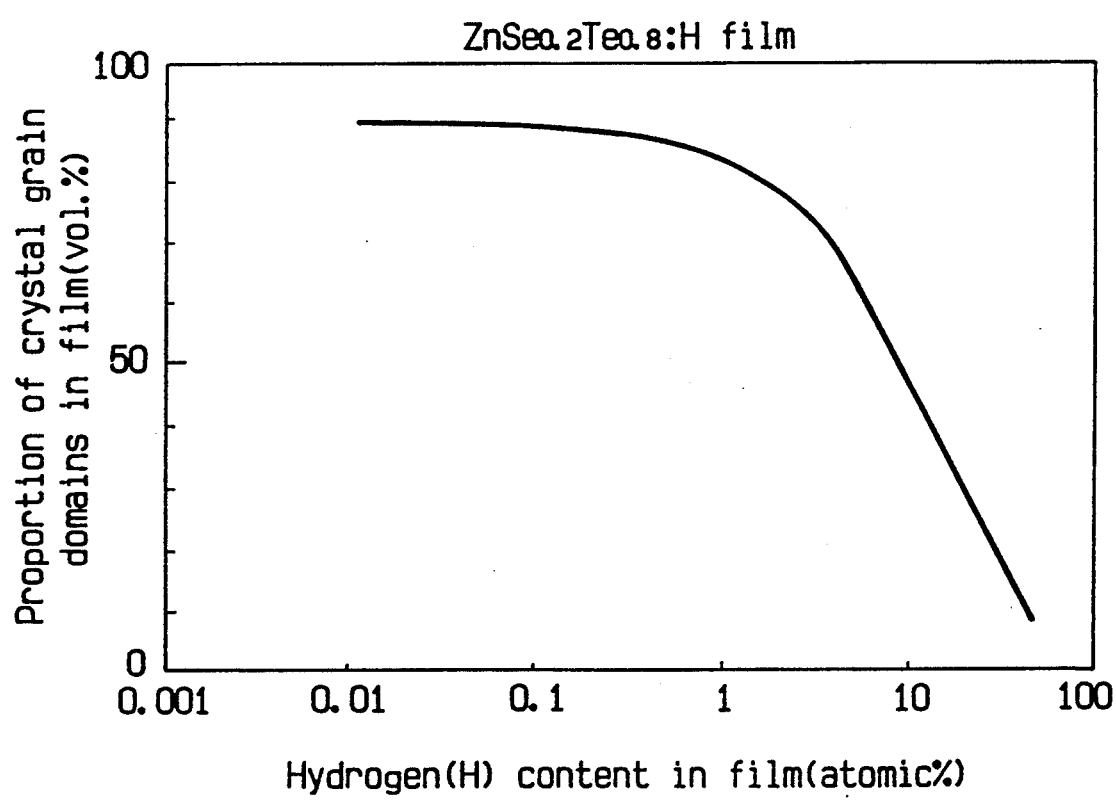
FIG. 5 is a graph showing the interrelation between the content of hydrogen atoms (H) and the proportion of crystal grain domains for a $ZnSe_{1-x}Te_x$:H film in Experiments A(2) and A(3).

The results of the measurements in the above steps (2) and (3) were graphically shown in FIG. 5. It was found from the results shown in FIG. 5 that as the content (atomic%) of hydrogen atoms (H) in a ZnSe$_{1-x}$Te$_x$:H deposited film (x=0.8) increases, the proportion of crystal grain domains per unit volume in the deposited film decreases. And with the content of hydrogen atoms in the range of 0.1 to 10 atomic%, the proportion of crystal grain domains per unit volume in the film ranges from 90 to 40 vol%.

In the sample preparation in the above step (1), when the flow rate of hydrogen gas was controlled to a value lower than 0.05 sccm, the resulting deposited film became such that is composed mainly of Zn; and with a flow rate in excess of 2 slm, no film was deposited.

Experiment B

Observations on the interrelations among electrical characteristics, the content of hydrogen atoms and the proportion of crystal grain domains per unit volume for the deposited film The deposited film formed on the quartz substrate in the above A-(1)-(ii) was examined for dark conductivity. The examination was carried out using the remaining cut halves of samples Nos. 1'-12'. Prior to measurements, a comb-shaped aluminum electrode was formed on each specimen by vacuum deposition. The results obtained were as shown in FIG. 6.

Figure 6:
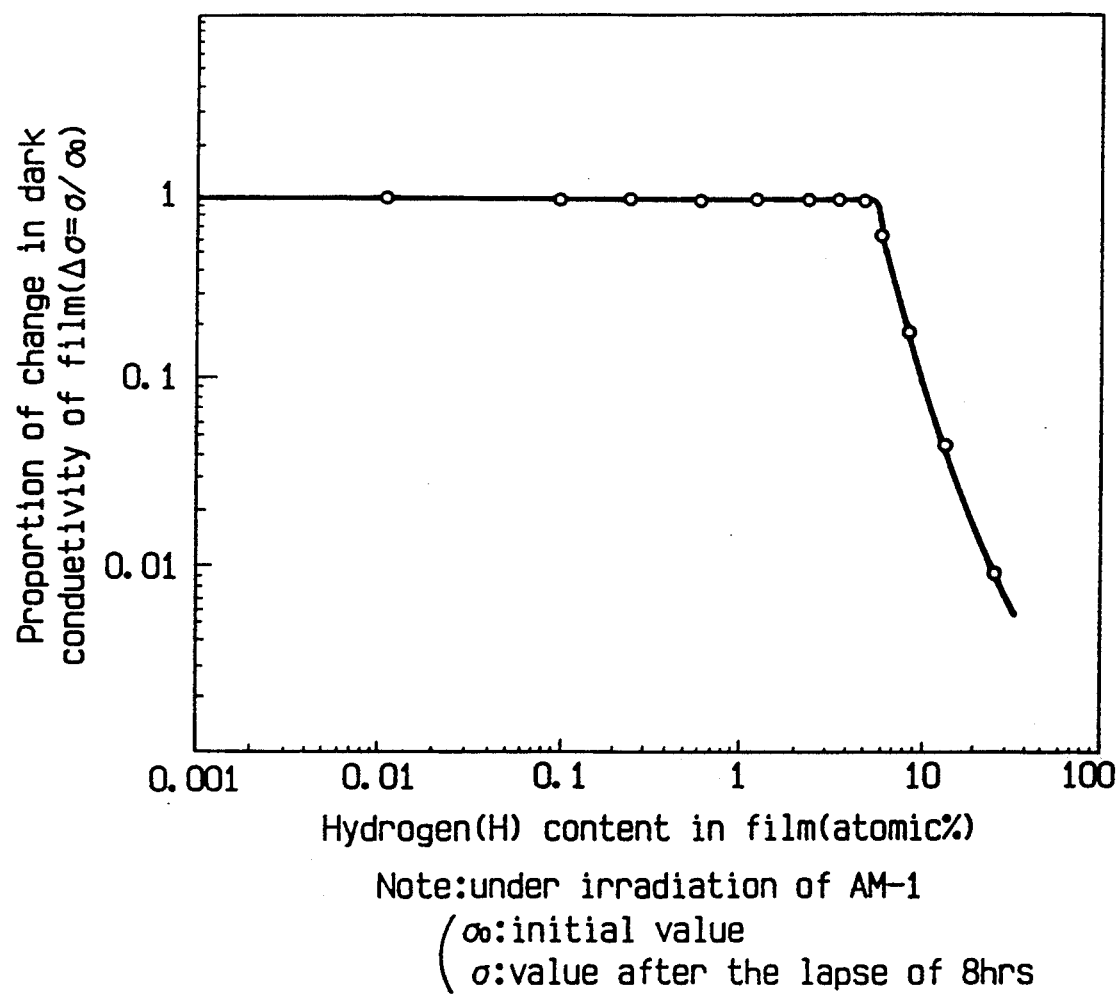
FIG. 6 is a graph showing the interrelation between the content of hydrogen atoms (H) and the ratio of the change in conductivity for a $ZnSe_{1-x}Te_x$:H film in Experiment B.

From the results shown in FIG. 6, the following facts were found with respect to the ratio of the change in dark conductivity ($\sigma$) after irradiation with AM-1.5 for 8 hours versus the initial value ($\sigma$o), that is, $\Delta\sigma=/\sigma$o.

That is, it varies depending on the content of hydrogen atoms (H) in the film. With 4 atomic% or less, almost no change occurs, and with 8 atomic% and above, a significant change occurs.

Then, the interrelation between the content of hydrogen atoms and the drift mobility of holes for the deposited film was examined using the remaining cut halves of samples Nos. 1-12 prepared in the above step A-(1)-(ii). Prior to measurements, each specimen was provided with an aluminum semitransparent film by vacuum deposition. The specimen was irradiated with UV light pulses of about 1 nsec while a pulse voltage was being applied across the aluminum film and the silicon wafer, with the aluminum film being negative. The drift mobility was measured by way of the known time-of-flight method. The results obtained were as shown in FIG. 7.

Figure 7:
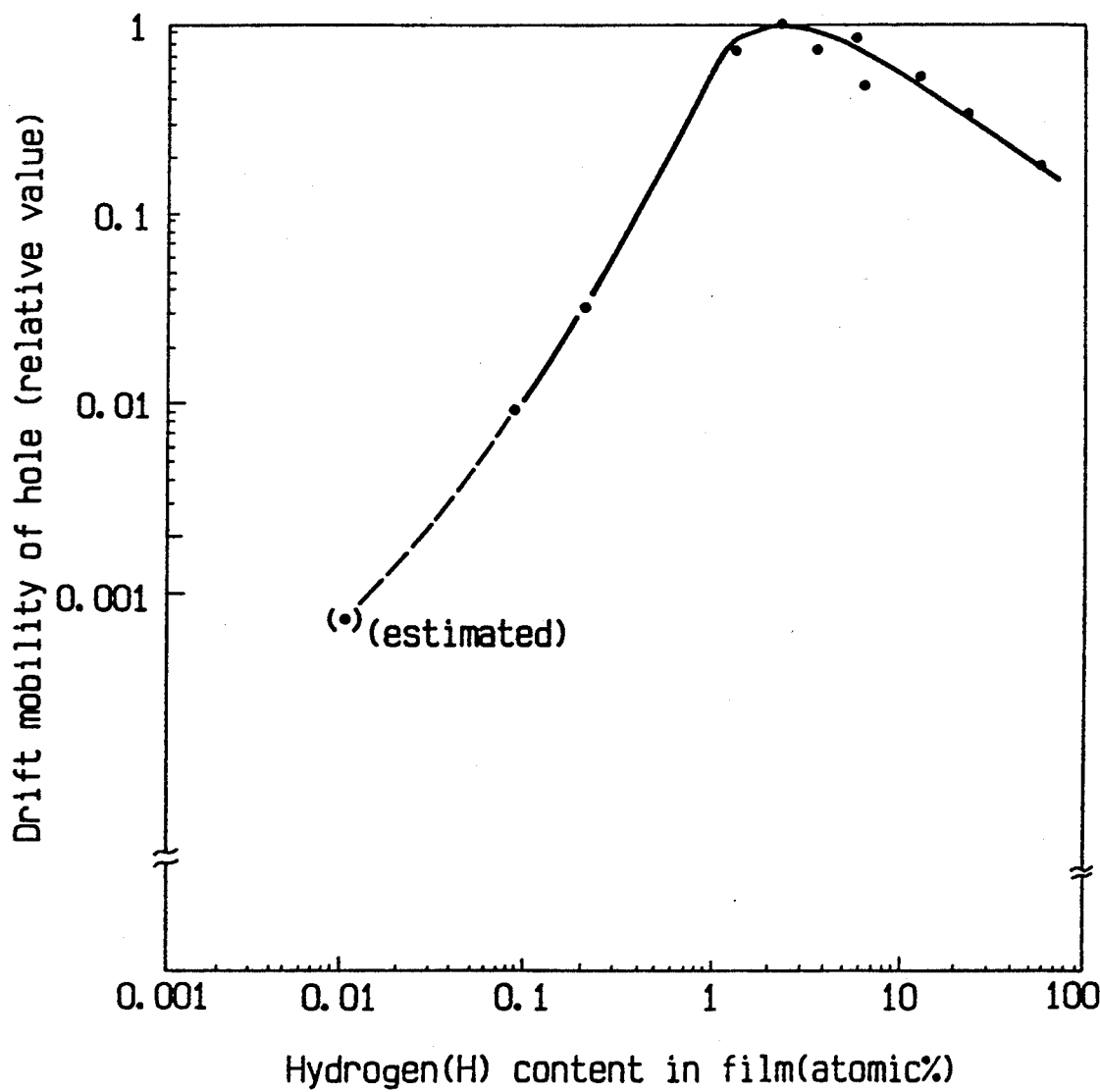
FIG. 7 is a graph showing the interrelation between the content of hydrogen atoms (H) and the drift mobility of holes for a $ZnSe_{1-x}Te_x$:H film in Experiment B.

From the results shown in FIG. 7, the following was found. That is, with a hydrogen content of less than 0.5 atomic%, the drift mobility of holes is very small. With a hydrogen content in the range from 1 to 8 atomic%, the drift mobility of holes is very high. With a hydrogen content in excess of 8 atomic%, the drift mobility of holes gradually decreases.

These findings suggest that the content of hydrogen atoms in the deposited film should be 8 atomic% or less, preferably 4 atomic% or less, in the viewpoint of change in characteristics induced by the irradiation of light, and 0.5 atomic% or more, preferably 1 atomic% or more, in the viewpoint of the mobility of holes.

As a result of studies shown in FIG. 5, it was recognized that the proportion of the crystal grain domains per unit volume is in the range from 65 to 85 vol% for the $ZnSe_{1-x}Te_x$:H deposited film which contains 1 to 4 atomic% of hydrogen atoms.

It is concluded from the foregoing that the electrical characteristics of a $ZnSe_{1-x}Te_x$:H deposited film depend largely on the content of hydrogen atoms (H) and also on the proportion of crystal grain domains per unit volume in the film, and in order for the deposited film to having desired electrical characteristics suitable for use as solar cell or in other devices, it is necessary that the hydrogen content be in the range from 1 to 4 atomic% and the proportion of crystal grain domains per unit volume be in the range from 65 to 85 vol%.

Experiment C

Observations on the interrelations among the doping properties, the content of hydrogen atoms and the proportion of crystal grain domains per unit volume for a $ZnSe_{1-x}Te_x$:H deposited film (1) One procedures of Experiment A were repeated, except that $LiC_3H_7$ ($1.0 \times 10^{10}$ mol/min) was added to the raw material gas (A) in Table 1, to thereby form a $ZnSe_{1-x}Te_x$:H:Li film on a silicon wafer (with an $SiO_2$ film formed thereon) and also on a quartz glass substrate. Thus there were prepared samples Nos. 13-23 (on silicon wafer) and samples Nos. 13'-24' (on quartz glass).

(2) Each of samples Nos. 13'-24' (deposited on quartz glass substrates) was cut in half. The half was used for the measurement of dark conductivity after the formation of a comb-shaped aluminum electrode by vacuum deposition. The other half was used for the measurement of the content of hydrogen atoms (H) in the same manner as in Experiment A.

Figure 8:
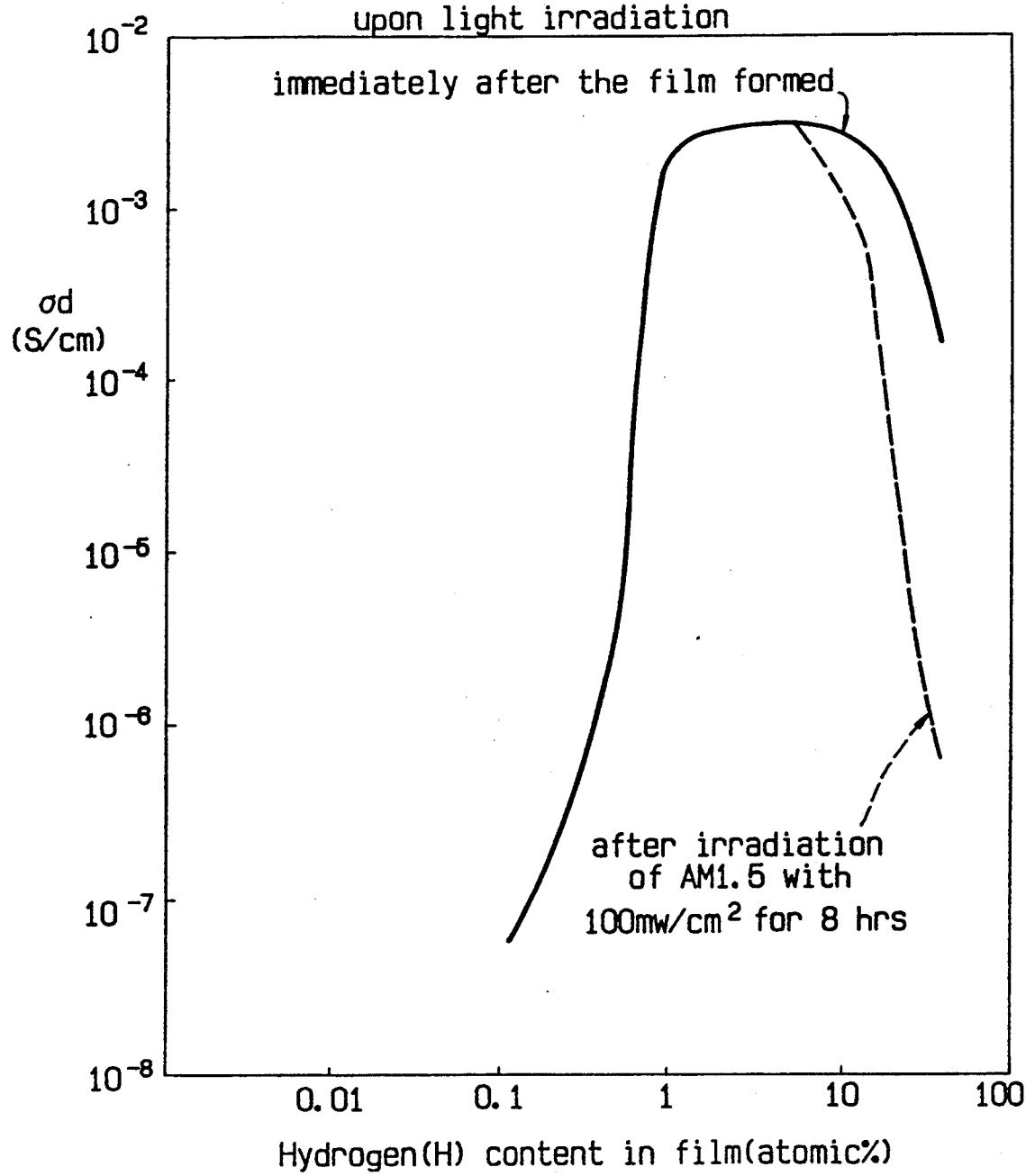
FIG. 8 is a graph showing the interrelation between the content of hydrogen atoms (H) and the dark conductivity for a $ZnSe_{1-x}Te_x$:H:Li film in Experiment C.

The results of measurements were as shown in FIG. 8. In the figure, the solid line represents the dark conductivity of the $ZnSe_{1-x}Te_x$:H:Li film which was not irradiated with light more intense than room light. The broken line represents the dark conductivity of the $ZnSe_{1-x}Te_x$:H:Li film which was measured after continuous irradiation with AM-1.5 light (100 mW/cm$^2$) for 8 hours.

The specimens, with a comb-shaped aluminum electrode formed thereon by vacuum deposition, were examined for conduction type by the measurement of thermoelectromotive force. As a result, it was found that the specimens containing more than 0.25 atomic % of hydrogen atoms are of p-type conduction, and other specimens containing less than 0.08 atomic % of hydrogen atoms are of weak n-type conduction.

Figure 9:
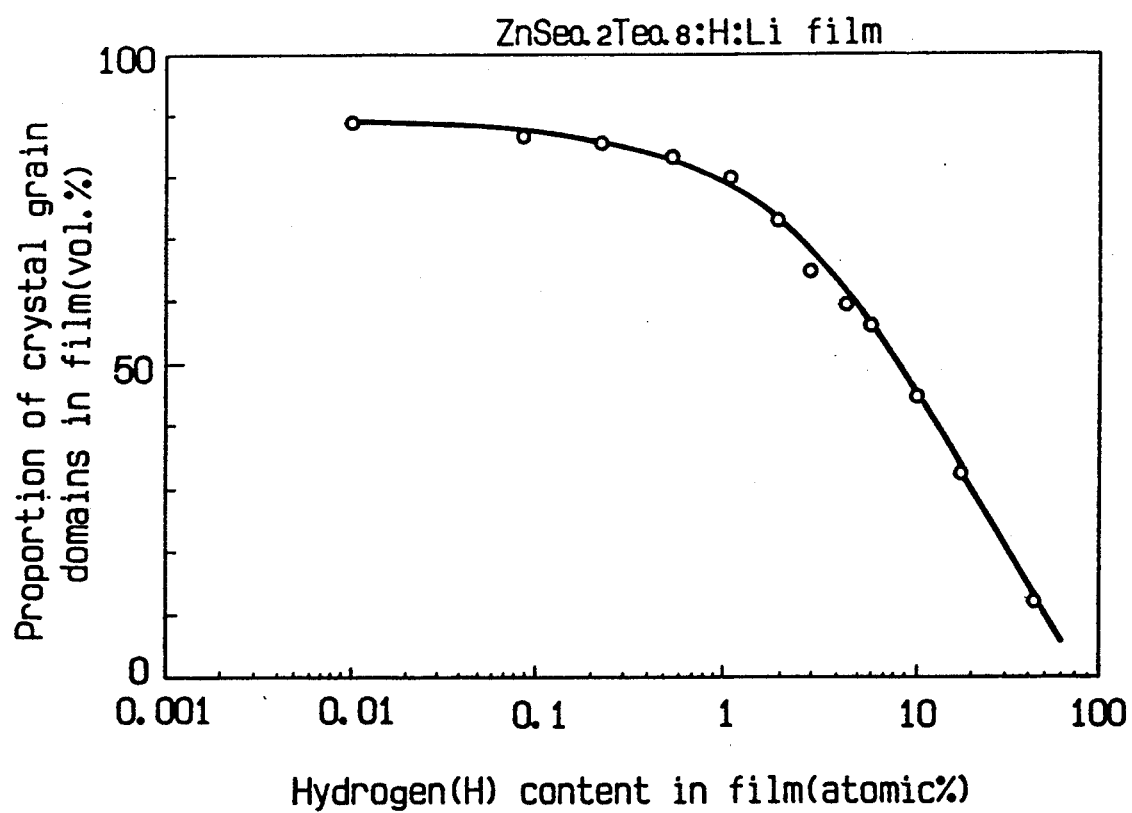
FIG. 9 is a graph showing the interrelation between the proportion of crystal grain domains and the content of hydrogen atoms for a $ZnSe_{1-x}Te_x$:H:Li film in Experiment C.

(3) Samples Nos. 13-24 were examined for the proportion of crystal grain domains per unit volume in the same manner as in Experiment A. The results obtained were as shown in FIG. 9. It was found that the interrelation between the proportion of crystal grain domains per unit volume and the content of hydrogen atoms (H) is almost identical with that of a non-doped film.

(4) From what is shown in FIGS. 8 and 9, it is recognized that films capable of being efficiently doped with a dopant contains more than 15 vol% of non-crystal grain domains per unit volume. In other words, for the film to be doped efficiently, it is necessary that the film contain more than 15 vol% of non-crystal grain domains per unit volume.

The foregoing suggests that the deposited film should contain a certain amount of non-crystal grains. With too small an amount of non-crystal grains, the resulting deposited film will be such that it lacks structural flexibility and is insufficient in structural relaxation at the crystal grain boundaries, and because of this, it is accompanied with defects such as dangling bonds. When such film is doped with a dopant, the dopant does not enter the crystal grains but agglomerates at the crystal grain boundaries. Even though the dopant should be incorporated into the film, the resulting film will be such that the valence electron and the dark conductivity can not be controlled as desired.

On the other hand, in the case of a film containing 15 vol% or more of non-crystal grains in the crystal grain boundaries or in the intercrystal space, with the dangling bonds terminated with hydrogen atoms (H), the structure is flexible and the defects at the crystal grain boundaries are few. Therefore, said film is by far superior in the displacement due to the addition of a dopant, that is the doping efficiency, to the deposited film which does not contain non-crystal grain domains. Incidentally, with non-crystal grain domans being less than 15 vol% per unit volume, the deposited film is apt to be easily peeled off from the substrate on account of its insufficient flexibility in structure.

The foregoing suggests that the deposited film should contain more than 15 vol% of non-crystal grain domains per unit volume.

(5) The procedures of the above (1) were repeated to prepare samples Nos. 25-36, samples Nos. 37-48, and samples Nos. 49-60 (on $SiO_2$ film) and also to prepare samples Nos. 25'-36', samples Nos. 37'-48', and samples Nos. 49'-60' (on quartz substrate).

Figure 10:
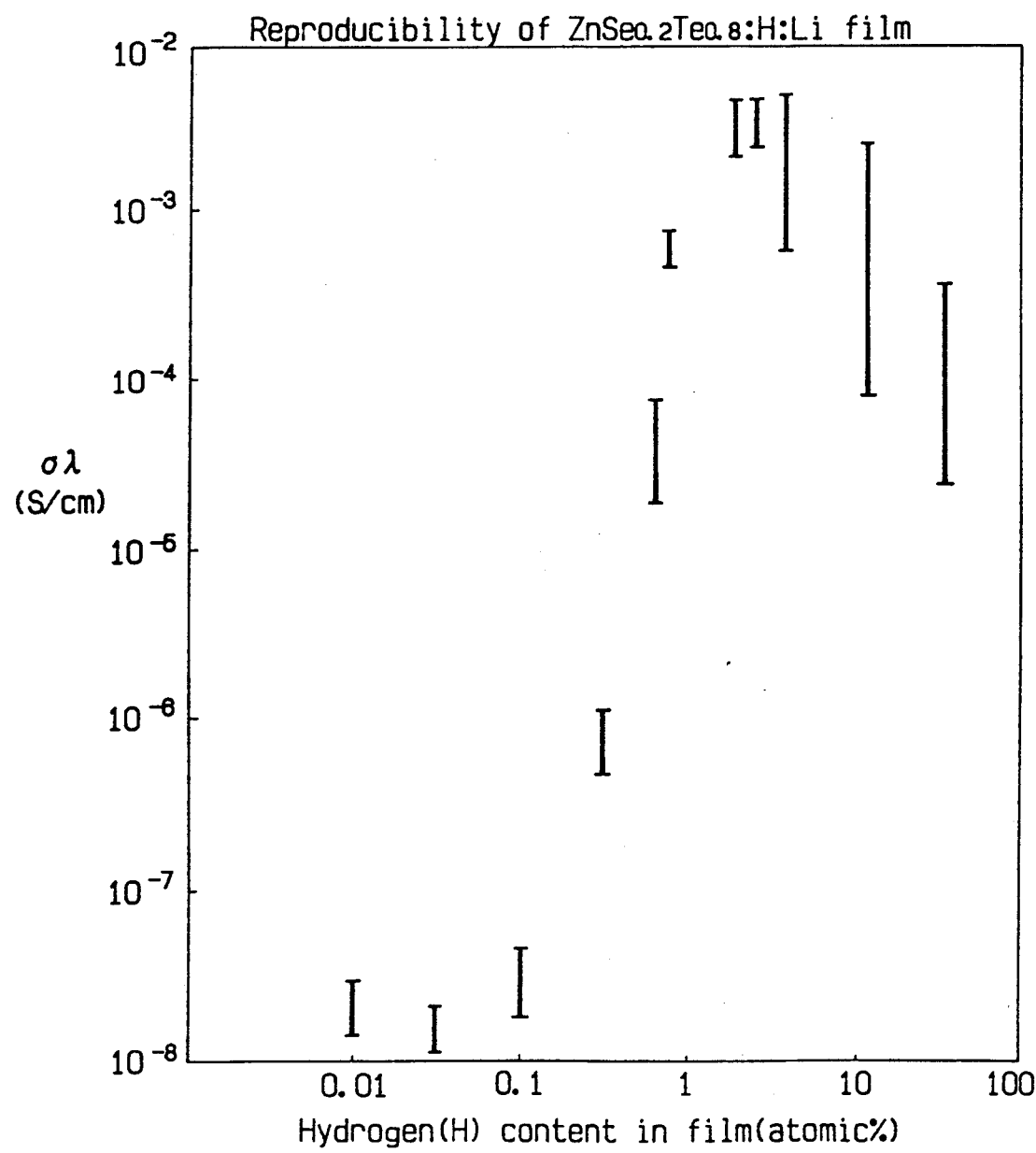
FIG. 10 is a graph showing experimental results with respect to the reproducibility of a $ZnSe_{1-x}Te_x$:H:Li film having a desired property in Experiment C.

Each of samples Nos. 25-60 which were not irradiated with intense light was examined for dark conductivity in the same manner as mentioned above. The results were as shown in FIG. 10. As FIG. 10 illustrates, it was found that the value of dark conductivity greatly varies depending on the film forming conditions, and that the degree of said variation is great in the case where the flow rate of hydrogen gas is high.

On the other hand, as for samples Nos. 25'-60', it was found that they are almost uniform in the content of hydrogen atoms (H) and also in the proportion of crystal grain domains per unit volume.

In the case of samples Nos. 25'-60', those which were prepared with a flow rate of hydrogen gas being higher than 30 sccm gave greatly varied values of dark conductivity. In such cases, the content of hydrogen atoms (H) was more than 4 atomic% and the proportion of crystal grain domains per unit volume was less than 65 vol%.

The foregoing suggests that where the proportion of non-crystal grain domains per unit volume exceeds 35 vol%, the crystal grains are electrically separated from one another and the conduction is determined by the non-crystal grain domains, which leads to lowering the dark conductivity. This narrows the application areas of the resulting deposited film. In addition, the control of valence electron and the change of dark conductivity with a dopant to be doped greatly differ from the crystal grain domains to the non-crystal grain domains; therefore, it is difficult to obtain a desired control of valence electron and a desired change of dark conductivity. That is, in the case where dopants enter the non-crystal grain domains, but not into the crystal grain domains, the resulting deposited film greatly varies in its characteristics. This makes it difficult to obtain the dark conductivity as desired.

The dark conductivity greatly varies as shown in FIG. 8 in the case where the deposited film is irradiated with intese light. This may be elucidated in the following way: in the case where the proportion of the non-crystal grain domains per unit volume exceeds 35 vol%, the content of hydrogen atoms (H) is significantly high. This brings about a situation in which the hydrogen atoms will be easily released from the film with the progressive change of time and the environmental change. The release of hydrogen atoms causes deterioration of the characteristics of the film.

The foregoing suggests the following. That is, in order for the $ZnSe_{1-x}Te_x$ :H film to be of a stable film quality and to be reproducible, it is necessary that the content of hydrogen atoms (H) to be 4 atomic % or less and the proportion of the crystal grain domains per unit volume be 65 vol% or more.

(6) The procedures in the above step (1) were repeated to form $ZnSe_{1-x}Te_x$ :H films and $ZnSe_{1-x}Te_x$ :H:Li films on quartz glass substrates under varied film forming conditions. Thus prepared samples were examined for the interrelation between the content of hydrogen atoms (H) and the proportion of crystal grain domains per unit volume, and the interrelation between the content of hydrogen atoms (H) and the electrical characteristics (such as the ratio of change in conductivity under irradiation with AM-1, the drift mobility of holes, and the dark conductivity) in the same manner as mentioned above. It was found that the content of hydrogen atoms (H) and the proportion of crystal grain domains per unit volume almost coincide with those specified in the above-mentioned experiments, and that there is a close correlation between the content of hydrogen atoms in the film and the electrical characteristics of the film. Thus it was found that the optimum content of hydrogen atoms (H) is in the range from 1 to 4 atomic%. It was also found that the proportion of crystal grain domains per unit volume in the film which satisfies the specific content of hydrogen atoms in the film is preferably 65 to 85 vol% and more preferably, 70 to 80 vol%.

Experiment D

Observations on the conductivity of a $ZnSe_{1-x}Te_x$ :H:Mp film (Mp: p-type dopant) in relation to the content of hydrogen atoms (H) to be incorporated into the film with the Se/Te ratio being as the parameter (1) Preparation of samples (i) A square quartz glass of 2.5 cm by 2.5 cm in size was used as the substrate.

(ii) The substrate was firmly attached onto the substrate holder 202 of the known apparatus as shown in FIG. 2. On the substrate was formed a $ZnSe_{1-x}Te_x$ :H:Li film ($0 \leq X \leq 1$) under the conditions shown in Table 3. Thus there were prepared 132 kinds of samples designated by the combination of two letters L-N, N representing the flow rate of hydrogen gas (12 different values) and L representing the ratio of the flow rate of DESe to the flow rate of DETe (11 different values).

(2) Determinations of the content of hydrogen atoms (H) and the composition ratios of Zn, Se and Te in the p-type doped $ZnSe_{1-x}Te_x$ :H:Mp deposited film (i) Each of samples Nos. 1-1-12-11 deposited on quartz substrates in the above step (1)-(i) was cut in half. Each of the cut halves was placed in a vacuum chamber and heated therein from room temperature to 1000° C. During the heating period, the amount of hydrogen atoms (H) released from the specimen was determined by means of a mass spectrometer. The resulting data were compared with those of the standard sample prepared by implanting a known amount of hydrogen atoms into a hydrogen-free sample.

(ii) Each of the remaining cut halves of the samples was examined for the distributions of Zn atoms, Se atoms, and Te atoms by the aid of an X-ray microanalyzer XMA, and was also subjected to elemental composition analysis.

The data obtained indicate that Zn atoms, Se atoms, and Te atoms are uniformly distributed in the deposited film and that the ratio of Zn atoms to the sum of Se atoms and Te atoms [Zn:(Se+Te)] is stoichiometrically about 1:1.

Then, it was confirmed that there may be prepared a p-type doped $ZnSe_{1-x}Te_x$ :H:Mp ($0 \leq X \leq 1$) deposited film in which the atom number ratio of Se to Te approximately being $(1-x):x$ by controlling the flow rate of DESe to $1.5 \times 10^{-5} \times (1-X)$ mol/min. and the flow rate of DETe to $1.0 \times 10^{-5} \times X$ mol/min. respectively.

Figure 11:
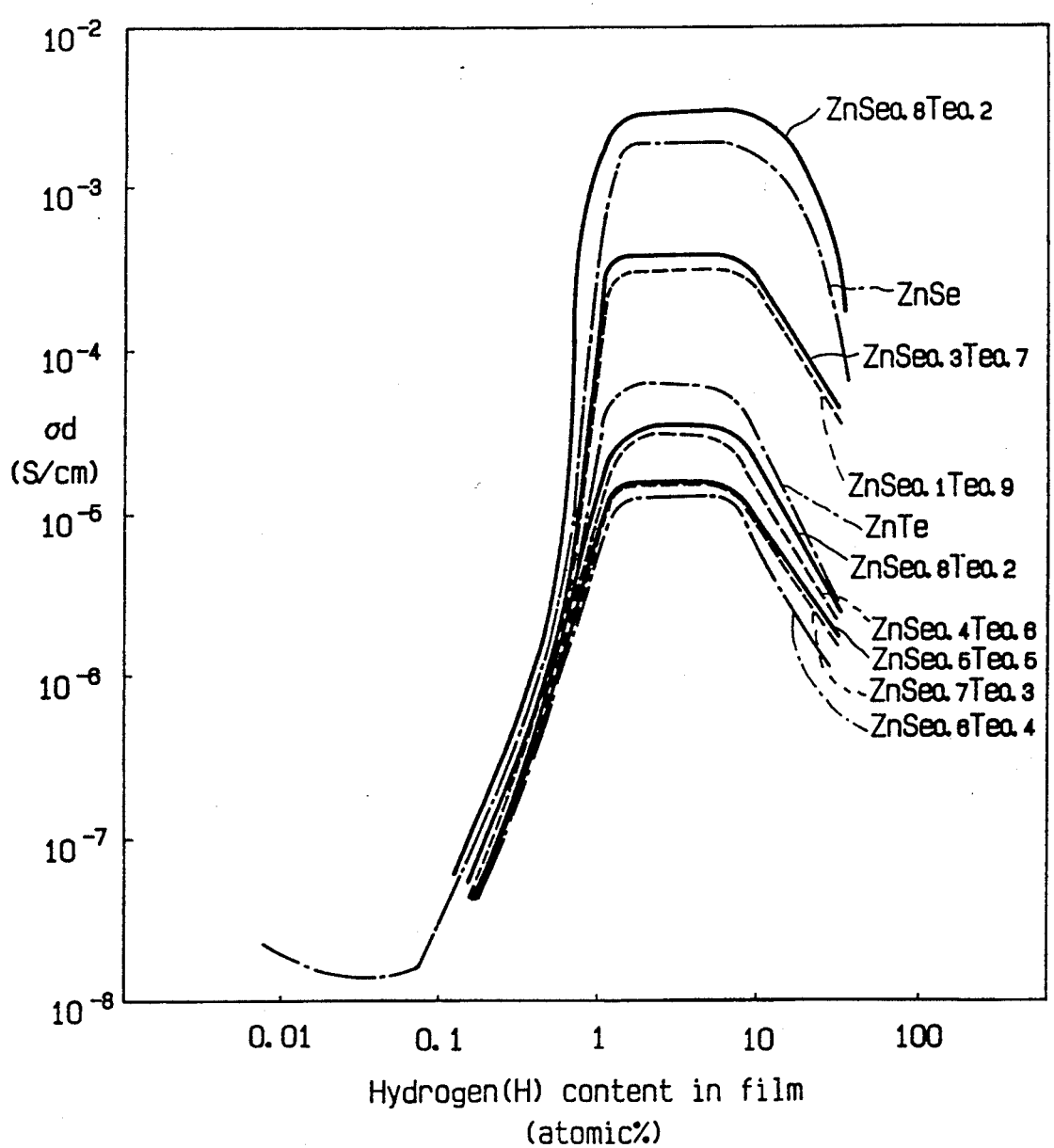
FIG. 11 is a graph showing the interrelation between the content of hydrogen atoms (H) and the dark conductivity for each of a various p-type doped $ZnSe_{1-x}Te_x$:H films with the quantitative ratio of Se to Te in the film being a parameter in Experiment D.

(3) Measurement of dark conductivity on a p-type doped $ZnSe_{1-x}Te_x$ :H:Mp film Every deposited film sample on a quartz glass substrate, which was used for the measurements in the above step (2)-(ii), was engaged in examination of the dark conductivity. Prior to measurement, a comb-shaped aluminum electrode (0.2 mm gap) was formed on the deposited film sample by way of vacuum deposition. With 10 volts applied, a current was measured in the dark to determin the dark conductivity ($\sigma d$) in relation to the content of hydrogen atoms with the Se/Te being as the parameter for the deposited film sample. The results obtained were as shown in FIG. 11.

Then, the deposited film samples were examined for conduction type by way of measuring the thermoelectromotive force. As a result, it was found that those deposited film samples containing more than 0.25 atomic % of hydrogen atoms exhibit p-type conductivity and those deposited film samples containing less than 0.08 atomic % of hydrogen atoms exhibit weak n-type conduction.

Figure 12:
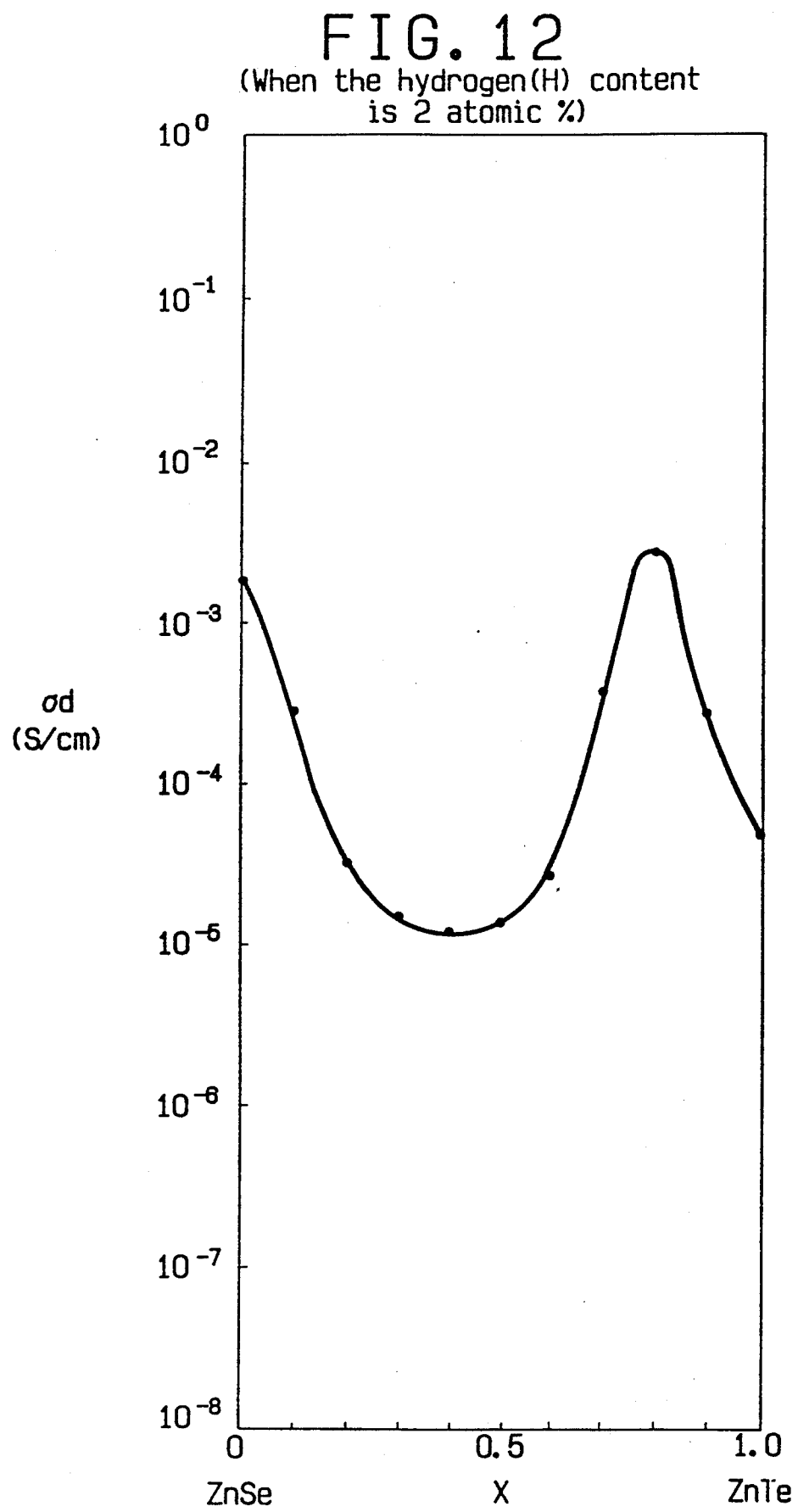
FIG. 12 is a graph showing the interrelation between the quantitative ratio of Se to Te and the dark conductivity for a p-type doped $ZnSe_{1-x}Te$:H film in Experiment D.

Shown in FIG. 12 is of the dependency of the $\sigma d$ upon the x for the $ZnSe_{1-x}Te_x$ :H deposited films containing 2 atomic % of hydrogen atoms.

These experimental results indicate that there may be afforded a desired p-type $ZnSe_{1-x}Te_x$ :H deposited film of exhibiting an excellent p-type conductivity when the content of hydrogen atoms (H) is in the range from 1 to 10 atomic % and the value of the x is $0.7 \leq X \leq 0.9$, that is, the quantitative ratio of Se to Te is between 10:0 and 9:1 or between 3:7 and 1:9.

Experiment E

Observations on n-type doped $ZnSe_{1-x}Te_x$ :H:Mn (Mn=n-type dopant) deposited film (1) Preparation of samples There were prepared a predetermined number of $ZnSe_{1-x}Te_x$ :H:Ga deposited film samples by repeating the procedures of Experiment D-(1), except that there was used $(CH_3)_3Ga$(TMGa) with a flow rate of $5 \times 10^{-11}$ mol/min. instead of $LiC_3H_7$ in Table 3.

(2) Measurements of the content of hydrogen atoms (H) and compositional ratios of Zn, Se and Te Every n-type deposited film sample was analyzed to determine the content of hydrogen atoms (H) and to examine compositional ratios of Zn atoms, Se atoms and Te atoms in the film in the same manner as in the foregoing Experiment A.

As a result, it was found that Zn atoms, Se atoms and Te atoms are uniformly distributed in the deposited film and that the quantitative ratio of Zn atoms to the sum of Se atoms and Te atoms [Zn:(Se+Te)] is about 1:1 which satisfies the stoichiometrical relationship.

Then, it was confirmed that there may be prepared a desired n-type doped $ZnSe_{1-x}Te_x$ :H:Mn deposited film in which the atom number ratio of Se to Te being approximately $(1-x):x$ by properly controlling the flow rates of DESe and DETe.

(3) Measurement of dark conductivity

Every $ZnSe_{1-x}Te_x$:H:Ga deposited film sample on a quartz glass substrate, which was used in the above step (2), was engaged in examination of the dark conductivity.

Prior to measurement, a comb-shaped aluminum electrode (0.2 mm gap) was formed on said deposited film sample by way of vacuum deposition.

With 10 volts applied, a current was measured in the dark to determin the dark conductivity ($\sigma d$) for the n-type $ZnSe_{1-x}Te_x$ :H:Mn deposited film sample.

Then, every n-type $ZnSe_{1-x}Te_x$:H:Mn deposited film sample was examined for conduction type by way of measuring the thermoelectromotive force.

The results obtained indicate that all the deposited film samples are of n-type conduction and that those deposited film samples containing 1 to 10 atomic % of hydrogen atoms exhibit an outstanding value of $\sigma d$.

Figure 13:
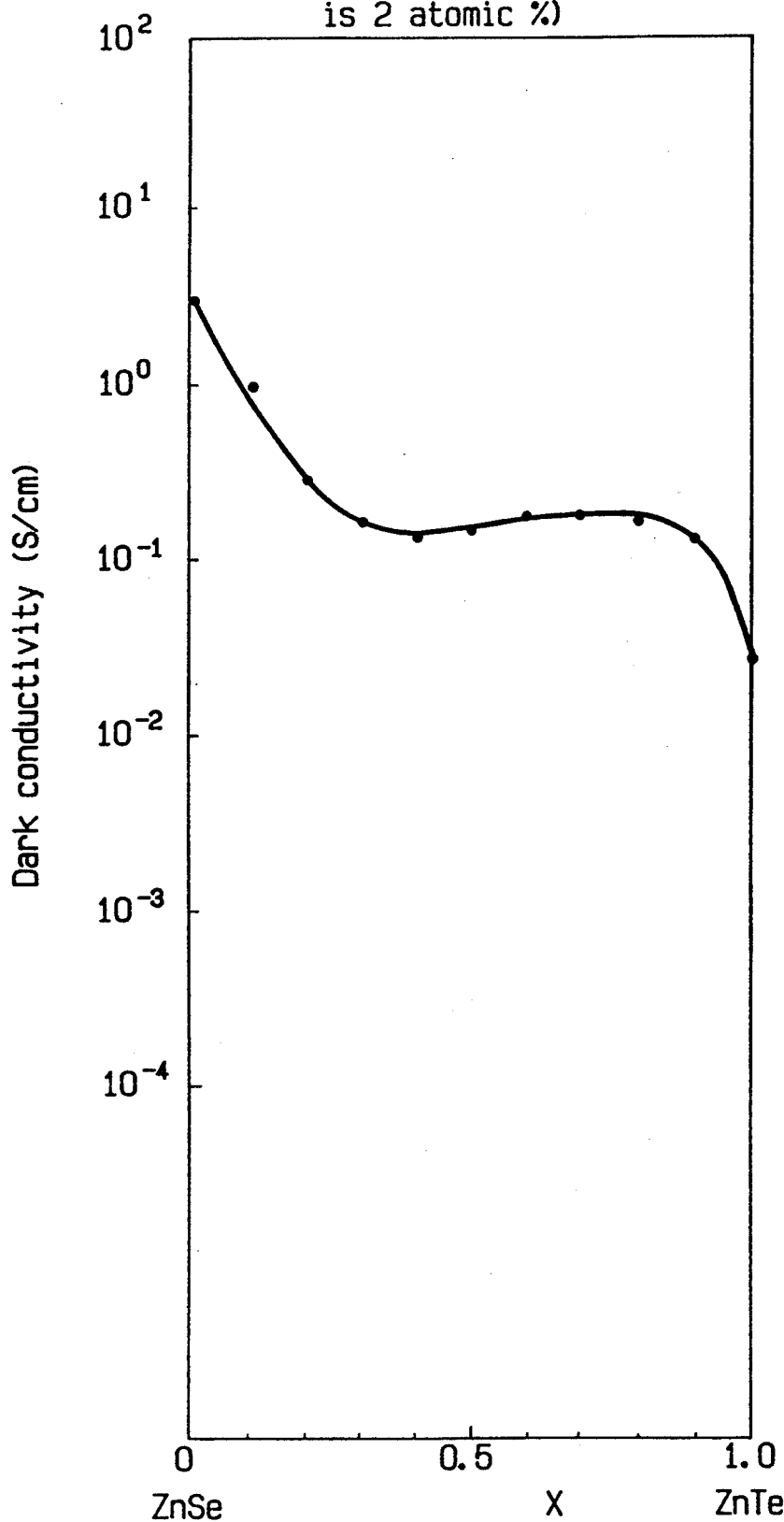
FIG. 13 is a graph showing the interrelation between the quantitative ratio of Se to Te and the dark conductivity for an n-type doped $ZnSe_{1-x}Te_x$:H film in Experiment E.

In FIG. 13, there are shown the results of examining the pendency of d upon the Se/Te ratio for the n-type $ZnSe_{1-x}Te_x$ :H deposited film containing 2 atomic % of hydrogen atoms. As FIG. 13 illustrates, it is understood that there may be afforded a desired n-type $ZnSe_{1-x}Te_x$:H deposited film of exhibiting an excellent conductivity in all the regions for the quantative ratio of Se to Te.

Experiment F

Dependency of the optical band gap upon the quantitative ratio of Se to Te in $ZnSe_{1-x}Te_x$ :H deposited film (1) Preparation of samples $ZnSe_{1-x}Te_x$ :H films, with the Se:Te quantitative ratio varied, were prepared on quartz glass substrates in the same manner as in Experiment D except that the flow rate of hydrogen gas was fixed at 15 sccm and the doping gas was not used in Table 3.

(2) Compositional analysis of samples

In accordance with the method in Experiment A, the samples were examined for the content of hydrogen atoms (H), distributed states of Zn atoms, Se atoms and Te atoms and compositional ratios of these atoms. As a result, it was found for every sample that Zn atoms, Se atoms and Te atoms are all uniformly distributed in the film and that the compositional ratio of Zn atoms to the sum of Se atoms and Te atoms is about 1:1 which satisfies the stoichiometrical relationship.

It was then confirmed that there was afforded a desired $ZnSe_{1-x}Te_x$ :H deposited film in which the atom number ratio of Se to Te being approximately $(1-x):x$ by properly controlling the flow rate of DESe to $1.5\times10^{-5}\times(1-X)$ mol/min. and the flow rate of DETe to $1.0\times10^{-5}\times X$ mol/min. respectively.

(3) Measurement of optical band gap

The samples were examined for the absorption coefficient as a function of the wavelength of light, using a spectrophotometer. The optical band gap of each sample was obtained from the absorption edge.

Figure 14:
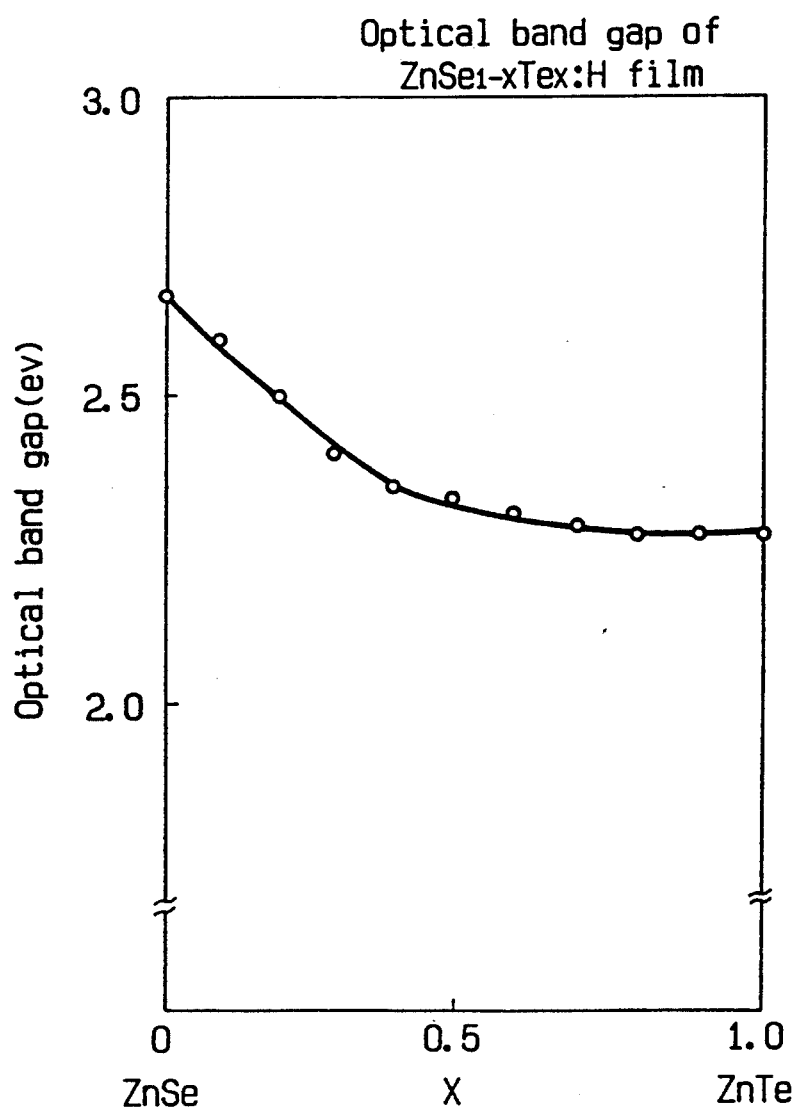
FIG. 14 is a graph showing the interrelation between the quantitative ratio of Se to Te and the optical band gap for a $ZnSe_{1-x}Te_x$:H film in Experiment F.

FIG. 14 shows the optical band gap of $ZnSe_{1-x}Te_x$ :H films (containing 2 atomic% of hydrogen) plotted against the Se:Te quantitative ratio. It is recognized that in the case of films having the Se:Te quantitative ratio greater than 7:3, the optical band gap is in the range from 2.3 to 2.2 eV.

Experiment G

Observations of the proportion of crystal grain domains formed in non-doped $ZnSe_{1-x}Te_x$ :H film and doped $ZnSe_{1-x}Te_x$ :H:M film (where M denotes a dopant of p-type or n-type)

(1) Preparation of samples

In the same manner as in Experiment A, there were prepared sample films on silicon wafers (with $SiO_2$ film formed thereon by way of thermal oxidation method) and also on quartz glass substrates wherein the flow rate of $H_2$ gas was fixed to 15 SCCM, under the conditions as shown in Table 4.

Incidentally, in the preparation of p-type $ZnSe_{1-x}Te_x$ :H:Mp films, $LiC_3H_7$ was used, and in the preparation of n-type $ZnSe_{1-x}Te_x$ :H:Mn films, TMGa was used, respectively while being added to the raw material gas (A). In the preparation of non-doped $ZnSe_{1-x}Te_x$:H films, any doping raw material gas was not used.

(2) Analyses of samples

In the same manner as in Experiment A, the resultant samples were examined for the content of hydrogen (H), distributed states of Zn atoms, Se atoms and Te atoms, and compositional ratios of these atoms.

As a result, it was found that every sample (deposited film) contains about 2 atomic% of hydrogen atoms. It was also found that for any of the samples, Zn atoms, Se atoms and Te atoms are uniformly distributed in the film and the compositional ratio of Zn atoms to the sum of Se atoms and Te atoms is about 1:1 which satisfies the stoichiometrical relationship.

Then, it was confirmed that there were afforded a desired non doped $ZnSe_{1-x}Te_x$ :H film and a desired doped $ZnSe_{1-x}$:H:M film in which the atom number ratio of Se to Te being approximately $(1-x):x$ by properly controlling the flow rate of DESe to $1.2\times10^{-5}\times(1-X)$ mol/min. and the flow rate of DETe to $1.0\times10^{-5}\times X$ mol/min. respectively.

(3) Evaluation on the proportion of crystal grain domains

The proportion of crystal grain domains per unit volume in each sample was evaluated by observing the lattice image by the foregoing TEM in accordance with the procedures in Experiment D.

On the basis of the results in the above (2) and (3), the dependency of the proportion of crystal grain domains per unit volume upon the x value (the ratio of Te) was examined for each of the non-doped sample film, the Li doped sample film (p-typed) and the Ga doped sample film (n-typed).

Figure 15:
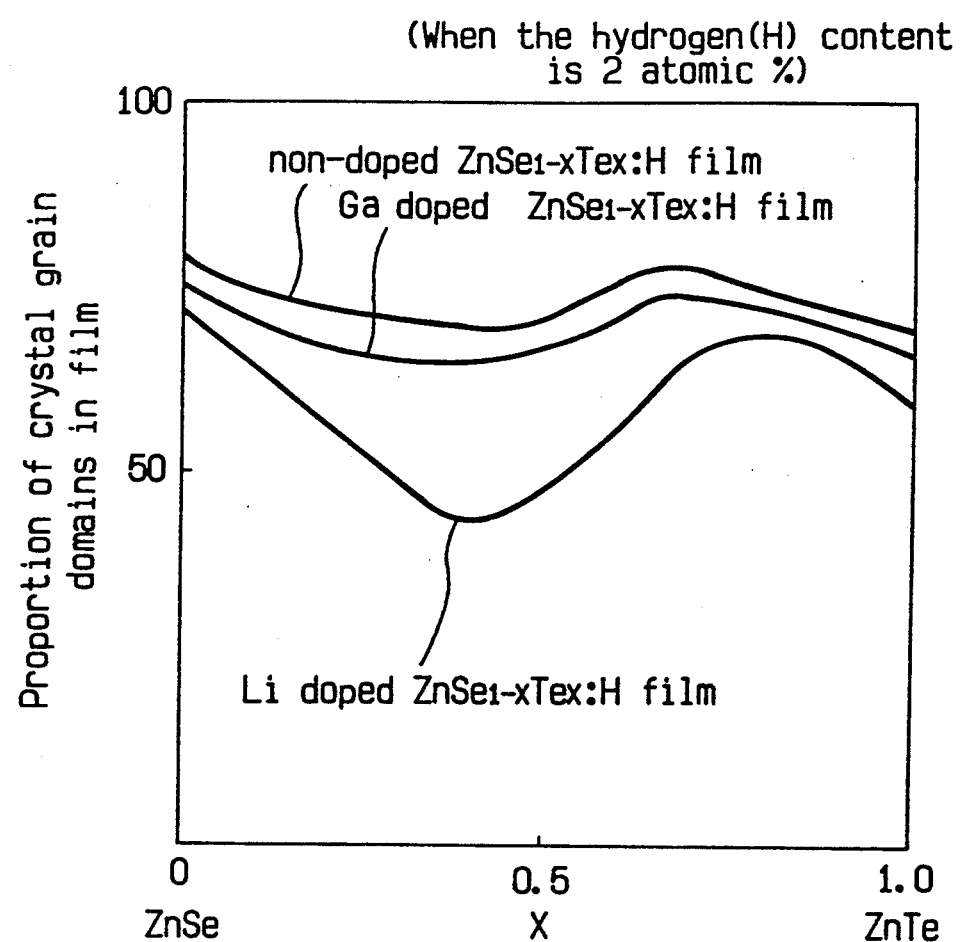
FIG. 15 is a graph showing the interrelation between the quantitative ratio of Se to Te and the proportion of crystal grain domains for each of a non-doped $ZnSe_{1-x}Te_x$:H film, Ga-doped $ZnSe_{1-x}Te_x$:H film and Li-doped $ZnSe_{1-x}Te_x$:H film.

The results obtained are graphically shown in FIG. 15.

The present invention has been completed based on the foregoing experimental findings.

The present invention provides an improved pin junction photo-voltaic element, characterized in that at least its constituent p-type semiconductor layer or its n-type semiconductor layer comprises a non-single crystal film comprised of zinc atoms (Zn), selenium atoms (Se), tellurium atoms (Te) and at least hydrogen atoms (H) (which is represented by the formula: $ZnSe_{1-x}Te_x$:H) and which contains a p-type dopant (which is represented by the formula $ZnSe_{1-x}Te_x$:H:Mp, where Mp is a p-type dopant) or an n-type dopant (which is represented by the formula: $ZnSe_{1-x}Te_x$:H:Mn, where Mn is an n-type dopant), each of said $ZnSe_{1-x}Te_x$:H:Mp film and said $ZnSe_{1-x}Te_x$:H:Mn film containing said hydrogen atoms (H) in an amount of 1 to 4 atomic %, crystal grain domains in a proportion of 65 to 85 vol % per unit volume, and said selenium atoms and said tellurium atoms in a quantitative ratio of said selenium atoms to tellurium atoms ranging in the range of from 1:9 to 3:7 in terms of atomic ratio: and its i-type semiconductor layer comprises (a) a non-single crystal semiconductor film containing silicon atoms as the matrix and at least one kind of hydrogen atoms and fluorine atoms (hereinafter referred to as "Non-Si (H,F) film") or (b) a non-single crystal semiconductor film containing silicon atoms, at least one kind of carbon atoms and germanium atoms, and at least one kind of hydrogen atoms and fluorine atoms (hereinafter referred to as "Non-Si(C,Ge)(H,F) film").

In a preferred embodiment of the pin junction photo-voltaic element according to the present invention, it is desired that the p-type semiconductor layer be comprised of the foregoing $ZnSe_{1-x}Te_x$:H:Mp film and the n-type semiconductor layer be comprised of the foregoing $ZnSe_{1-x}Te_x$ H:Mn film. However, as above mentioned, either the p-type semiconductor layer or the n-type semiconductor layer may be comprised of a properly selected non-single crystal semiconductor film of p-type or n-type depending upon the type of the pin junction photo-voltaic element.

For example, in the case where the pin junction photo-voltaic element is made to be of single-cell type to which light is impinged from the side of its p-type constituent layer and the said p-type constituent layer is constituted by the foregoing $ZnSe_{1-x}Te_x$:H:Mp film, any known n-typed non-single crystal semiconductor film may be optionally used to constitute its n-type constituent layer. As such semiconductor film, there can be mentioned Group IV series semiconductor films such as Si semiconductor film, SiC semiconductor film and SiGe semiconductor film: Group II-VI series semiconductor films such as ZnSe semiconductor film, ZnS semiconductor film, CdS semiconductor film, CdSe semiconductor film and CdTe semiconductor film: and Group III-V series semiconductor films such as AlP semiconductor film, AlAs semiconductor film, AlSb semiconductor film, GaP semiconductor film, GaAs semiconductor film, GaSb semiconductor film, InP semiconductor film and InAs semiconductor film.

In the case where the pin junction photo-voltaic element is made to be of tandem-cell type or triple-cell type, an n-type semiconductor film having a narrow band gap is not suitable to constitute their n-type constituent semiconductor layer since the light transmittance of their lower cell will be insufficient when their n-type semiconductor layer is constituted by such semiconductor film. In view of this, it is desired for their n-type semiconductor layer to be constituted by an appropriate n-typed non-single crystal semiconductor film having a wide band gap. As such semiconductor film, there can be mentioned Group IV series semiconductor films such as Si semiconductor film and SiC semiconductor film: Group II-IV series semiconductor films such as ZnSe semiconductor film, ZnS semiconductor film, CdS semiconductor film and CdSe semiconductor film: and Group III-V series semiconductor films such as AlP semiconductor film, AlAs semiconductor film and GaP semiconductor film.

Further, in the case where the pin junction photo-voltaic element is made to be of single-cell type and its n-type constituent layer is constituted by the foregoing $ZnSe_{1-x}Te_x$ H:Mn film, its p-type constituent layer may be constituted by any known p-typed non-single crystal semiconductor film.

In this case, the single cell type pin junction photo-voltaic element may be so designed that light is impinged either from the side of the n-type semiconductor layer or from the side of the p-type semiconductor layer. In the latter case, the said p-type semiconductor layer is desired to be constituted by an appropriate p-typed non-single crystal semiconductor film having a wide band gap. Examples of the p-typed non-single crystal semiconductor film to constitute the p-type constituent semiconductor layer of the single cell type pin junction photo-voltaic element of which n-type constituent semiconductor layer being constituted by the foregoing $ZnSe_{1-x}Te_x$:H:Mn are, for example, Group IV series semiconductor films such as Si semiconductor film, SiC semiconductor film and SiGe semiconductor film: Group II-VI series semiconductor films such as ZnSe:H semiconductor film, ZnSeTe:H semiconductor film, ZnTe semiconductor film and CdTe semiconductor film: and Group III-V series semiconductor films such as AlP semiconductor film, AlAs semiconductor film, AlSb semiconductor film, GaP semiconductor film, GaAs semiconductor film, GaSb semiconductor film, InP semiconductor film, InAs semiconductor film and InSb semiconductor film.

In the case where the pin junction photo-voltaic element is made to be of tandem-cell type or triple-cell type and their n-type constituent semiconductor layer is constituted by the foregoing $ZnSe_{1-x}Te_x$:H:Mn film, their p-type constituent semiconductor layer is constituted by an appropriate p-typed non-single crystal semiconductor film. Examples of such semiconductor film are, for example, Group IV series semiconductor films such as Si semiconductor film and SiC semiconductor film: Group II-VI series semiconductor films such as ZnTe semiconductor film: and Group III-V series semiconductor films such as AlP semiconductor film, AlAs semiconductor film and GaP semiconductor film.

For the i-type constituent semiconductor layer of the pin junction photo-voltaic element according to the present invention, as above described, it comprises a Non-Si(H,F) film or a Non-Si(H,F) film or a Non-Si(C,Ge)(H,F) film. Specific examples of said Non-Si(H,F) film are, for example, amorphous silicon films such as A-Si:H film, A-Si:F film and A-Si:H:F film: and polycrystal silicon films such as poly-Si:H film, poly-Si:F film and poly-Si:H:F film. Specific examples of said Non-Si(C,Ge)(H,F) film are, for example, amorphous silicon films such as A-SiFe:H film, A-SiGe:F film, A-SiGe:H:F film, A-SiC:H film, A-SiC:F film, A-SiC:H:F film, A-SiGeC:H film, A-SiGeC:F film and A-SiGeC:H:F film: and polycrystal silicon films such as poly-SiGe:H film, poly-SiGe:F film, poly-SiGe:H:F film, poly-SiC:H film, poly-SiC:F film, poly-SiC:H:F film, poly-SiGeC:H film, poly-SiGeC:F film and poly-SiGeC:H:F film.

The foregoing $ZnSe_{1-x}Te_x$:H:Mp film to constitute the p-type semiconductor layer, the foregoing $ZnSe_{1-x}Te_x$:H:Mn film to constitute the n-type semiconductor layer, any of the foregoing non-single crystal semiconductor films to constitute the p-type or the n-type semiconductor layer, any of the foregoing N-Si(H,F) films and the foregoing N-Si(C,Ge)(H,F) films to constitute the i-type semiconductor layer for the pin junction photo-voltaic element according to the present invention may be formed on a plane substrate or on a cylindrical substrate according to the intended application, or may be also formed on a film formed on such substrate.

Now, as above described, the $ZnSe_{1-x}Te_x$:H:Mp film to constitute the p-type semiconductor layer for the pin junction photo-voltaic element according to the present invention is such that has excellent uniformity of structure and homogeneity of composition: contains Zn atoms, Se atoms and Te atoms in stoichiometric amounts respectively in a state of being uniformly distributed and also contains 1 to 4 atomic % of hydrogen atoms in a state of terminating dangling bonds of at least one kind of said Zn, Se and Te atoms or in a state of being present free: the compositional ratio of said Zn atoms to the sum of said Se atoms and Te atoms is stoichiometric: the quantitative ratio of said Se atoms to said Te atoms is in the range of from 3:7 to 1:9 in terms of atomic ratio: crystal grain domains and non-crystal grain domains are contained: and said crystal grain domains are contained in an amount of 65 to 85 vol % by the proportion per unit volume in a state of being distributed in the film.

In addition, the said $ZnSe_{1-x}Te_x$:H:Mp film is that the stress to occur in the entire region is being relaxed in a desired state, and it has outstanding electrical and mechanical characteristics and also has a good adhesion to the substrate on which it is to be deposited and other films on or under which it is to be deposited.

By the way, for the known $ZnSe_{1-x}Te_x$ series film, it is difficult to incorporate a p-type dopant thereinto in a desired state and because of this, it is difficult to make said film to be of a desired p-conduction type.

However, according to the present invention, as above described, the foregoing $ZnSe_{1-x}Te_x$ H film is such that the dangling bounds are being reduced to a desired low level and that permits easy and effective incorporation of a p-type dopant thereinto. In view of this, according to the present invention, there is provided a desired p-type $ZnSe_{1-x}Te_x$:H:$M_p$ film (where $M_p$ is a p-type dopant). This p-type $ZnSe_{1-x}Te_x$:H:$M_p$ film has outstanding p-type semiconductor characteristics, a desired state in which the stress is being desirably relaxed as mentioned above, very good electrical and mechanical characteristics, and good adhesion not only to the substrate but also to other films.

The p-type dopant of the $M_p$ for the $ZnSe_{1-x}Te_x$:H:$M_p$ film contains may be a member selected from the group consisting of Group IA elements (i.e., Li, Na, K, and Rb), Group IB elements (i.e., Cu and Ag) and Group V-A elements (i.e., P, As, and Sb). Among these elements, Li, P and As are most desired.

The amount of the p-type dopant to be contained in the viewpoint of using the $ZnSe_{1-x}Te_x$:H:$M_p$ film as the p-type semiconductor layer in forming the pin junction is preferably from 50 to $1 \times 10^4$ atomic ppm, more preferably from $5 \times 10^2$ to $1 \times 10^4$ atomic ppm, and most preferably, from $1 \times 10^3$ to $5 \times 10^3$ atomic ppm.

As above described, the n-type semiconductor layer of the pin junction photo-voltaic element may be constituted by the foregoing n-type $ZnSe_{1-x}Te_x$:H:Mn (where Mn is an n-type dopant). As well as the said $ZnSe_{1-x}Te_x$:H:$M_p$ film, this $ZnSe_{1-x}Te_x$:H:Mn film has outstanding n-type semiconductor characteristics, a desired state in which the stress is being desirably relaxed as mentioned above, very good electrical and mechanical characteristics, and good adhesion not only to the substrate but also to other films.

As the n-type dopant (Mn), there can be mentioned Group III A elements such as B, Al, Ga and In, Group IV A elements such as Si, Ge, C and Sn, and Group VII B elements such as F, Cl, Br and I. Among these elements, Al, Ga, In and B are most desired.

The amount of the n-type dopant to be contained in the viewpoint of using the $ZnSe_{1-x}Te_x$:H:Mn film as the n-type semiconductor layer in forming the pin junction is preferably from 50 to $1 \times 10^4$ atomic ppm, more preferably from $5 \times 10^2$ to $1 \times 10^4$ atomic ppm, and most preferably, from $1 \times 10^3$ to $5 \times 10^3$ atomic ppm.

As mentioned above, the above functional deposited ZnSe:H:M film (where M is a dopant of p-type or n-type) to be used in the present invention is characterized by (i) the content of hydrogen atoms being in the specific range and (ii) the proportion of crystal grain domains per unit volume being also in the specific range. As for the hydrogen content, when it is less than 1 atomic%, the resulting deposited film becomes unsatisfactory on account of an excessive amount of dangling bonds. In the case when it exceeds 4 atomic%, the resulting deposited film becomes also unsatisfactory because of occurrence of lattic disturbance, generation of void and also increase of defects. With respect to the proportion of crystal grain domains per unit volume, in the case where it is less than 65 vol%, the absolute amount of crystal grains being one of the factors to contribute in promotion of the electrical properties is reduced. And, in the case where it is in excess of 85 vol%, crystl grains are directly bonded each other to case formation of the so-called grain boundaries resulting in occurrence of defects due to lattice incommensurateness, etc. Therefore, in any case, there cannot be obtained a desired deposited film having the characteristics as desired.

As above described, any of the foregoing $ZnSe_{1-x}Te_x$:H:M films to be used in the present invention contains a specific amount of hydrogen atoms and a specific proportion of crystal grain domains per unit volume and is specific in the composition and the structure as above described, and because of this, defects in the film are being significantly reduced and it is greately surpassing any of the known $ZnSe_{1-x}Te_x$:HM series films particularly in view of the electrical conductivity.

This situation is apparent particularly in the case of using the foregoing $ZnSe_{1-x}Te_x$:H:Mp film. And as described above, the $ZnSe_{1-x}Te_x$:H:Mp film to constitute the p-type semiconductor layer of the pin junction photo-voltaic element according to the present invention has a desirably wide band gap of 2.3 to 2.4 eV which is effective for making almost all incident ray to be absorbed not by the p-type semiconductor layer but by the i-type semiconductor layer, so that photocurrent is efficiently outputted. There is made a significant improvement for the photocurrent to be outputted in the case where the i-type semiconductor layer is formed from a A-Si semiconductor film or a A-SiC semiconductor film because a loss of short-wavelength light to be absorbed by the p-type semiconductor layer is remarkably reduced. This effect by the use of the $ZnSe_{1-x}Te_x$:H:Mp film as the p-type semiconductor layer is brought about not only in the case of single-cell photo-voltaic element but also in the case of multi-cells stacked photo-voltaic element.

Further, as for the $ZnSe_{1-x}Te_x$:H:Mp film to be used in the present invention, as it is accompanied with few defect as above described, if there should be an occasion for incident light to be absorbed by the p-type semiconductor layer comprised of the said film, there is a slight probability for electrons generated therein to be recombined and they have a certain extent of diffusion distance, and because of this, such electrons will become to contribute to providing photocurrent.

In view of this, for the pin junction photo-voltaic element having the p-type semiconductor layer comprised of the $ZnSe_{1-x}Te_x$:H:Mp film, a larger output of photocurrent than expected only from the largeness of its band gap will be made.

Further in addition, in the case where the i-type semiconductor layer is formed from a A-SiGe semiconductor film or poly-Si semiconductor film respectively capable of absorbing long-wavelength light, electrons to be generated in the said i-type semiconductor layer are prevented from reverse-diffusing at the interface between the p-type semiconductor and the i-type semiconductor layer because of the largeness of a gap between the resulting conduction bands caused by the matching between the band gap of the said $ZnSe_{1-x}Te_x$:H:Mp film and that of the said A-SiGe semiconductor film or poly-Si semiconductor film (in other words, because of the so-called back surface field effect), and because of this, a large output of photocurrent is expected.

The thus structured pin junction photo-voltaic element according to the present invention is high in the transmission for short-wavelength light and provides a high photoelectric conversion efficiency for short-wavelength light mainly because of using the foregoing $ZnSe_{1-x}Te_x$:H:M film which is free of problems caused by in-film defects which are found on the known pin junction photo-voltaic element.

This feature makes it possible for the photo-voltaic element according to the present invention to apply to solar cell where it achieves more efficient photoelectric conversion than conventional ones made of amorphous silicon material even when used under a light source such as whitelight fluorescent lamp which emits such light having a large quantity of short-wavelength light in its spectral components. In addition, the photo-voltaic element according to the present invention also exhibits significant effects when applied to solar cell to be used under sunlight. For instance, when it is employed as the cell in the side where light is impinged in a solar cell of tandem type or triple type, the resulting device becomes to have a structure that permits efficient supply of long-wavelength light into the lower cell and provides a significant improvement in the photoelectric conversion efficiency for short-wavelength light. Because of this, it functions to efficiently convert almost all the spectra of sunlight into electricity. In addition, it can be continuously used for a long period of time without occurrence of problems relating to light-induced fatigue which is often found on the conventional solar cell of tandem type or triple type.

The following describes typical examples of the pin junction photo-voltaic element to be provided according to the present invention in which at least the p-type semiconductor layer or the n-type semiconductor layer comprises the foregoing $ZnSe_{1-x}Te_x$:H:Mp film or the foregoing $ZnSe_{1-x}Te_x$:H:Mn film.

The following description, however, is not intended to limit the scope of the present invention.

Figure 1B:
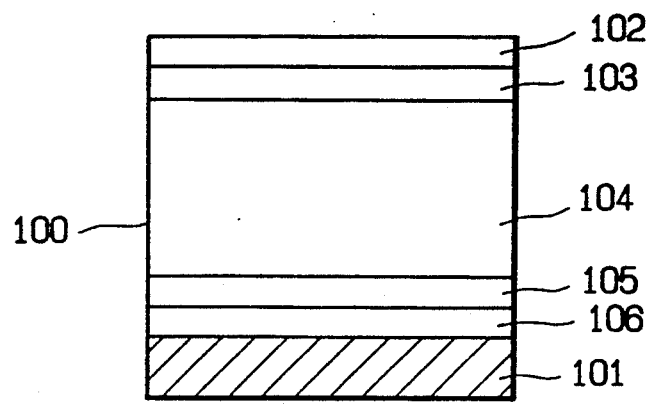
FIG. 1(B) is a schematic cross-sectional view of another typical pin junction photo-voltaic element according to the present invention.
Figure 1C:
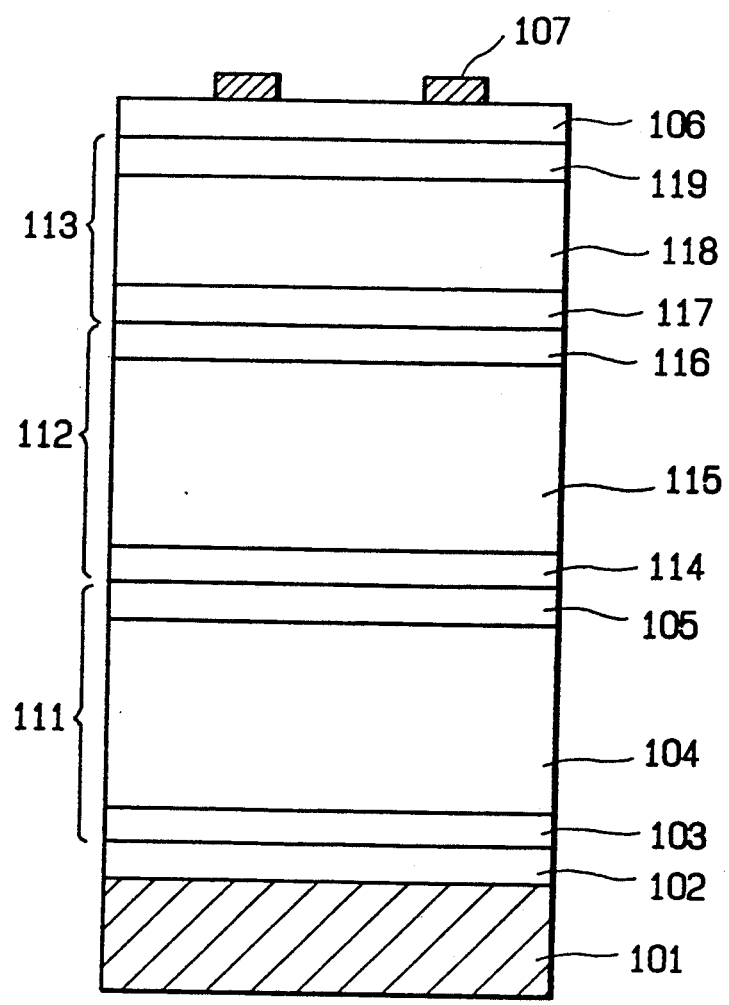
FIG. 1(C) is a schematic cross-sectional view of a typical multi-cells stacked photo-voltaic element according to the present invention.

FIG. 1(A), FIG. 1(B) and FIG. 1(C) schematically illustrate typical embodiments of the pin junction photo-voltaic element according to the present invention which has a layer structure based on the foregoing $ZnSe_{1-x}Te_x$:H:M (M is a dopant of p-type or n-type).

FIG. 1(A) is a schematic cross-sectional view of a first representative embodiment of the pin junction photo-voltaic element according to the present invention. In FIG. 1(A), there is shown a pin junction photo-voltaic element 100 having a structure comprising electrode 102, n-type semiconductor layer 103, i-type semiconductor layer 104, p-type semiconductor layer 105, transparent electrode 106 and collecting electrode 107 being disposed in this order on substrate 101.

In the pin junction photo-voltaic element shown in FIG. 1(A), light is impinged from the side of the transparent electrode 106.

FIG. 1(B) is a schematic cross-sectional view of a second representative embodiment of the pin junction photo-voltaic element according to the present invention.

In FIG. 1(B), there is shown a pin junction photo-voltaic element 100 comprising transparent electrode 106, p-type semiconductor layer 105, i-type semiconductor layer 104, n-type semiconductor layer 103 and electrode 102 being disposed in this order on transmissive substrate 101. In the pin junction photo-voltaic element shown in FIG. 1(B), light is impinged from the side of the transmissive substrate 101.

For any of the above pin junction photo-voltaic elements shown in FIG. 1(A) and FIG. 1(B), it is possible to put each of the n-type semiconductor layer and the p-type semiconductor layer in the others place in accordance with the use purpose.

FIG. 1(C) is a schematic cross-sectional view of a third representative embodiment of the pin junction photo-voltaic element according to the present invention which is a multi-cells stacked photo-voltaic element.

In FIG. 1(C), there is shown a multi-cells (triple-cells) stacked photo-voltaic element 100 comprising: substrate 101; a lower cell unit 111 which comprises electrode 102, n-type semiconductor layer 103, i-type semiconductor layer 104 and p-type semiconductor layer 105; an intermediate cell unit 112 which comprises n-type semiconductor layer 114, i-type semiconductor layer 115 and p-type semiconductor layer 116: an upper cell unit 113 which comprises n-type semiconductor layer 117, i-type semiconductor layer 118 and p-type semiconductor layer 119: transparent electrode 106 (comprised of a ITO film): and collecting electrode 107.

Explanation will be made for the substrate, each constituent semiconductor layer and each constituent electrode in the pin junction photo-voltaic element of the present invention.

Substrate

The substrate 101 used in the pin junction photo-voltaic element according to the present invention may be of single crystal material or non-single crystal material. It may be electroconductive or electrically insulating, and it may be transparent or opaque. Usable as such substrate are, for example, Fe, Ni, Cr, Al, Mo, Au, Nb, Ta, V, Ti, Pt, and Pb and alloys thereof such as brass and stainless steel. Other than these, there can be mentioned films or sheets of synthetic resin such as polyester, polyethylene, polycarbonate, cellulose acetate, polypropylene, polyvinyl chloride, polyvinylidene chloride, polystyrene, polyamide, polyimide and the like, and other than these glass or ceramics.

Examples of the substrate comprising a single crystal material are, for example, wafer-like shaped members obtained by slicing an appropriate single crystal of Si, Ge, C, NaCl, KCl, LiF, GaSb, In As, In Sb, GaP, MgO, $CaF_2$, $BaF_2$, $\alpha$-$Al_2O_3$ or the like. The surface of any of said wafer-like shaped members may be provided with an epitaxially grown layer of the same constituent(s) as the member or of a material whose lattice constant being close to that of the constituent(s) of the member.

The shape of the substrate may be optionally determined in accordance with the end use purpose. Examples are plate, belt, drum and suitable like shapes having a plane or uneven surface. The thickness of the substrate is properly determined so that the layer structure as the photo-voltaic member can be formed as desired. In the case where flexibility is required for the photo-voltaic element to be prepared, it can be made as thin as possible within a range capable of sufficiently providing the functions as the substrate. However, the thickness of the substrate is usually not less than 10 $\mu$m from the view points of its manufacturing and handling conveniences and its strength.

Electrodes

In the photo-voltaic element according to the present invention, an appropriate electrode is optionally used in accordance with the configuration of the photo-voltaic element to be prepared. As such an electrode, there can be mentioned lower electrode, upper electrode (transparent electrode) and collecting electrode. Said upper electrode denotes the one to be placed at the side through which light is impinged, and said lower electrode denotes the one to be placed opposite to the upper electrode through the semiconductor layers to be arranged between the two electrodes.

These electrodes will be explained in the following.

(i) Lower electrode

For the pin junction photo-voltaic element according to the present invention, the side through which light is impinged is determined depending upon whether there is used a transmissive member or an opaque member as the substrate 101.

In this connection, the position where the lower electrode 102 is to be placed is properly determined upon the kind the substrate 101 to be used. For example, in the case where an opaque member such as metal member is used as the substrate 101, light for the generation of a photoelectromotive force is impinged from the side of the transparent electrode 106.

Now, in the case where the pin junction photo-voltaic element is of the configuration as shown in FIG. 1(A) or FIG. 1(C), the lower electrode 102 is desired to be placed between the substrate 101 and the n-type semiconductor layer 103. In this case, if the substrate 101 is the one which comprises a electroconductive member, it can function also as the lower electrode. However, in the case where the substrate 101 is electroconductive but is of a high sheet resistance, the lower electrode may be disposed as a low-resistance electrode serving to output a photocurrent or in order to heighten the reflectivity of the incident light at the surface of the substrate 101 so as to make it utilized more efficiently.

In the case of FIG. 1(B), there is used a transmissive member as the substrate 101 and light is impinged from the side of the substrate 101. In this connection, the lower electrode 102 serving to output a photocurrent is placed on the surface of the top semiconductor layer above the substrate 101. However, in the case where there is used an electrically insulating member as the substrate 101, the lower electrode 102 serving to output a photocurrent is placed between the substrate 101 and the n-type semiconductor layer 103.

The electrode 102 may be a metallic thin film of a metal selected from the group consisting of Ag, Au, Pt, Ni, Cr, Cu, Al, Ti, Zn, Mo and W. Said metallic thin film may be properly formed by way of the known vacuum deposition technique, electron-beam deposition technique or reactive sputtering technique. However, due consideration shall be made for the metallic thin film to be thus formed not to be a resistant component for the photo-voltaic element. In this respect, the metallic thin film to constitute the electrode 102 is desired to be such that has a sheet resistance of preferably, 50 $\Omega$ or less, more preferably 10 $\Omega$ or less.

In the alternative, it is possible to place a diffusion preventive layer comprising a electroconductive material such as zinc oxide between the lower electrode and the n-type semiconductor layer. (This is not shown)

In the case where such diffusion preventive layer is placed in the way as above mentioned, the following advantages will be expected: (a) it prevents the metal elements constituting the electrode 102 from diffusing into the n-type semiconductor layer 103; (b) being provided with a certain resistance value, it prevents occurrence of shorts, which would otherwise occur between the lower electrode 102 and the transparent electrode 106 through the semiconductor layers being arranged between them due to pinholes and the like; and (c) it serves to generate multiple interferences with the thin film and confine the light as impinged within the photo-voltaic element.

(ii) Upper electrode (transparent electrode)

The transparent electrode 106 is desired to have a light transmittance of more than 85% so that it serves to make the semiconductor layer to efficiently absorb sunlight or fluorescent light. In addition to this, it is desired to have a sheet resistance of 100 $\Omega$ or less from the viewpoint of preventing the internal resistance of the photo-voltaic element from becoming great to result in impairing the performance.

In view of the above, the transparent electrode 106 is desired to comprise a thin film of a metal oxide selected from the group consisting of $SnO_2$, $In_2O_3$, ZnO, CdO, $Cd_2SnO_2$ and ITO ($In_2O_3+SnO_2$) or a semitransparent thin film of a metal selected from the group consisting of Au, Al and Cu.

The transparent electrode 106 is disposed on the p-type semiconductor layer 105 in the case of the photo-voltaic element shown in FIG. 1(A) or FIG. 1(C), and it is disposed on the substrate 101 in the case of the photo-voltaic element shown in FIG. 1(B).

In any of these cases, it is necessary to constitute the transparent electrode 106 with a thin film member selected from the foregoing which is good in adhesion with the layer or the substrate.

The transparent electrode 106 comprising such thin film may be formed by way of the known resistance heating deposition technique, electron-beam heating deposition technique, reactive sputtering technique or spraying technique.

(iii) Collecting electrode

The collecting electrode 107 in the photo-voltaic element according to the present invention is disposed on the transparent electrode 106 for the purpose of reducing the surface resistance of said transparent electrode.

The collecting electrode 107 is desired to comprise a metallic thin film of Ag, Cr, Ni, Al, Ag, Au, Ti, Pt, Cu, Mo, W or an alloy of these metals. It is possible for the collecting electrode 107 to be constituted with a member comprising a plurality of such metallic thin films being stacked.

The shape and the area of the collecting electrode 107 are properly designed so that a sufficient quantity of light can be received by the semiconductor layer.

Specifically as for the shape, it is desired to be such that extends uniformly all over the light receiving face of the photo-voltaic element. As for the area, it is desired to correspond to 15% or less in a preferred embodiment or 10% or less in a more preferred embodiment respectively of said light receiving face.

The member of constituting the collecting electrode 107 is desired to be such that has a sheet resistance of preferably 50 Ω or less, more preferably, 10 Ω or less.

p-type semiconductor layer, i-type semiconductor layer and n-type semiconductor layer In a most preferred embodiment of the pin junction photo-voltaic element according to the present invention, its p-type semiconductor layer is formed from the foregoing $ZnSe_{1-x}Te_x$:H:Mp film.

This is clarified by the experimentally obtained result described in the following.

As the semiconductor material having a relatively wide band gap, there are known semiconductive materials comprising Group II and Group VI elements of the Periodic Table such as ZnS, ZnSe, ZnTe, CdS, CdSe and ZnO.

As for said ZnTe and CdTe of the above mentioned semiconductive materials, it is possible to form a p-type semiconductor film of ZnTe or CdTe by way of the known film-forming method. However, any of the resultant p-type ZnTe film (that is ZnTe:Mp film) and p-type CdTe film (that is CdTe:Mp film) is accompanied with defects in an undesired state, and there is not found any improvement in the output of photocurrent for a pin junction photo-voltaic element of which p-type semiconductor layer being constituted even by said p-type ZnTe film or p-type CdTe film.

And, the present inventors have tried to prepare a plurality of pin junction photo-voltaic elements of the configuration shown in FIG. 1(B) using (i) A-Si:H:F film, poly-Si:H:F film, A-SiC:H:F film, A-SiGe:H:F film, A-Si:H film, A-Si film, poly-Si film, A-SiC film and A-SiGe film for the i-type semiconductor layer; (ii) ZnTe:Mp film, CdTe:Mp film, $ZnSe_{1-x}Te_x$:Mp film and the foregoing $ZnSe_{1-x}Te_x$:H:Mp film according to the present invention for the p-type semiconductor layer: and (iii) A-Si:H:Mn film for the n-type semiconductor layer as shown in Table 5.

In every trial, there was used a quartz glass plate as the substrate 101, a ITO thin film formed by the reactive sputtering method as the transparent electrode 106, and a Ag thin film formed by the known electron-beam heating method as the electrode 102.

As for said $ZnSe_{1-x}Te_x$:H:Mp film according to the present invention, it was prepared in accordance with the method (1) according to the present invention which will be later described.

Other aforementioned films were prepared respectively by the known reactive sputtering method.

Among the thus prepared pin junction photo-voltaic element samples, those belonging to the present invention were indicated in the column "present invention" of Table 5.

Other pin junction photo-voltaic element samples were indicated in the column "Comparative Example (I)" of Table 5.

In the column "Comparative Example (II)" of Table 5, there were indicated pin junction photo-voltaic element samples having a p-type semiconductor layer comprising the $ZnSe_{1-x}Te_x$:H:Mp film according to the present invention: an i-type semiconductor layer comprising an i-type semiconductor film containing neither hydrogen atoms nor fluorine atoms selected from the group consisting of A-Si film, poly-Si film, A-SiC film and A-SiGe film: and an n-type semiconductor layer comprising A-Si:H:Mn film.

Each of the above pin junction photo-voltaic element samples was evaluate with practical acceptability as a desired pin junction photo-voltaic element from the viewpoints of short-circuit photocurrent (Isc) and open-circuit voltage (Voc).

The evaluation results obtained were shown in Table 5.

As Table 5 illustrates, it is understood that: (i) the pin junction photo-voltaic elements having a p-type semiconductor layer comprising a $ZnSe_{1-x}Te_x$:Li film, a ZnTe:P film or CdTe:Li film; an i-type semiconductor layer comprising a A-Si:H:F film, a poly-Si:H:F film, A-SiC:H:F film or a A-SiGe:H:F film; and an n-type semiconductor layer comprising a A-Si:H:P are mostly not practically usable except two cases which seem acceptable, and (ii) the pin junction photo-voltaic elements having a p-type semiconductor layer comprising a $ZnSe_{1-x}Te_x$:H:Li belonging to the foregoing $ZnSe_{1-x}Te_x$:H:Mp film according to the present invention; an i-type semiconductor layer comprising a A-Si film, a poly-Si film, a A-SiC film or a A-SiGe film; and an n-type semiconductor layer comprising a A-Si:H:P film are all not practically usable.

On the other hand, it is understood that any of the pin junction photo-voltaic elements having a p-type semiconductor layer comprising a $ZnSe_{1-x}Te_x$:H:Li film belonging to the foregoing $ZnSe_{1-x}Te_x$:H:Mp film; an i-type semiconductor layer comprising a A-Si:H:F film, a poly-Si:H:F film, a A-SiC:H:F film or A-SiGe:H:F film; and an n-type semiconductor layer comprising a A-Si:H:P film is satisfactory in all the evaluation items and desirably acceptable in practical use.

In view of the above and also in view of the results in the aforementioned Experiments A through G, it is recognized that the combined use of the foregoing $ZnSe_{1-x}Te_x$:H:Mp film as the p-type semiconductor layer and a A-Si(H,F) film, a poly-Si(H,F) film or a A-Si(C,Ge)(H,F) film as the i-type semiconductor layer makes it possible to provide a desired pin junction photo-voltaic element which excels in the characteristics required for a pin junction photo-voltaic element to be immobilized as an usable product.

Likewise, it is recognized that there may be affored a desired pin junction photo-voltaic element also in the case where the foregoing $ZnSe_{1-x}Te_x$:H:Mn film is used as the n-type semiconductor layer together with any of the foregoing i-type A-Si(H,F) film, poly-Si(H,F) film and A-Si(C,Ge)(H,F) film as the i-type semiconductor layer.

Further, it is recognized that there may be afforded a most desirable pin junction photo-voltaic element in the case where there are used the foregoing $ZnSe_{1-x}Te_x$:H:Mp film as the p-type semiconductor layer, any of the said i-type type non-single crystal films as the i-type semiconductor layer and the foregoing $ZnSe_{1-x}Te_x$:H:Mn film as the n-type semiconductor layer in combination.

Now, as for the preparation of the pin junction photo-voltaic element according to the present invention, it is desired to continuously carry out the formation process of the n-type semiconductor layer, the formation process of the i-type semiconductor layer and the formation process of the p-type semiconductor layer. To be more specific in this respect, the three processes are continuously carried out in the same film deposition apparatus. Alternatively, they are separately carried out in respective deposition apparatuses being continuously connected through gate valves. In this case, the formation of the n-type semiconductor layer on a substrate is conducted in a first film deposition apparatus, then the resulting is transferred into a second film deposition apparatus under vacuum condition and the i-type semiconductor layer is formed on the previously formed n-type semiconductor layer therein, and the resulting is transferred into a third film deposition apparatus under vacuum condition and the p-type semiconductor layer is formed on the previously formed n-type semiconductor layer.

In the meantime, any of the foregoing semiconductor films according to the present invention i.e. the foregoing $ZnSe_{1-x}Te_x$:H:Mp semiconductor film and the foregoing $ZnSe_{1-x}Te_x$:H:Mn semiconductor film may be effectively prepared in accordance with one of the following three processes (1) through (3).

(1) A process for preparing a functional deposited film comprised of $ZnSe_{1-x}Te_x$:H which comprises the steps of introducing a Se-containing raw material gas, hydrogen gas ($H_2$), a Te-containing raw material gas into an activation space independent of the film-forming space, applying activation energy to these gases to form Se-containing precursor, hydrogen radicals in atomic state and Te-containing precursor, introducing said precursors and hydrogen radicals into the film-forming space, simultaneously introducing a Zn-containing raw material gas into said film-forming space, and causing said gases to chemically react with each other in the space surrounding the surface of a substrate maintained at elevated temperature in said film-forming space.

(2) A process for preparing a functional deposited film comprised of $ZnSe_{1-x}Te_x$H which comprises the steps of introducing a Se-containing raw material gas, hydrogen gas ($H_2$), a Zn-containing gas and a Te-containing raw material gas into the film-forming space in which a substrate is arranged, mixing said gases, applying a high-frequency power to a cathode installed in said film-forming space to thereby produce plasmas in the reaction space of the film-forming space, and causing said gases to chemically react with one another through decomposition, polymerization, radicalization, and ionization.

(3) A process for preparing a functional deposited film comprised of $ZnSe_{1-x}Te_x$H which comprises the steps of introducing an Ar gas and $H_2$ gas into the film-forming space in which a substrate is arranged and a cathode is arranged opposite to said substrate while leaving a certain distance between them, said cathode being provided on the surface thereof with a target of polycrystal $ZnSe_{1-x}Te_x$, applying a high-frequency power to said cathode to thereby perform the sputtering of said polycrystal $ZnSe_{1-x}Te_x$ and form plasma atmosphere environment in said film-forming space, and causing Se, Zn and Te in atomic state emitted from the target and hydrogen in atomic state formed by the plasma exitation of the $H_2$ gas to chemically react with one another in the space surrounding the surface of the substrate.

The functional deposited film prepared by any of the above-mentioned three processes (1) to (3) may be given desired semiconductor characteristics by the introduction of an appropriate dopant. Particularly, it is possible to introduce a p-type dopant into the $ZnSe_{1-x}Te_x$:H film. This makes it possible to provide a $ZnSe_{1-x}Te_x$:H:Mp film having the p-type conductivity. The doping in this case may be accomplished by introducing a gas containing a p-type dopant, alone or in combination with hydrogen gas, into the film-forming space. Needless to say, it is also possible to preapre an n-type semiconductor film from the $ZnSe_{1-x}Te_x$:H film by using a gas containing an n-type dopant in the same manner as in the preparation of p-type semiconductor film.

The above-mentioned processes (1) to (3) of the present invention will be described in more detail in the following.

Processes (1) and (2)

As the raw material to introduce Zn ("raw material A" for short), an easily gasifiable alkyl zinc compound represented by the formula: $(R)_2Zn$ (where R denotes an alkyl residue having 1 to 4 carbon atoms) is used. Typical examples of the alkyl zinc compound include dimethyl zinc (DMZn) and diethyl zinc (DEZn). Being liquid at room temperature, these organozinc compounds are gasified by bubbling with an inert gas carrier such as Ar and He at the time of their use.

As the raw material to introduce Se ("raw material B" for short), a gaseous or easily gasifiable hydrogen selenide ($H_2Se$), selenium halide, or alkyl selenium compound represented by the formula: $(R')_2Se$ (where R' denotes an alkyl residue having 1 to 4 carbon atoms) is used. Preferred examples of the selenium halide include selenium hexafluoride. Preferred examples of the alkyl selenium compound include dimethyl selenium (DMSe) and diethyl selenium (DESe).

As the raw material to introduce Te, a gaseous or easily gasifiable hydrogen telluride ($H_2Te$), tellurium halide, or alkyl tellurium compound represented by the formula: $(R'')_2Te$ (where R'' denotes an alkyl residue having 1 to 4 carbon atoms) is used. Preferred examples of the tellurium halide include tellurium hexafluoride. Preferred examples of the alkyl tellurium compound include dimethyl tellurium (DMTe) and diethyl tellurium (DETe).

Incidentally, the raw materials to introduce Se and Te are collectively referred to as "raw material B" hereinafter.

Among the compounds to be the raw material B, those which are not gaseous but liquid or solid at room temperature are gasified at the time of their use by bubbling with an inert carrier gas such as Ar and He, or by sublimation with heating.

In the preparation of the $ZnSe_{1-x}Te_x$:H film by the process (1) or (2), $H_2$ gas is purposely used.

According to a preferred embodiment of the process (1), the gaseous raw material B and $H_2$ gas in combination are introduced into an activation space, where they are excited with the action of an activation energy to form active species. In the case of using non-gaseous raw material B, the activation space may be constructed such that the non-gaseous raw material B is gasified by the aid of aforesaid inert gas or $H_2$ gas, and the gas thus formed is excited with the action of an activation energy.

Needless to say, in the process (1), it is possible to introduce $H_2$ gas alone into a separate activation space independent of said activation space, where the $H_2$ gas is excited with the action of an activation energy.

The above activation energy may be discharge energy, thermal energy, or light energy, or a combination thereof.

The excitation of the raw material B may be accomplished by the aid of a proper catalyst as well as the activation energy.

The above-mentioned process (1) or (2) of the present invention may be practiced in the following manner to prepare the p-type or n-type $ZnSe_{1-x}Te_x$:H:M film. That is, a gaseous raw material to provide a p-type dopant or n-type dopant ("p-type dopant raw material" or "n-type dopant raw material" for short) is introduced, alone, or together with the gaseous raw material A or the gaseous raw material B, or together with $H_2$ gas.

As the p-type dopant raw material, a gaseous or easily gasifiable compound is used. Examples of the p-type dopant raw material include organolithium compounds such as propyl lithium ($LiC_3H_7$) and sec-butyl lithium ($Li(sec-C_4H_9)$) which are liquid at room temperature; and inorganic lithium compounds such as lithium sulfide ($Li_2S$) and lithium nitride ($Li_3N$) which are solid at room temperature. Additional preferred examples include $AsH_3$, $PH_3$, $P_2H_4$, $AsF_3$, $AsCl_3$, $PF_5$, $PF_3$, $PCl_3$, $SbH_3$, and $SbF_3$.

The n-type dopant raw material, like the p-type dopant raw material, may be a member selected from those compounds which are gaseous at room temperature or easily gasifiable. Preferred examples of such compounds include trimethyl aluminum ($Al(CH_3)_3$), triethyl aluminum ($Al(C_2H_5)_3$), trimethyl gallium ($Ga(CH_2)_3$), triethyl gallium ($Ga(C_2H_5)_3$), trimethyl indium ($In(CH_3)_3$), triethyl indium ($In(C_2H_5)_3$), diborane ($B_2H_6$), monosilane ($SiH_4$), disilane ($Si_2H_6$), monogermane ($GeH_4$), tin hydride ($SnH_4$), methane ($CH_4$), ethane ($C_2H_6$), ethylene ($C_2H_4$), acetylene ($C_2H_2$), fluorine ($F_2$), and chlorine ($Cl_2$).

In the case where the p-type or n-type dopant raw material is liquid at room temperature, it is gasified at the time of use by bubbling with an inert gas such as Ar or He or $H_2$ gas as a carrier gas. In the case where the p-type or n-type dopant raw material is solid at room temperature, it is gasified at the time of use by sublimation with heating by the aid of a carrier gas such as Ar and He in a sublimation furnace.

In the case where the p-type or n-type $ZnSe_{1-x}Te_x$:H:M film is prepared by the above-mentioned process (1), the dopant raw material is preferably introduced into the activation space together with the gaseous raw material B and $H_2$ gas.

The above-mentioned process (1) or (2) of the present invention may be practiced in the following manner to prepare the p-type or n-type $ZnSe_{1-x}Te_x$:H:M film. That is, the substrate is maintained preferably at a temperature of 50° to 600° C., more preferably at a temperature of 50° to 500° C., and most preferably, at a temperature of 100 to 400° C. during the film formation process. So long as the substrate temperature is in the range of 50° to 600° C., usually there is obtained a deposited film in which crystal grain domains and non-crystal grain domains coexist, wherein the amount of hydrogen radicals or the flow rate of $H_2$ gas is changed during the film formation process.

One of the important film forming factors in the above-mentioned process (1) and (2) is the inner pressure of the film-forming space upon forming the desired film.

And it is preferably from $1 \times 10^{-4}$ to 50 Torr, more preferably from $5 \times 10^{-3}$ to 10 Torr, and most preferably, from $1 \times 10^{-3}$ to 5 Torr. In practice of this respect, the gaseous raw material A, the gaseous raw material B, hydrogen gas ($H_2$), and the gaseous dopant (p-type or n-type) raw material are introduced while being controlled through respective mass flow controllers at respective flow rates predetermined upon the kind of the semiconductor film to be prepared and while maintaining the inner pressure of the film-forming space at a value in the above range.

In the case of the process (1), the gaseous raw material A and the gaseous raw material B and the hydrogen radicals in atomic state are introduced into the film-forming space at a predetermined ratio. Said ratio, that is, the ratio of the sum of the respective flow rates for the two gaseous raw materials A and B versus the amount of the hydrogen radicals, is properly determined upon the kinds of the said two raw materials to be used and also the characteristics desired for the film to be prepared. However, in general, it is preferably from 1:10 to $1:10^4$, and more preferably, from 1:25 to $1:10^3$.

Likewise, in the case of the process (2), the ratio of the sum of the flow rate for the gaseous raw material A and the flow rate for the gaseous raw material B versus the flow rate for the hydrogen gas ($H_2$) is properly determined upon the interrelations among the high frequency power to be applied, the inner pressure of the film-forming space and the amount of hydrogen atoms to be incorporated into the film to be prepared. However, in general, it is preferably from 1:20 to $1:5 \times 10^4$, and more preferably, from 1:30 to $1:5 \times 10^3$.

Process (3)

This process is designed to prepare the above-mentioned $ZnSe_{1-x}Te_x$:H film and the foregoing p-type or n-type $ZnSe_{1-x}Te_x$:H:M film by means of sputtering, as mentioned above.

The target to be used is typically polycrystal $ZnSe_{1-x}Te_x$ containing Se and Te in a desired ratio. It may also be possible to use two targets of ZnSe and ZnTe, or three targets of Zn, Se, and Te. In the case where the sputtering is performed by the application of high-frequency power to the target, it is preferable to form a gas atmosphere composed of $H_2$ gas and Ar gas and/or He gas.

In the case of preparing the p-type or n-type $ZnSe_{1-x}Te_x$:H:M film in accordance with the process (3), the above sputtering is performed in a gas atmosphere composed of $H_2$ gas and Ar gas and/or He gas and also the foregoing gaseous p-type or n-type dopant raw material.

Figure 3:
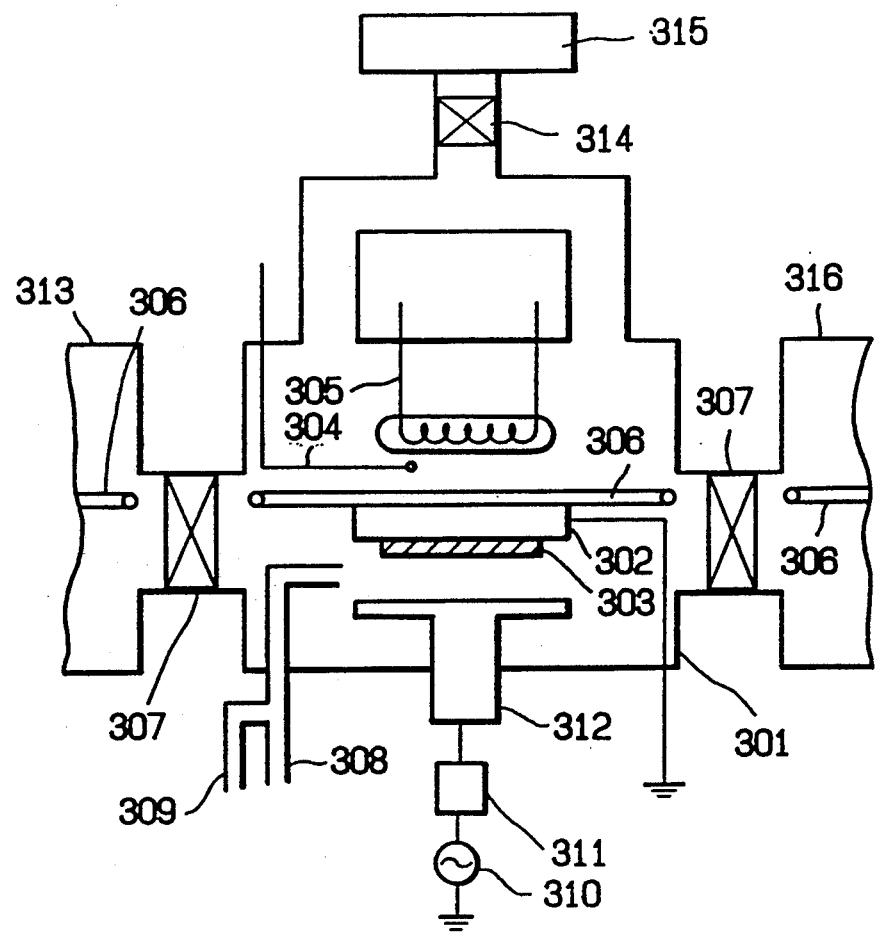
FIG. 3 is a schematic diagram to illustrate a representative apparatus suitable for practicing the later described process (2) of forming a constituent layer for any of the above photo-voltaic elements according to the present invention.
Figure 4:
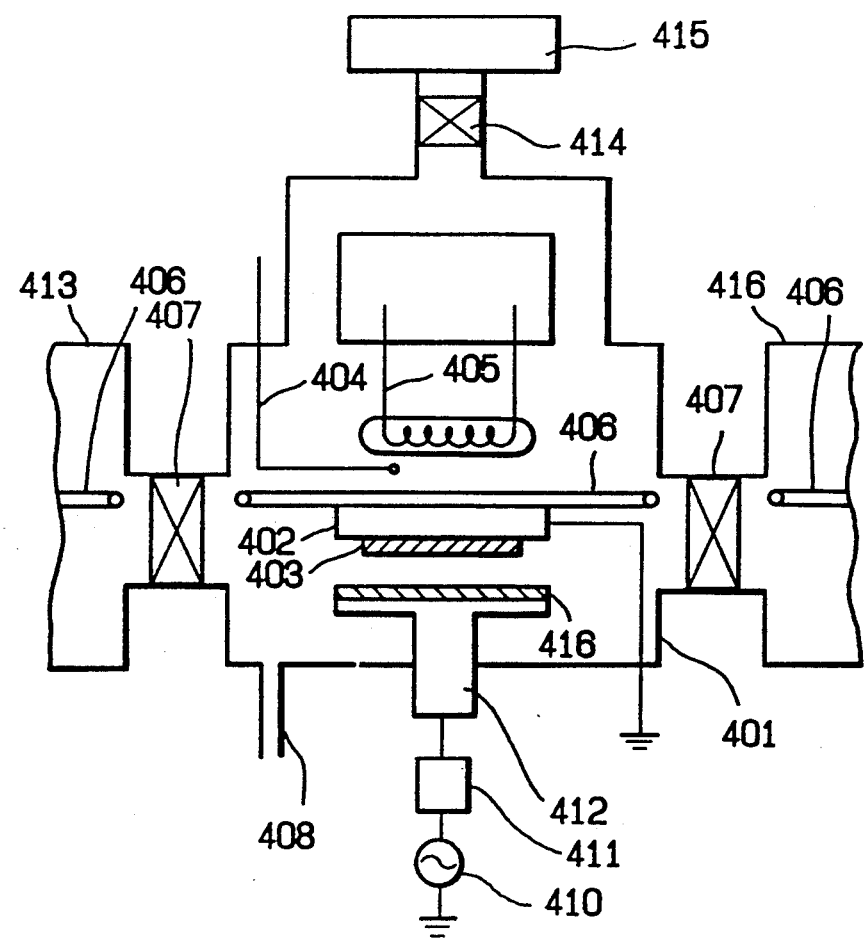
FIG. 4 is a schematic diagram to illustrate a representative apparatus suitable for practicing the later described process (3) of forming a constituent layer for any of the above photo-voltaic elements according to the present invention.

In the production of the p-type or n-type $ZnSe_{1-x}Te_x$:H:M film is produced according to process (3), the important film-forming conditions include the target-to-substrate distance, the high-frequency power, the substrate temperature, the inner pressure, and the gas flow rate. The target-to-substrate distance may vary depending on the construction and scale of the equipment used. In general, it is preferably from 20 to 100 mm, and more preferably, from 40 to 80 mm. The high-frequency power may vary depending upon the type and size of the target. In general, it is preferably from 0.3 to 7 $W/cm^2$, and most preferably, from 0.8 to 4 $W/cm^2$. As for the substrate temperature, it is adjusted to the same range as in the above-mentioned process (1) or (2). As for the inner pressure at the time of forming the film, it is preferably from $1 \times 10^{-5}$ to $1 \times 10^1$ Torr, and more preferably, from $1 \times 10^{-4}$ to $1 \times 10^{-2}$ Torr. The $H_2$ gas and Ar gas and/or He gas and the gaseous p-type or n-type dopant raw material are properly controlled in relation to the amounts of Zn, Se and Te in atomic state which are emitted from the target during the sputtering. The respective flow rates of the above gases are controlled by mass flow controllers such that the gas atmosphere in the reaction zone of the film-forming space contains a prescribed amount of hydrogen atoms (H) or a prescribed sum amount of hydrogen atoms (H) and dopant (M)(or H+M). In this case, the film-forming space is evacuated such that the above-mentioned internal pressure is maintained. And it is desired to establish a certain ratio between the sum amount of Zn, Se and Te in atomic state and the sum amount of hydrogen atoms (H) and dopant (M)(H+M). It is preferably from $10^2$:1 to 1:$10^3$, more preferably from 10:1 to 1:$10^2$, and most preferably, from 5:1 to 1:50. Any of the above-mentioned process (1) to (3) may be practiced using a proper apparatus. Typical examples of such apparatus are shown in FIGS. 2 to 4.

Explanation will be made on the formation of the foregoing Non-Si(H,F) films or Non-Si(C.,Ge)(H,F) films to constitute the i-type semiconductor layer of the pin junction photo-voltaic element.

Any of the Non-Si(H,F) films and the Non-Si(C.,Ge)(H,F) films are well known, and there have been already proposed various methods for the preparation of them.

However, they may be properly prepared also in accordance with the aforementioned process (1) of the present invention.

For example, in the case of preparing a A-Si:H:F film or a poly-Si:H:F film, as the raw material gas to supply Si, there is used a member selected from the group consisting of silicon halides such as $SiF_4$ and $Si_2F_6$, partially hydrogenated silicon halides such as $SiH_2F_2$, and mixtures of these compounds.

As the raw material gas to generate hydrogen radicals in atomic state which cause reaction with the Si supplying raw material gas to form precursors capable of contributing to formation any of the aforesaid film, there is used hydrogen gas ($H_2$) or a mixture of said $H_2$ gas with an innert gas such as He, Ne or Ar.

In a preferred embodiment of preparing said A-Si:H:F film or poly-Si:H:F film in accordance the aforementioned process (1) of the present invention, the above Si supplying raw material gas is activated with the action of an activation energy to generate active species which are successively introduced into the film-forming space in which a substrate on which a film to be deposited is placed while being maintained at a desired temperature; the above $H_2$ gas is also activated with the action of an activation energy to generate hydrogen radicals in atomic state which are successively introduced into the said film-forming space; and the said active species and the hydrogen radicals are reacted to cause the formation of said A-Si:H:F film or poly-Si:H:F film on the substrate at a desired inner pressure.

The inner pressure in this case is preferably $1 \times 10^{-4}$ to 50 Torr, more preferably $5 \times 10^{-3}$ to 10 Torr, and most preferably $1 \times 10^{-3}$ to 5 Torr. And the substrate temperature is preferably 50° to 500° C., more preferably 100° to 450° C., and most preferably, 150° to 400° C. And it is desired for the ratio of the flow rate of the Si supplying raw material gas to the amount of the hydrogen radicals in atomic state during the film-forming process to be controlled to preferably 1:10 to 1:$10^4$ or more preferably, 1:25 to 1:$10^3$. In the case where the amount of the said hydrogen radicals is excessive, there will be formed a poly-Si:H:F film.

In the case of forming a A-SiC:H:F film, there is used a carbon halide such as $CF_4$ or $CCl_4$, a hydrocarbon such as $C_2H_4$, $C_2H_2$ or $CH_4C_2H_6$, or a compound comprising silicon and hydrocarbon such as $Si(CH_3)_4$ or $Si(C_2H_5)_4$ in addition to the foregoing Si supplying raw material.

Likewise, in the case of forming a A-SiGe:H:F film, there is used a germanium halide such as $GeF_4$ or a germanium hydride such as $GeH_4$s the Ge supplying raw material.

As for the flow rate of the C supplying raw material gas to be introduced in the case of forming said A-SiC:H:F film, due regards should be made since the velocity for the reaction of said raw material gas with the hydrogen radicals and that for the reaction of the Si supplying raw material gas with the hydrogen radicals differ with each other and because of this, there will sometimes occur such occasion that the flow ratio of the Si supplying raw material gas to the C supplying raw material gas is not corresponding to the desired constitutional ratio of Si to C in a A-SiC:H:F film to be obtained.

Similar due regards should be made also in the case of forming said A-SiGe:H:F film.

Any of the aforementioned p-type semiconductor films other than the foregoing $ZnSe_{1-x}Te_x$:H:Mp film which are used to form the p-type semiconductor layer of the pin junction photo-voltaic element may be prepared using appropriate film-forming raw material gases and an appropriate p-type dopant supplying raw material gas in the similar way as in the case of forming the i-type semiconductor layer.

Likewise, any of the aforementioned n-type semiconductor films other than the foregoing $ZnSe_{1-x}Te_x$:H:Mn film which are used to form the n-type semiconductor layer of the pin junction photo-voltaic element may be prepared using appropriate film-forming raw material gases and an appropriate n-type dopant supplying raw material gas in the similar way as in the case of forming the i-type semiconductor layer.

FIG. 2 schematically shows a preferred example of the apparatus suitable to practice the process (1) of the present invention. In FIG. 2, there is shown a film forming chamber 201 in which is installed a substrate holder 202. There is shown a substrate 203 which is fixed onto the substrate holder 202. The substrate 203 is heated by radiation from an infrared heater 205, while being monitored by a temperature monitor 204. The substrate holder 202 is transferred to the other film forming chamber 213 or a load lock chamber 212 through a gate valve 207 by a substrate transfer unit 206. Raw material gas (A) is introduced into the film forming chamber 201 through the gas inlet pipe (A) 208. Raw material gas (B) and hydrogen gas are introduced through the gas inlet ipipe (B) 209. The gases are activated in an activation region 210 by an activation means 211, and then introduced into the film forming chamber 201.

The activation means may be any means to decompose, polymerize, radicalize, or ionize raw material gases (A) and (B) and hydrogen gas by the aid of electric energy of direct current, high-frequency, or microwave, or by the aid of light energy, or heat energy, or by the aid of catalyst, to thereby promote the reactions among the raw material gases (A) and (B) and hydrogen gase and also promote the film-forming reactions on the surface of the substrate.

The gases in the film forming chamber are exhausted through a valve 214 by an exhaust pump (not shown), so that the pressure in the film forming chamber is kept at a prescribed level.

Explanation will be made on an example for the preparation of the ZnSe:H film of the present invention using the apparatus shown in FIG. 2.

At first, Se-containing raw material gas (B) such as DESe and hydrogen gas are fed through the gas inlet pipe 209. The gases are activated in the activation region 210 with the action of activation energy supplied by the activating means 211. Thus there are formed an Se-containing precursor and hydrogen radicals in atomic state.

On the other hand, the Zn-containing raw material gas (A) such as DEZn entering through the other gas inlet pipe 208 is introduced into the film forming chamber 201 without being excited by the activating means because the opening of the gas inlet pipe 208 is located downstream being apart from the activation region 210. In the film forming chamber 201, the Zn-containing raw material gas (A) reacts with hydrogen radicals to form a Zn-containing precursor.

Upon introduction into the film-forming chamber, the Se-containing precursor, Zn-containing precursor, and hydrogen radicals react with one another to form a ZnSe:H film containing a desired amount of hydrogen atoms.

It is considered that hydrogen radicals take part also in the reaction for film deposition on the substrate surface. That is, the hydrogen radicals function to remove unnecessary alkyl groups from the deposited film and also to terminate dangling bonds in the ZeSe thin film and they are taken into the film. The activation energy in the activating region can be brought to the film-forming chamber for example by increasing the quantity of the activation energy supplied by the activating means in case where necessary to promote the reaction of the Zn-containing raw material gas with hydrogen radicals and the reaction of the Zn-containing precursor with the Se-containing precursor in the reaction chamber and also to increase the amount of hydrogen radicals to be supplied. The amount of hydrogen atoms (H) to be contained in the ZnSe:H film as obtained can be controlled by properly adjusting the flow rate of hydrogen gas introduced as a raw material gas, the quantity of activation energy to be supplied, the inner pressure in the film-forming chamber, the distance between the activation region 210 and the opening of the gas inlet pipe 208, and the substrate temperature. The deposited film can be made p-type or n-type by adding the above-mentioned dopant raw material to the raw material gas (A) or raw material gas (B). In the case of preparing $ZnSe_{1-x}Te_x$:H film, the raw material gas (B) is introduced together with a Te-containing raw material gas such as DETe into the system.

FIG. 3 schematically shows a preferred example of the apparatus used to practice the process (2) of the present invention. When this apparatus is in operation, raw material gas (A) is introduced through the gas inlet pipe 308, and raw material gas (B) and hydrogen gas are introduced through the gas inlet pipe 309. These gases are eventually mixed and they are reacted while being decomposed, polymerized, radicalized, and ionized in plasma generated by high-frequency power applied to the cathode 312 from the high-frequency source 310 through the matching circuit 311 to thereby form a ZnSe:H thin film or a $ZnSe_{1-x}Te_x$:H film on the substrate 303. In the case of forming said $ZnSe_{1-x}Te_x$H film, the raw material gas (A) is mixed with a Te-containing raw material gas. By feeding the foregoing dopant raw material in the above case, the resulting deposited film may be made p-type or n-type.

FIG. 4 schematically shows a preferred example of the apparatus suitable to practice the process (3) of the present invention. In FIG. 4, there is shown a cathode 412, onto which is attached a target 413 of ZnSe polycrystal or $ZnSe_{1-x}Te_x$polycrystal. Ar gas and $H_2$ gas are introduced through the gas inlet 408 and they are ionized by plasma generated by high-frequency power applied to the cathode 412. The resulting Ar ions and H ions contribute to sputtering the target 413. Thus a ZnSe:H thin film or a $ZnSe_{1-x}Te_x$:H film is deposited on the substrate 403. By mixing the Ar gas and $H_2$ gas with the above-mentioned dopant raw material, the resulting deposited film may be made p-type or n-type.

DESCRIPTION OF THE PREFERRED EMBODIMENTS

The photo-voltaic element of the present invention will be described in more detail with reference to the following examples, which are not intended to restrict the scope of the invention.

EXAMPLE 1

A pin junction photovoltic element with the configuration shown in FIG. 1(A) was prepared using the film forming apparatus shown in FIG. 2, in accordance with the above-mentioned process (1).

At first, a stainless steel substrate 101 of 50 mm by 50 mm in size was placed in a known sputtering apparatus (not shown). The sputtering apparatus was evacuated to $10^{-5}$ Torr or below. On the substrate was deposited an Ag thin film of about 1000 Å in thickness as the lower electrode 102 by sputtering Ag in argon. The substrate was removed from the sputtering apparatus and then fixed, with the lower electrode 102 facing downward, onto the substrate holder 202 on the substrate transfer unit 206 installed in the load lock chamber 212. The load lock chamber 212 was evacuated to $10^{-5}$ Torr or below by means of a vacuum pump (not shown). During evacuation, the film-forming chamber 201 was evacuated to $10^{-5}$ Torr or below by means of the vacuum pump 215. When the pressures in the two chambers became almost balanced, the two chambers were opened and the substrate transfer unit 206 was moved to the film forming chamber 201.

The substrate was then heated to about 200° C. by actuating electric heater 205.

Thereafter, SiF$_4$ gas from a gas reservoir therefor (not shown) was introduced through the gas inlet pipe 208 into the film-forming chamber 201 at a flow rate of 30 SCCM while said SiF$_4$ gas being mixed with PH$_3$ gas from a gas reservoir therefor (not shown). Concurrently, Ar gas from the gas reservoir 217 and H$_2$ gas from the gas reservoir 216 were introduced through the gas inlet pipe 209 into the film-forming chamber 201 at respective flow rates of 250 SCCM and 20 SCCM. With the exhaust valve 214 properly opened, the inner pressure of the film-forming chamber 201 was maintained at about 0.5 Torr. Film-forming was started by applying microwave power (200 W) from the microwave power generator 211.

After 2 minutes, there was formed an n-type A-Si:H:F:P film 103 on the substrate 101. The application of said microwave power and the introduction of said gases were suspended, and the film-forming chamber 201 was evacuated to about $10^{-5}$ Torr. Then, the above film-forming procedures were repeated for 50 minutes, except that the introduction of PH$_3$ was not conducted, to thereby form an i-type A-Si:H:F film on the previously formed n-type A-Si:H:F:P film.

Thereafter, the application of the microwave power and the introduction of the gases were suspended, and the film forming chamber 201 was evacuated to about $10^{-5}$ Torr.

Successively, liquid DEZn in Dewar's bottle 225 was gasified by bubbling it with He gas from gas reservoir 217 to generate He gas saturated with DEZn. At that time, the flow rate of said He gas was controlled to 10 SCCM by means of mass flow controller 221.

The resultant He gas saturated with DEZn was successively transported into the gas inlet pipe 209 at a flow rate of 5 SCCM wherein the flow amount of DEZn was controlled to be $1.0 \times 10^6$ mol/min. At the same time, LiC$_3$H$_7$ in Dewar's bottle 226 was introduced into the gas inlet pipe 209 at a flow rate of $1.0 \times 10^9$ mol/min. Concurrently, DESe in Dewar's bottle 223 and DETe in Dewar's bottle 224 were introduced into the gas inlet pipe 208 at respective flow rates of $3.0 \times 10^6$ mol/min. and $8.0 \times 10^6$ mol/min. in the same manner as in the case of said DEZn At the same time, H$_2$ gas from the gas reservoir 216 was introduced thereinto while its flow rate being controlled to 15 SCCM by the mass flow controller 218.

In the above, the above respective flow rates for said DESe, DETe, DEZn and LiC$_3$H$_7$ were set up respectively by controlling the respective temperatures of constant temperature waters contained in constant temperature water baths 227, 228, 229 and 230 in which the Dewar's bottles 223, 224, 225 and 226 being placed by means of electric heaters 235, 236, 237 and 238 in said water baths 227, 228, 229 and 230 to thereby adjust the respective temperatures of the starting raw liquids for said DESe, DETe, DEZn and LiC$_3$H$_7$ to desired temperatures.

With the exhaust valve 214 properly opened, the inner pressure of the film-forming chamber 201 was maintained at about 0.5 Torr. Film-forming was started by applying microwave power (200 W) from the microwave power generator 211. After 2 minutes, there was formed a p-type ZnSe$_{1-x}$Te$_x$:H:Li film 105 on the previously formed i-type film. The application of microwave power and the introduction of gases were suspended, and the film-forming chamber 201 was evacuated to $10^{-5}$ Torr or below by the vacuum pump 215.

The above film-forming conditions are shown in Table 6.

Thereafter, the substrate transfer unit 206 was moved to the load lock chamber 212 through the gate valve 207. After cooling therein, the substrate 101 on which were deposited the n-type, i-type and p-type semiconductor layers was taken out. Then, the substrate was placed in a known vacuum deposition apparatus, which was evacuated to $10^{-5}$ Torr or below. On the foregoing p-type semiconductor layer 105 on the substrate 101 was deposited an ITO thin film of about 700 Å in thickness in an oxygen atmosphere with about $1 \times 10^{-3}$ Torr. The source of deposition was a 1:1 (by weight) mixture of In and Sn placed in a crucible which was heated by the resistance heating method. The substrate temperature was 175° C. In this way the transparent electrode 106 was formed. After cooling, the substrate was removed. With a permalloy mask placed on the transparent electrode 106, the substrate was placed in another known vacuum deposition apparatus, which was evacuated to $1 \times 10^{-5}$ Torr or below. A Ag film of about 1.0 $\mu$m in thickness was deposited by the resistance heating method to form the comb-shaped collecting electrode 107. Thus there was obtained sample No. 1.

The characteristic properties of Sample No. 1 as a solar cell were evaluated in the following manner.

The open-circuit voltage (Voc) which is produced when the transparent electrode 106 is irradiated with AM-1.5 light (100 mW/cm$^2$) was measured. The output which is produced when the transparent electrode 106 is irradiated with AM-1 light through a 450-nm interference filter was measured. The change in conversion efficiency that takes place after irradiation with AM-1.5 light for 10 hours was measured.

The results of measurements were as shown in Table 22.

Other than the foregoing, there were provided a silicon single crystal wafer with a SiO$_2$ film formed thereon by the known thermal oxidation technique and a quartz glass plate. And there were deposited a ZnSe$_{1-x}$Te$_x$:H:Li film as the aforesaid p-type semiconductive layer on said silicon single crystal wafer and also on said quartz glass place by repeating the aforesaid procedures for the formation of said film.

The resultant deposited films were examined for the content of hydrogen atoms (H) and the proportion of crystal grain domains per unit volume in accordance with the procedures of examining them which were employed in the foregoing Experiments.

The results obtained were as shown in Table 22.

EXAMPLE 2

A pin junction photo-voltaic element with the configuration shown in FIG. 1(A) was prepared using the film-forming apparatuses shown in FIG. 2 and FIG. 3, in accordance with the above-mentioned processes (1) and (2).

On a stainless steel substrate 101 (303 in FIG. 3) was formed an Ag thin film as the lower electrode 102 in the same manner as in Example 1. Further, the procedures of Example 1 were repeated to form the n-type semiconductor layer 103 and the i-type semiconductor layer 104. Then, the substrate 303 was fixed onto the substrate holder 302. While the inner pressure in the film-forming chamber 301 was maintained at $10^{-5}$ Torr or below, the substrate 303 was heated to about 300° C. by means of infrared heater 305. The raw material gas A and the raw material gas B shown in Table 7 were introduced into the film-forming chamber 301 through the gas inlet pipes 308 and 309 respectively, under the conditions shown in Table 7.

With the exhaust valve 314 properly opened, the inner pressure of the film-forming chamber 301 was maintained at about 1.0 Torr. Film-forming was started by applying high-frequency power (50 W) from the high-frequency (13.56 MHz) generator 310. (The high-frequency generator 310 is connected to the cathode 312 through the matching circuit 311.) After discharging for 2 minutes, there was deposited a p-type $ZnSe_{1-x}Te_xH:Li$ film 105.

Then, the substrate with the deposited films was removed from the film forming chamber. On the deposited p-type film was formed an ITO film of about 700 Å in thickness as the transparent electrode 106 in the same manner as in Example 1. On the ITO film was formed an Ag thin film as the collecting electrode 107. Thus there was obtained Sample No. 2. The characteristic properties of Sample No. 2 as a solar cell were evaluated in the same manner as in Example 1. As a result, there were obtained the results shown in Table 22.

Other than the foregoing, there were provided a silicon single crystal wafer with a $SiO_2$ film formed thereon by the known thermal oxidation technique and a quartz glass plate. And there was deposited a p-type $ZnSe_{1-x}Te_x:H:Li$ film as the aforesaid p-type semiconductor layer on said silicon single crystal wafer and also on said quartz glass place by repeating the aforesaid procedures for the formation of said film.

The resultant deposited films were examined for the content of hydrogen atoms (H) and the proportion of crystal grain domains per unit volume in accordance with the procedures of examining them which were employed in the foregoing Experiments.

The results obtained were as shown in Table 22.

EXAMPLE 3

A pin junction photo-voltaic element with the configuration shown in FIG. 1(A) was prepared using the apparatuses shown in FIG. 2 and FIG. 4, in accordance with the above-mentioned processes (1) and (3).

On a stainless steel substrate 101 (403 in FIG. 4) was deposited the lower electrode 102 comprising Ag in the same manner as in Example 1.

Then, the proecedures of Example 1 were repeated to form the n-type semiconductor layer 103 and the i-type semiconductor layer 104. Thereafter, the substrate was fixed onto the substrate holder 402 on the substrate transfer unit 406 and transferred into the film-forming chamber 401. The inner pressure in the film-forming chamber 401 was kept at $10^{-5}$ Torr or below. A $ZnSe_{1-x}Te_x$polycrystal target 416 was placed on cathode 412. The substrate 403 was heated to about 300° C by means of infrared heater 405. The raw material gases shown in Table 8 were introduced at the respective flow rates shown therein into the film-forming chamber 401 through the gas inlet pipe 401. With the exhaust valve 414 properly opened, the inner pressure of the film-forming chamber 401 was kept at 0.05 Torr. Film-forming was started by applying high-frequency power under the conditions shown in Table 8.

After discharging for 3 minutes, there was formed a p-type $ZnSe_{1-x}Te_x$:H:Li film 105.

On the foregoing p-type $ZnSe_{1-x}Te_x$:H:Li film was formed an ITO film of about 700 Å in thickness as the transparent electrode 106 and a Ag thin film as the collecting electrode 107 in the same way as in Example 1. Thus there was obtained Sample No. 3. The characteristic properties of Sample No. 3 as a solar cell were evaluated. The results obtained were as shown in Table 22.

Other than the foregoing, there were provided a silicon single crystal wafer with a $SiO_2$ film formed thereon by the known thermal oxidation technique and a quartz glass plate. And there was deposited a p-type $ZnSe_{1-x}Te_x$:H:Li film as the aforesaid p-type semiconductor layer on said silicon single crystal wafer and also on said quartz glass place by repeating the aforesaid procedures for the formation of said film.

The resultant deposited films were examined for the content of hydrogen atoms (H) and the proportion of crystal grain domains per unit volume in accordance with the procedures of examining them which were employed in the foregoing Experiments.

The results obtained were as shown in Table 22.

EXAMPLE 4

A pin junction photo-voltaic element with the configuration shown in FIG. 1(A) by repeating the procedures of Example 1 except the formation of the i-type semiconductor layer 104, which was conducted as follows with the use of the apparatus shown in FIG. 2.

That is, the film-forming chamber 201 was evacuated to about $10^{-5}$ or below by means of the vacuum pump 215. The substrate was maintained at about 200° C., then $SiF_4$ gas and $CF_4$ gas were introduced through the gas inlet pipe 208 into the film-forming chamber 201 respectively at a flow rate of 20 SCCM. Concurrently, Ar gas and $H_2$ gas were introduced through the gas inlet pipe 209 into the film-forming chamber 201 at respective flow rates of 250 SCCM and 40 SCCM. With the exhaust valve 214 properly opened, the inner pressure of the film-forming chamber 201 was maintained at about 0.2 Torr. Film-forming started by applying microwave power (200 W) from the microwave power generator 211. After 50 minutes, there was formed a A-SiC:H:F film as the i-type semiconductor layer 104. Thus there was obtained Sample No. 4.

The characteristic properties of Sample No. 4 as a solar cell were evaluated. The results obtained were as shown in Table 22.

EXAMPLE 5

A pin junction photo-voltaic element with the configuration shown in FIG. 1(A) by repeating the procedures of Example 1 except the formation of the i-type semiconductor layer 104, which was conducted as follows with the use of the apparatus shown in FIG. 2.

That is, the film-forming chamber 201 was evacuated to about $10^{-5}$ or below by means of the vacuum pump 215. The substrate was maintained at about 200° C., then $SiF_4$ gas and $GeF_4$ gas were introduced through the gas inlet pipe 208 into the film-forming chamber 201 at respective flow rates of 20 SCCM and 0.5 SCCM. Concurrently, Ar gas and $H_2$ gas were introduced through the gas inlet pipe 209 into the film-forming chamber 201 at respective flow rates of 250 SCCM and 10 SCCM. With the exhaust valve 214 properly opened, the inner pressure of the film-forming chamber 201 was maintained at about 0.2 Torr. Film-forming started by applying microwave power (200 W) from the microwave power generator 211. After 50 minutes, there was formed a A-SiGe:H:F film as the i-type semiconductor layer 104. Thus there was obtained Sample No. 5.

The characteristic properties of Sample No. 5 as a solar cell were evaluated. The results obtained were as shown in Table 22.

EXAMPLE 6

A pin junction photo-voltaic element with the configuration shown in FIG. 1(A) by repeating the procedures of Example 1 except the formation of the i-type semiconductor layer 104, which was conducted as follows with the use of the apparatus shown in FIG. 2.

That is, the film-forming chamber 201 was evacuated to about $10^{-5}$ or below by means of the vacuum pump 215. The substrate was maintained at about 200° C., then $SiF_4$ gas was introduced through the gas inlet pipe 208 into the film-forming chamber 201 a at a flow rate of 10 SCCM. Concurrently, Ar gas and $H_2$ gas were introduced through the gas inlet pipe 209 into the film-forming chamber 201 at respective flow rates of 250 SCCM and 40 SCCM. With the exhaust valve 214 properly opened, the inner pressure of the film-forming chamber 201 was maintained at about 0.2 Torr. Film-forming started by applying microwave power (100 W) from the microwave power generator 211. After 90 minutes, there was formed a poly-Si:H:F film as the i-type semiconductor layer 104. Thus there was obtained Sample No. 6.

The characteristic properties of Sample No. 6 as a solar cell were evaluated. The results obtained were as shown in Table 22.

EXAMPLE 7

A pin junction photo-voltaic element with the configuration shown in FIG. 1(B) using a glass plate (Corning's glass plate No. 7059, product by Corning Glass Works, U.S.A.) as the substrate 101.

Firstly, a ITO film of 500 Å in thickness as the transparent electrode 106 was formed on the glass plate by way of the known sputtering method. Then, there were formed the p-type semiconductor layer 105 comprising a $ZnSe_{1-x}Te_x$:H:Li film, the i-type semiconductor layer 104 comprising a A-Si:H:F film, the n-type semiconductor layer 103 comprising a A-Si:H:F:P, and the electrode 102 comprising an Ag thin film of about 500 Å in thickness by repeating the corresponding procedures of Example 1. Thus, there was obtained Sample No. 7. The characteristic properties of Sample No. 7 as a solar cell were evaluated. The results obtained were as shown in Table 22.

EXAMPLE 8

A pin junction photo-voltaic element with the configuration shown in FIG. 1(A) having an n-type semiconductor layer 103 comprising a $ZnSe_{1-x}Te_x$:H:Al film, an i-type semiconductor layer 104 comprising a A-Si:H:F film and a p-type semiconductor layer 105 comprising a $ZnSe_{1-x}Te_x$:H:Li film was prepared by repeating the procedures of Example 1, except that the said $ZnSe_{1-x}Te_x$H Al film was prepared by repeating the procedures for the formation of the p-type semiconductor layer in Example 1, wherein TEAl was fed at a flow rate of $3.0 \times 10^{-9}$ mol/min. in stead of the $LiC_3H_7$. Thus, there was obtained Sample No. 8. The characteristic properties of Sample 8 as a solar cell were evaluated. The results obtained were as shown in Table 22.

COMPARATIVE EXAMPLE 1

In this comparative example, there was prepared a pin junction photo-voltaic element with the configuration shown in FIG. 1(A) having an n-type semiconductor layer 103 comprising a A-Si:H:F:P film, an i-type semiconductor layer 104 comprising a A-Si:H:F film and a p-type semiconductor layer 105 comprising a A-Si:H:F:B film by repeating the procedures of Example 1, except that the said A-Si:H:F:B film for the p-type semiconductor layer was formed in the following with the use of the film-forming apparatus shown in FIG. 2.

That is, the substrate was maintained at about 200° C., $SiF_4$ gas was introduced through the gas inlet pipe 208 into the film-forming chamber 201 at a flow rate of 30 SCCM while said $SiF_4$ gas being mixed with $BF_3$ gas. Concurrently, Ar gas and $H_2$ gas were introduced through the gas inlet pipe 209 into the film-forming chamber 201 at respective flow rates of 250 SCCM and 30 SCCM. With the exhaust valve 214 properly opened, the inner pressure of the film-forming chamber 201 was maintained at about 0.2 Torr. Film-forming was started by applying microwave power (200 W) from the microwave power generator 211. After 3 minutes, there was formed the said A-Si:H:F:B film.

Thus, there was obtained a comparative sample (Sample No. 1'). The characteristic properties of Sample No. 1' as a solar cell were evaluated. The results obtained were as shown in Table 23.

COMPARATIVE EXAMPLE 2

In this comparative example, there were prepared two pin junction photo-voltaic element samples with the configuration shown in FIG. 1(A) (Sample Nos. 2' and 3').

Sample No. 2' was prepared by repeating the procedures of Example 1, except that there was not used $H_2$ gas at the time of forming the p-type semiconductor layer.

Sample No. 3' was prepared by repeating the procedures of Example 1, except that the flow rate of the $H_2$ gas was changed to 200 SCCM at the time of forming the p-type semiconductor layer. The characteristic properties of each of the two samples as a solar cell were evaluated. The results obtained were as shown in Table 23.

Each of Sample Nos. 2' and 3' was examined for the content of hydrogen atoms (H) and the proportion of crystal grain domains per unit volume in accordance with the procedures of examining them which were employed in the foregoing Experiments.

The results obtained were as shown in Table 23.

COMPARATIVE EXAMPLE 3

In this comparative example, there was prepared a pin junction photovoltaic element sample with the configuration shown in FIG. 1(A)(Sample No. 4') by repeating the procedures of Example 1, except that the flow rate of the DESe and the flow rate of the DETe in the raw material B were changed to $7.5 \times 10^{-6}$ mol/- min. and $5.0 \times 10^{-6}$ mol/min. The characteristic properties of Sample No. 4' as a solar cell were evaluated. The results obtained were as shown in Table 23.

Sample No. 4' was examined for the content of hydrogen atoms (H) and the proportion of crystal grain domains per unit volume in accordance with the procedures of examining them which were employed in the foregoing Experiments.

The results obtained were a shown in Table 23.

COMPARATIVE EXAMPLE 4

In this comparative example, there were prepared three pin junction photovoltaic element samples respectively with the configuration shown in FIG. 1(A) (Sample Nos. 5', 6' and 7') by repeating the procedures of Example 1, except that the formation of the i-type semiconductor layer was conducted under the conditions shown in Table 9 using the film-forming apparatus shown in FIG. 4 to form a A-Si film (Sample No. 5'), a A-SiC film (Sample No. 6') and a A-SiGe film (Sample No. 7').

The characteristic properties of each of Samples Nos. 5', 6' and 7' were evaluated. The results obtained were as shown in Table 23.

The p-type film to constitute the p-type semiconductor layer for each sample was examined for the content of hydrogen atoms (H) and the proportion of crystal grain domains per unit volume in accordance with the procedures of examining them which were employed in the foregoing Experiments.

The results obtained were as shown in Table 23.

EXAMPLE 9

A triple-cells stacked pin junction photovoltaic element with the configuration shown in FIG. 1(C) (Sample No. 9) which has three different i-type semiconductor layers having three different band gaps.

On a stainless steel substrate 101 was formed an Ag thin film as the lower electrode 102 in the same manner as in Example 1.

Then, the procedures of Example 5 were repeated to thereby prepare a first cell unit 111 comprising an n-type semiconductor layer 103 comprising a A-Si:H:F:P film, an i-type semiconductor layer 104 comprising a A-SiGe:H:F film and a p-type semiconductor layer 105 comprising a $ZnSe_{1-x}Te_x$:H:Li film. Successively, the procedures of Example, were repeated, except that the film-forming period for the i-type semiconductor layer was changed to 40 minutes, to thereby prepare a second cell unit 112 comprising an n-type semiconductor layer 114 comprising a A-Si:H:F:P film, an i-type semiconductor layer 115 comprising a A-Si:H:F film and a p-type semiconductor layer 116 comprising a $ZnSe_{1-x}Te_x$:H:Li film. Finally, the procedures of Example 4 were repeated, except that the film-forming period for the i-type semiconductor layer was changed to 30 minutes, to thereby prepare a third cell unit 113 comprising an n-type semiconductor layer 117 comprising a A-Si:H:F:P film, an i-type semiconductor layer 118 comprising a A-SiC:H:F film and a p-type semiconductor layer 119 comprising a $ZnSe_{1-x}Te_x$:H:Li film.

On the thus formed p-type semiconductor layer 119, there were formed a ITO film of about 700 Å in thickness to be a transparent electrode 106 and a com-shaped Ag film of about 1.0 μm in thickness to be a collecting electrode 107 respectively in the same manner as in Example 1.

The characteristic properties of Sample No. 9 as a solar cell were evaluated. The results obtained were as shown in Table 24.

COMPARATIVE EXAMPLE 5

In this comparative example, there was prepared a triple-cells stacked pin junction photovoltaic element with the configuration shown in FIG. 1(C)(Sample No. 8') by repeating the procedures of Example 9, except that any of the p-type semiconductor layers 105, 116 and 119 was made to be comprised of a A-Si:H:F:B film prepared by repeating the procedures of Comparative Example 1

The characteristic properties of Sample 8' as a solar cell were evaluated. The results obtained were as shown in Table 24.

EXAMPLE 10

A pin junction photovoltaic element sample with the configuration shown in FIG. 1(A)(Sample No. 10) was prepared by repeating the procedures of Example 1, except that the formation of the n-type semiconductor layer 103 was carried out by the sputtering method using the apparatus shown in FIG. 4 under the conditions shown in Table 10 to thereby form an n-type ZnSe:Ga film to be the n-type semiconductor layer 103.

The characteristic properties of the thus prepared Sample 10 as a solar cell were evaluated. The results obtained were as shown in Table 25.

EXAMPLE 11

A pin junction photovoltaic element sample with the configuration shown in FIG. 1(A)(Sample No. 11) was prepared by repeating the procedures of Example 1, except that the formation of the n-type semiconductor layer 103 was carried by the plasma CVD method using the apparatus shown in FIG. 3 under the conditions shown in Table 11 to thereby form an n-type A-SiGe:H:F:P film to be the n-type semiconductor layer 103.

The characteristic properties of the thus prepared Sample No. 11 as a solar cell were evaluated. The results obtained were as shown in Table 25.

EXAMPLE 12

A pin junction photovoltaic element sample with the configuration shown in FIG. 1(A)(Sample No. 12) was prepared by repeating the procedures of Example 1, except that the formation of the n-type semiconductor layer 103 was carried by the plasma CVD method using the apparatus shown in FIG. 3 under the conditions shown in Table 12 to thereby form an n-type A-SiC:H:F:P film to be the n-type semiconductor layer 103.

The characteristic properties of the thus prepared Sample No. 12 as a solar cell were evaluated. The results obtained were as shown in Table 25.

EXAMPLE 13

A pin junction photovoltaic element sample with the configuration shown in FIG. 1(A)(Sample No. 13) was prepared by repeating the procedures of Example 1, except that the formation of the n-type semiconductor layer 103 was carried out by the sputtering method using the apparatus shown in FIG. 4 under the conditions shown in Table 13 to thereby form an n-type GaAs:Si film to be the n-type semiconductor layer 103.

The characteristic properties of the thus prepared Sample 13 as a solar cell were evaluated. The results obtained were as shown in Table 25.

EXAMPLE 14

A pin junction photovoltaic element sample with the configuration shown in FIG. 1(A)(Sample No. 14) was prepared in the same manner as in Example 8, except that the formation of the i-type semiconductor layer was carried out by the plasma CVD method using the apparatus shown in FIG. 3 under the conditions shown in Table 14 to thereby form a A-Si:H film to be the i-type semiconductor layer 104.

The characteristic properties of the thus prepared Sample 14 as a solar cell were evaluated. The results obtained were as shown in Table 25.

EXAMPLE 15

A pin junction photovoltaic element sample with the configuration shown in FIG. 1(A)(Sample No. 15) was prepared in the same manner as in Example 8, except that the formation of the i-type semiconductor layer was carried out by the plasma CVD method using the apparatus shown in FIG. 3 under the conditions shown in Table 15 to thereby form a A-SiGe:H film to be the i-type semiconductor layer 104.

The characteristic properties of the thus prepared Sample 15 as a solar cell were evaluated. The results obtained were as shown in Table 25.

EXAMPLE 16

A pin junction photovoltaic element sample with the configuration shown in FIG. 1(A)(Sample No. 16) was prepared in the same manner as in Example 8, except that the formation of the i-type semiconductor layer was carried out by the plasma CVD method using the apparatus shown in FIG. 3 under the conditions shown in Table 16 to thereby form a A-SiC:H film to be the i-type semiconductor layer 104.

The characteristic properties of the thus prepared Sample 16 as a solar cell were evaluated. The results obtained were as shown in Table 25.

EXAMPLE 17

A pin junction photovoltaic element sample with the configuration shown in FIG. 1(A)(Sample No. 17) was prepared in the same manner as in Example 8, except that the formation of the i-type semiconductor layer was carried out by the sputtering method using the apparatus shown in FIG. 4 under the conditions shown in Table 17 to thereby form a A-Si:F film to be the i-type semiconductor layer 104.

The characteristic properties of the thus prepared Sample 17 as a solar cell were evaluated. The results obtained were as shown in Table 25.

EXAMPLE 18

A pin junction photovoltaic element sample with the configuration shown in FIG. 1(A)(Sample No. 18) was prepared in the same manner as in Example 8, except that the formation of the i-type semiconductor layer was carried out by the plasma CVD method using the apparatus shown in FIG. 3 under the conditions shown in Table 18 to thereby form a A-SiGeC:H film to be the i-type semiconductor layer 104.

The characteristic properties of the thus prepared Sample 18 as a solar cell were evaluated. The results obtained were as shown in Table 25.

EXAMPLE 19

A pin junction photovoltaic element sample with the configuration shown in FIG. 1(A)(Sample No. 19) was prepared in the same manner as in Example 8, except that the formation of the i-type semiconductor layer was carried out by the sputtering CVD method using the apparatus shown in FIG. 4 under the conditions shown in Table 19 to thereby form a poly-Si:H film to be the i-type semiconductor layer 104.

The characteristic properties of the thus prepared Sample 19 as a solar cell were evaluated. The results obtained were as shown in Table 25.

EXAMPLE 20

There was prepared a pin junction photovoltaic element sample with the configuration shown in FIG. 1(A)(Sample No. 20) having an n-type semiconductor layer 103 comprising a $ZnSe_{1-x}Te_x:H:Al$ film, an i-type semiconductor layer 104 comprising a A-Si:H:F film and a p-type semiconductor layer 105 comprising a A-Si:H:F:B film. The procedures of Example 8 were repeated to thereby form the lower electrode 102, the n-type semiconductor layer 103 and the i-type semiconductor layer 104. Then, the formation of the p-type semiconductor layer 105 was carried out by repeating the procedures for the formation of the n-type semiconductor layer in Example 1, except that there was fed $BF_3/H_2$ gas (=3000 ppm) at a flow rate of 40 SCCM instead of the $PH_3$ gas. The formation of the transparent electrode 106 and that of the collecting electrode were carried out respectively in the same manner as in Example 1.

The characteristic properties of the thus prepared Sample No. 20 as a solar cell were evaluated. The results obtained were as shown in Table 26.

EXAMPLE 21

There was prepared a pin junction photovoltaic element sample with the configuration shown in FIG. 1(A)(Sample No. 21) having an n-type semiconductor layer 103 comprising a $ZnSe_{1-x}Te_x:H:Al$ film, an i-type semiconductor layer 104 comprising a A-Si:H:F film and a p-type semiconductor layer 105 comprising a A-SiC:H:F:B film. The procedures of Example 8 were repeated to thereby form the lower electrode 102, the n-type semiconductor layer 103 and the i-type semiconductor layer 104. Then, the formation of the p-type semiconductor layer 105 was carried out by repeating the procedures for the formation of the n-type semiconductor layer in Example 12, except that there was fed $BF_3/H_2$ gas (=3000 ppm) at a flow rate of 25 SCCM instead of the $PH_3$ gas. The formation of the transparent electrode 106 and that of the collecting electrode were carried out respectively in the same manner as in Example 1.

The characteristic properties of the thus prepared Sample No. 21 as a solar cell were evaluated. The results obtained were as shown in Table 26.

EXAMPLE 22

There was prepared a pin junction photovoltaic element sample with the configuration shown in FIG. 1(A)(Sample No. 22) having an n-type semiconductor layer 103 comprising a $ZnSe_{1-x}Te_x:H:Al$ film, an i-type semiconductor layer 104 comprising a A-Si:H:F film and a p-type semiconductor layer 105 comprising a ZnTe:P film. The procedures of Example 8 were repeated to thereby form the lower electrode 102, the n-type semiconductor layer 103 and the i-type semiconductor layer 104. Then, the formation of the p-type semiconductor layer 105 was carried out in accordance with the sputtering method using the apparatus shown in FIG. 4 under the conditions shown in Table 20 to thereby form a ZnTe:P film to be the p-type semiconductor layer. The formation of the transparent electrode 106 and that of the collecting electrode were carried out respectively in the same manner as in Example 1.

The characteristic properties of the thus prepared Sample No. 22 as a solar cell were evaluated. The results obtained were as shown in Table 26.

EXAMPLE 23

There was prepared a pin junction photovoltaic element sample with the configuration shown in FIG. 1(A)(Sample No. 23) having an n-type semiconductor layer 103 comprising a $ZnSe_{1-x}Te_x$:H:Al film, an i-type semiconductor layer 104 comprising a A-Si:H:F film and a p-type semiconductor layer 105 comprising a GaP:Zn film. The procedures of Example 8 were repeated to thereby form the lower electrode 102, the n-type semiconductor layer 103 and the i-type semiconductor layer 104. Then, the formation of the p-type semiconductor layer 105 was carried out in accordance with the sputtering method using the apparatus shown in FIG. 4 under the conditions shown in Table 21 to thereby form a Gap:Zn film to be the p-type semiconductor layer. The formation of the transparent electrode 106 and that of the collecting electrode were carried out respectively in the same manner as in Example 1.

The characteristic properties of the thus prepared Sample No. 23 as a solar cell were evaluated. The results obtained were as shown in Table 26.

Observations on the Evaluation Results shown in Tables 22 to 26

In Tables 22 to 26, with respect to characteristic properties required for a pin junction photovoltaic element, there are indicated the following items: (a) open-circuit voltage (Voc) which is generated when the element is irradiated with AM-1.5 light (100 mW/cm$^2$); (b) short-circuit photocurrent [Isc (mA/cm$^2$)] under irradiation of AM-1.5 light; and (c) the relative value of the output which is generated when the element is irradiated with AM-1.5 light through a 450 nm interference filter versus the output which is generated when the A-Si pin-junction photovoltaic element prepared in Comparative Example 1 is irradiated through the interference filter.

In Tables 22 to 26, there are also shown the content of hydrogen atoms (H) and the proportion of crystal grain domains per unit volume in the $ZnSe_{1-x}Te_x$:H:M film, which were measured to see if said film constituting the photovoltaic element meets the requirements for the content of hydrogen atoms (H) and the proportion of crystal grain domains per unit volume specified in the present invention.

The evaluation results indicate the following.

That is, it is understood that any of the pin junction photovoltaic elements prepared in Examples 1 to 3 respectively having an n-type semiconductor layer comprising an n-typed non-single crystal silicon-containing film, an i-type semiconductor layer comprising a non-single crystal silicon-containing film and a p-type semiconductor layer comprising a specific $ZnSe_{1-x}Te_x$:H:Mp film containing the specific amount of hydrogen atoms, having the specific proportion of crystal grain domains per unit volume and also having the specific quantitative ratio of Se to Te generates a higher open-circuit voltage, a higher short-circuit photocurrent and a higher output than the A-Si base pin junction photovoltaic element.

As for the pin junction phtovoltaic elements respectively having a p-type semiconductor layer comprising a specific $ZnSe_{1-x}Te_x$:H:Mp film and an i-type semiconductor layer comprising a A-SiC:H:F film, a A-SiGe:H:F film or a poly-Si:H:F film which were obtained in Examples 4, 5 and 6, it is understood that any of the elements is desirably high in the value of the Voc and also in the value of the Isc, surpassing the A-Si base pin junction photovoltaic element and comparative to those obtained in Examples 1 to 3.

As for the pin junction photovoltaic element with the configuration shown in FIG. 1(B) having a p-type semiconductor layer comprising a specific $ZnSe_{1-x}Te_x$:H:Mp film and an i-type and n-type semiconductor layers respectively comprising a A-Si:H:F film in this order from the side of the substrate which was obtained in Example 7, it is understood that the element has satisfactory photovoltaic element characteristic properties as well as those pin junction photovoltaic elements obtained in Examples 1 to 3.

As for the pin junction photovoltaic element having an n-type semiconductor layer comprising a specific $ZnSe_{1-x}Te_x$:H:Mn film, an i-type semiconductor layer comprising a A-Si:H:F film and a p-type semiconductor layer comprising a specific $ZnSe_{1-x}Te_x$:H:Mp film which was obtained in Example 8, it is understood that the element is desirably satisfactory for any of the above evaluation items (a) to (c) and it is surpassing the A-Si base pin junction photovoltaic element.

In comparative Example 2, there were prepared two pin junction photovoltaic elements. One of them (Sample No. 2') was prepared in the same manner as in Example 1 except that no H$_2$ gas was used at the time of forming the p-type semiconductor layer. The other one (Sample No. 3') was prepared in the same manner as in Example 1 except that the flow rate of H$_2$ gas to be fed was changed at the time of forming the p-type semiconductor layer. For Sample No. 1', it is understood that the content of hydrogen atoms, the proportion of crystal grain domains per unit volume, and the quantitative ratio of Se to Te for the p-type semiconductor layer are all outside the specific ranges according to the present invention, and the pin junction photovoltaic element of Sample No. 2' is inferior to any of the pin junction photovoltaic elements obtained in the examples of the present invention. Likewise, the pin junction photovoltaic element of Sample No. 3' is inferior to any of the pin junction photovoltaic elements obtained in the examples of the present invention.

In Comparative Example 3, there was prepared a pin junction photovoltaic element (Sample No. 4') in the same manner as in Example 1 except that the flow rate of DESe and the flow rate of DETe were changed at the time of forming the p-type semiconductor layer. In this respect, it is understood that the $ZnSe_{1-x}Te_x$:H:Mp film to constitute the p-type semiconductor layer is such that the proportion of crystal grain domains per unit volume and the quantitative ratio of Se to Te are all outside the specific ranges according to the present invention and the pin junction photovoltaic element of Sample No. 4' is inferior to any of the pin junction photovoltaic elements obtained in the examples of the present invention.

In Comparative Example 4, there were prepared three pin junction photovoltaic elements (Samples Nos. 5', 6' and 7') in the same manner except that their i-type semiconductor layers were formed by the sputtering method so that each of the layers was comprised of a A-Si base film containing neither hydrogen atoms nor fluorine atoms. It is understood that any of the elements is inferior to any of the pin junction photovoltaic elements obtained in the examples of the present invention, although any of them has a p-type semiconductor layer comprising a specific $ZnSe_{1-x}Te_x$:H:Mp film.

In Example 9, there was prepared a triple-cells stacked pin junction photovoltaic element (Sample No. 9), the three p-type semiconductor layers being comprised of a specific $ZnSe_{1-x}Te_x$:H:Mp film and all of the remaining i-type and n-type semiconductor layers being comprised of A-Si base films containing hydrogen atoms and fluorine atoms. And in Comparative Example 5, there was also prepared a triple-cells stacked pin junction photovoltaic element (Sample No. 8'), all of the p-type, i-type and n-type semiconductor layers being comprised of A-Si base films containing hydrogen atoms and fluorine atoms.

And as for Sample No. 9 (Example 9) and Sample No. 8' (Comparative Example 5), as shown in Table 24, there was examined, in addition to the value of the Voc and the value of the Isc, the change in photoelectric conversion efficiency that takes place after continuous irradiation with AM-1.5 light for 10 hours: the change is expressed by $\Delta\eta/\eta_o$, where $\Delta\eta$ is the amount of change in photoelectric conversion efficiency and $\Delta\eta$ is the initial photoelectric conversion efficiency.

The results of Table 24 indicate: (1) the element of Sample No. 9 is superior to the element of Sample No. 8' with respect to the Voc and the Isc and (2) for the $\Delta\eta/\eta_o$, at a glance it is likely that there is a little difference between the two, however it is understood that the element of Sample No. 9 is superior to the element of Sample No. 8' with respect to the inital characteristics and the repeated usability for a long period of time as a solar cell in the viewpoint that though the change in its photoelectric conversion efficiency of a pin junction photovoltaic element is small at a glance, the photoelectric conversion efficiency is deteriorated within a short period of time, that is within a period of less than 10 hours upon its use and the said change thereafter is slow.

In Examples 10 to 13, there were used a specific $ZnSe_{1-x}Te_x$:H:Mp film as the p-type semiconductor layer and a A-Si:H:F film as the i-type semiconductor layer, then as the n-type semiconductor layer, there were used a ZnSe:Ga film (in Example 10), a A-SiGe:H:F:P film (in Example 11), a A-SiC:H:F:P film (in Example 12) and a GaAs:Si film (in Example 13).

As Table 25 illustrates, it is understood that any of the pin junction photovoltaic elements obtained in Examples 10 to 13 is a desired one which is high in the Voc and the Isc.

In Examples 14 to 19, there were used a specific $ZnSe_{1-x}Te_x$:H:Mp film as the p-type semiconductor layer and a specific $ZnSe_{1-x}Te_x$:H:Mn film as the n-type semiconductor layer, then as the i-type semiconductor layer, there were used a A-Si:H film (in Example 14), a A-SiGe:H film (in Example 15), a A-SiC:H film (in Example 16), a A-Si:F film (in Example 17), a A-SiGeC:H film (in Example 18) and a poly-Si:H film (in Example 19).

As Table 25 illustrates, it is understood that any of the pin junction photovoltaic elements obtained in Examples 14 to 19 is a desired one which is high in the Voc and the Isc.

In Examples 20 to 23, there were used a specific $ZnSe_{1-x}Te_x$:H:Mn film as the n-type semiconductor layer and a A-Si:H:F film as the i-type semiconductor layer, then as the p-type semiconductor layer, there were used a A-Si:H:F:B (in Example 20), a A-SiC:H:F:B film (in Example 21), a ZnTe:P film (in Example 22) and a GaP:Zn film (in Example 23).

As Table 26 illustrates, it is understood that any of the pin junction photovoltaic elements obtained in Examples 20 to 23 is a desired one which is high in the Voc and the Isc.

TABLE 1

| | |
|---|---|
| substrate temperature | 200° C. |
| raw material gas (A) | DEZn $1.0 \times 10^{-6}$ mol/min |
| | He 10 sccm |
| raw material gas (B) | DESe $3.0 \times 10^{-6}$ mol/min |
| | DETe $8.0 \times 10^{-6}$ mol/min |
| | He 15 sccm |
| | H$_2$* 1.5 sccm ~ 1 slm |
| inner pressure | 0.5 Torr |
| power of activation energy | 200 W |
| | (microwave of 2.45 GHz) |
| distance between activation chamber and liberation hole for gas from gas feed pipe | 5 cm |
| *flow rate of the H$_2$ gas | |
| Sample | |
| No. 1 | 0.1 sccm |
| No. 2 | 0.3 sccm |
| No. 3 | 1 sccm |
| No. 4 | 3 sccm |
| No. 5 | 5 sccm |
| No. 6 | 10 sccm |
| No. 7 | 15 sccm |
| No. 8 | 20 sccm |
| No. 9 | 30 sccm |
| No. 10 | 100 sccm |
| No. 11 | 300 sccm |
| No. 12 | 1 slm |

Note:
DEZn: $(C_2H_4)_2Zn$
DESe: $(C_2H_4)_2Se$

TABLE 2

| | composition (atomic %) | | |
|---|---|---|---|
| Sample No. | Zn | Se | Te |
| 1 | 48 | 10 | 42 |
| 2 | 52 | 9 | 39 |
| 3 | 50 | 11 | 39 |
| 4 | 47 | 11 | 42 |
| 5 | 54 | 10 | 36 |
| 6 | 53 | 9 | 37 |
| 7 | 52 | 9 | 39 |
| 8 | 53 | 10 | 37 |
| 9 | 52 | 10 | 38 |
| 10 | 49 | 11 | 40 |
| 11 | 53 | 9 | 38 |
| 12 | 51 | 10 | 39 |

TABLE 3

| | |
|---|---|
| substrate temperature | 200° C. |
| raw material gas (A) | DEZn $1.0 \times 10^{-6}$ mol/min |

TABLE 3-continued

| | |
|---|---|
| raw material gas (B) | He 10 sccm<br>LiC$_3$H$_7$ 1.0 × 10$^{-10}$ mol/min<br>DESe** 0 ~ 1.5 × 10$^{-5}$ mol/min<br>DETe** 0 ~ 1.0 × 10$^{-5}$ mol/min<br>He 15 sccm<br>H$_2$* 1.5 sccm ~ 1 slm |
| inner pressure | 0.5 Torr |
| power of activation energy | 200 W (microwave of 2.45 GHz) |
| distance between activation chamber and liberation hole for gas from gas feed pipe | 5 cm |

*flow rate of the H$_2$ gas:

| Sample | |
|---|---|
| No. 1-N | 0.1 sccm |
| No. 2-N | 0.3 sccm |
| No. 3-N | 1 sccm |
| No. 4-N | 3 sccm |
| No. 5-N | 5 sccm |
| No. 6-N | 10 sccm |
| No. 7-N | 15 sccm |
| No. 8-N | 20 sccm |
| No. 9-N | 30 sccm |
| No. 10-N | 100 sccm |
| No. 11-N | 300 sccm |
| No. 12-N | 1 slm |

**amounts of DESe and DETe to be introduced

| | Sample No. | DESe (mol/min) | DETe (mol/min) |
|---|---|---|---|
| adjustments of the amounts of DESe and DETe to be introduced were made by changing respective set temperatures of the corresponding bubblers | L-1 | 1.5 × 10$^{-5}$ | 0 |
| | L-2 | 1.35 × 10$^{-5}$ | 1 × 10$^{-6}$ |
| | L-3 | 1.2 × 10$^{-5}$ | 2 × 10$^{-6}$ |
| | L-4 | 1.05 × 10$^{-5}$ | 3 × 10$^{-5}$ |
| | L-5 | 9.0 × 10$^{-6}$ | 4 × 10$^{-6}$ |
| | L-6 | 7.5 × 10$^{-6}$ | 5 × 10$^{-6}$ |
| | L-7 | 6.0 × 10$^{-6}$ | 6 × 10$^{-6}$ |
| | L-8 | 4.5 × 10$^{-6}$ | 7 × 10$^{-6}$ |
| | L-9 | 3.0 × 10$^{-6}$ | 8 × 10$^{-6}$ |
| | L-10 | 1.5 × 10$^{-6}$ | 9 × 10$^{-6}$ |
| | L-11 | 0 | 1 × 10$^{-5}$ |

TABLE 4

| | |
|---|---|
| substrate temperature | 200° C. |
| raw material gas (A) | DEZn 1.0 × 10$^{-6}$ mol/min<br>He 10 sccm<br>dopant supplying raw material<br>TMGa 5 × 10$^{-11}$ mol/min<br>or<br>LiC$_3$H$_7$ 1.0 × 10$^{-10}$ mol/min |
| raw material gas (B) | DESe 0 ~ 1.2 × 10$^{-5}$ mol/min<br>DETe 0 ~ 1.0 × 10$^{-5}$ mol/min<br>He 15 sccm<br>H$_2$ 15 sccm |
| inner pressure | 0.5 Torr |
| power of activation energy | 200 W (microwave of 2.45 GHz) |
| distance between activation chamber and liberation hole for gas from gas feed pipe | 5 cm |

Note:
DEZn: (C$_2$H$_4$)$_2$Zn
DESe: (C$_2$H$_4$)$_2$Se
DETe: (C$_2$H$_4$)$_2$Te

TABLE 5

| | p-type semiconductor layer | i-type semiconductor layer | n-type semiconductor layer | short-circuit photocurrent under irradiation of AM-1.5 light Isc [mA/cm$^2$] | open-circuit voltage under irradiation of AM-1.5 light Voc [volt] | total evaluation |
|---|---|---|---|---|---|---|
| present invention | ZnSe$_{1-x}$Te$_x$:H:Li | A-Si:H:F | | | | |
| | | poly-Si:H:F | | | | |
| | | A-SiC:H:F | | | | |
| | | A-SiGe:H:F | | | | |
| Comparative example (I) | ZnSe$_{1-x}$Te$_x$:Li | A-Si:H:F | A-Si:H:P | Δ | Δ | Δ |
| | | poly-Si:H:F | | Δ | X | X |
| | | A-SiC:H:F | | X | Δ | X |
| | | A-SiGe:H:F | | | X | X |
| | ZnTe:B | A-Si:H:F | | Δ | Δ | Δ |
| | CdTe:Li | A-Si:H | | Δ | Δ | Δ |
| Comparative example (II) | ZnSe$_{1-x}$Te$_x$:H:Li | A-Si | | X | X | X |
| | | poly-Si | | X | Δ | X |
| | | A-SiC | | X | X | X |

TABLE 5-continued

| p-type semiconductor layer | i-type semiconductor layer | n-type semiconductor layer | short-circuit photocurrent under irradiation of AM-1.5 light Isc [mA/cm$^2$] | open-circuit voltage under irradiation of AM-1.5 light Voc [volt] | total evaluation |
|---|---|---|---|---|---|
| | A-SiGe | | X | Δ | X |

Note:
◎ : excellent
○ : good
Δ: practically acceptable
X: practically not acceptable

TABLE 6

Conditions for the preparation of p-type ZnSe$_{1-x}$Te$_x$:H:Li film (hereinafter referred to as "preparation method 1")

| | |
|---|---|
| substrate temperature | 200° C. |
| raw material gas (A) | DEZn 1.0 × 10$^{-6}$ mol/min |
| | He 10 sccm |
| | dopant supplying raw material |
| | LiC$_3$H$_7$ 1.0 × 10$^{-9}$ mol/min |
| raw material gas (B) | DESe 3.0 × 10$^{-6}$ mol/min |
| | DETe 8.0 × 10$^{-6}$ mol/min |
| | He 10 sccm |
| | H$_2$ 15 sccm |
| inner pressure | 0.5 Torr |
| power of activation energy | 200 W (microwave of 2.45 GHz) |

Note:
DEZn: (C$_2$H$_4$)$_2$Zn
DESe: (C$_2$H$_4$)$_2$Se
DETe: (D$_2$H$_4$)$_2$Te

TABLE 7

Conditions for the preparation of p-type ZnSe$_{1-x}$Te$_x$:H:Li film (hereinafter referred to as "preparation method 2")

| | |
|---|---|
| substrate temperature | 300° C. |
| raw material gas (A) | DEZn 1.2 × 10$^{-6}$ mol/min |
| | He 10 sccm |
| | LiC$_3$H$_7$ 1.0 × 10$^{-10}$ mol/min |
| raw material gas (B) | DESe 3.0 × 10$^{-6}$ mol/min |
| | DETe 8.0 × 10$^{-6}$ mol/min |
| | He 10 sccm |
| | H$_2$ 15 sccm |
| inner pressure | 1.0 Torr |
| high frequency power | 50 W (13.56 MHz) |

Note:
DEZn: (C$_2$H$_4$)$_2$Zn
DESe: (C$_2$H$_4$)$_2$Se
DETe: (C$_2$H$_4$)$_2$Te

TABLE 8

Conditions for the preparation of p-type ZnSe$_{1-x}$Te$_x$:H:Li film (hereinafter referred to as "preparation method 3")

| | |
|---|---|
| target material | polycrystal ZnSe$_{0.2}$Te$_{0.8}$ |
| substrate temperature | 300° C. |
| flow rate of Ar gas | 10 sccm |
| flow rate of LiC$_3$H$_7$ gas | 1.3 × 10$^{-10}$ mol/min |

TABLE 8-continued

Conditions for the preparation of p-type ZnSe$_{1-x}$Te$_x$:H:Li film (hereinafter referred to as "preparation method 3")

| | |
|---|---|
| flow rate of H$_2$ gas | 10 sccm |
| inner pressure | 0.05 Torr |
| high frequency power | 300 W (13.56 MHz) |

TABLE 9

Conditions for the preparation of A-Si, A-SiC and A-SiGe films

| | Sample 12 | Sample 13 | Sample 14 |
|---|---|---|---|
| target material | polycrystal Si | SiC particles being dispersedly fixed on polycrystal Si | Ge particles being dispersedly fixed on polycrystal Si |
| substrate temperature | 200° C. | 200° C. | 200° C. |
| flow rate of Ar gas | 10 sccm | 10 sccm | 10 sccm |
| inner pressure | 0.05 Torr | 0.05 Torr | 0.05 Torr |
| high frequency power (13.56 MHz) | 300 W | 300 W | 300 W |

TABLE 10

Conditions for the preparation of n-type ZnSe:Ga film

| | |
|---|---|
| target material | polycrystal ZnSe |
| substrate temperature | 200° C. |
| flow rate of Ar gas | 50 sccm |
| flow rate of Ar gas to bubble Ga(CH$_3$) | 2 sccm |
| inner pressure | 0.06 Torr |
| high frequency power | 350 W (13.56 MHz) |

TABLE 11

Conditions for the preparation of n-type A-SiGe:H:F:P film

| | |
|---|---|
| substrate temperature | 200° C. |
| flow rate of Si$_2$H$_6$ gas | 6 sccm |
| flow rate of GeF$_4$ gas | 4 sccm |
| flow rate of PH$_3$ gas (diluted by H$_2$ gas to 3000 ppm) | 5 sccm |
| flow rate of H$_2$ gas | 200 sccm |
| inner pressure | 1.2 Torr |
| high frequency power | 35 W (13.56 MHz) |

TABLE 12

Conditions for the preparation of n-type A-SiC:H:F:P film

| | |
|---|---|
| substrate temperature | 200° C. |
| flow rate of Si$_2$F$_4$ gas | 25 sccm |
| flow rate of CH$_4$ gas | 3 sccm |
| flow rate of H$_2$ gas | 250 sccm |
| flow rate of PH$_3$ gas (diluted by H$_2$ gas to 3000 ppm) | 18 sccm |
| inner pressure | 1.0 Torr |
| high frequency power | 45 W (13.56 MHz) |

TABLE 13

| Conditions for the preparation of n-type GaAs:Si film | |
|---|---|
| target material | polycrystal GaAs |
| substrate temperature | 200° C. |
| flow rate of Ar gas | 50 sccm |
| flow rate of SiH$_4$ gas (diluted by Ar gas to 1000 ppm) | 8 sccm |
| inner pressure | 0.04 Torr |
| high frequency power | 350 W (13.56 MHz) |

TABLE 14

| Conditions for the preparation of i-type A—Si:H film | |
|---|---|
| substrate temperature | 200° C. |
| flow rate of Si$_2$H$_6$ gas | 10 sccm |
| flow rate of H$_2$ gas | 300 sccm |
| inner pressure | 1.5 Torr |
| high frequency power | 30W (13.56MHz) |

TABLE 15

| Conditions for the preparation of i-type A—SiGe:H film | |
|---|---|
| substrate temperature | 200° C. |
| flow rate of Si$_2$H$_6$ gas | 8 sccm |
| flow rate of GeH$_4$ gas | 3.5 sccm |
| flow rate of H$_2$ gas | 250 sccm |
| inner pressure | 1.2 Torr |
| high frequency power | 25W (13.56MHz) |

TABLE 16

| Conditions for the preparation of i-type A—SiC:H film | |
|---|---|
| substrate temperature | 200° C. |
| flow rate of SiH$_4$ gas | 80 sccm |
| flow rate of CH$_4$ gas | 6 sccm |
| flow rate of H$_2$ gas | 250 sccm |
| inner pressure | 0.8 Torr |
| high frequency power | 50W (13.56MHz) |

TABLE 17

| Conditions for the preparation of i-type A—Si:F film | |
|---|---|
| target material | Single-crystal Si wafer |
| substrate temperature | 200° C. |
| flow rate of Ar gas | 80 sccm |
| flow rate of F$_2$ gas | 5 sccm |
| inner pressure | 0.04 Torr |

TABLE 17-continued

| Conditions for the preparation of i-type A—Si:F film | |
|---|---|
| high frequency power | 400W (13.56MHz) |

TABLE 18

| Conditions for the preparation of i-type A—SiGe:C:H film | |
|---|---|
| substrate temperature | 200° C. |
| flow rate of SiH$_4$ gas | 30 sccm |
| flow rate of GeH$_4$ gas | 20 sccm |
| flow rate of CH$_4$ gas | 2 sccm |
| flow rate of H$_2$ gas | 200 sccm |
| inner pressure | 0.8 Torr |
| high frequency power | 40W (13.56MHz) |

TABLE 19

| Conditions for the preparation of i-type poly-Si:H film | |
|---|---|
| target material | Single-crystal Si |
| substrate temperature | 200° C. |
| flow rate of Ar gas | 20 sccm |
| flow rate of H$_2$ gas | 30 sccm |
| inner pressure | 0.04 Torr |
| high frequency power | 400W (13.56MHz) |

TABLE 20

| Conditions for the preparation of p-type ZnTe:P film | |
|---|---|
| target material | polycrystal ZnTe |
| substrate temperature | 200° C. |
| flow rate of Ar gas | 50 sccm |
| flow rate of PH$_3$ gas (diluted by Ar gas to 2000 ppm) | 10 sccm |
| inner pressure | 0.04 Torr |
| high frequency power | 300W (13.56MHz) |

TABLE 21

| Conditions for the preparation of p-type GaP:Zn film | |
|---|---|
| target material | polycrystal GaP |
| substrate temperature | 200° C. |
| flow rate of Ar gas | 50 sccm |
| flow rate of Ar gas to bubble Zn(CH$_3$)$_3$ | 3 sccm |
| inner pressure | 0.05 Torr |
| high frequency power | 350W (13.56MHz) |

TABLE 22

| Sample No. | semiconductor layer* | characteristics of p-type ZnSe$_{1-x}$Te$_x$ | | | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|---|
| | | content of hydrogen atoms [atomic %] | volume percentage of crystal grain [%] | quantitative ratio of Se to Te | | | |
| 1 | p-type ZnSe$_{1-x}$Te$_x$:H(1) i-type A—Si:H:F n-type A—Si:H:F | 2.2 | 74 | 2.2:7.8 | 0.95 | 17.5 | 1.9 |
| 2 | p-type ZnSe$_{1-x}$Te$_x$:H(2) i-type A—Si:H:F n-type A—Si:H:F | 2.4 | 72 | 2.1:7.9 | 0.94 | 17.2 | 1.7 |
| 3 | p-type ZnSe$_{1-x}$Te$_x$:H(3) i-type A—Si:H:F n-type A—Si:H:F | 2.4 | 70 | 2.3:7.7 | 0.92 | 16.8 | 1.5 |
| 4 | p-type ZnSe$_{1-x}$Te$_x$:H(1) i-type A—SiC:H:F n-type A—Si:H:F | 2.2 | 74 | 2.2:7.8 | 1.14 | 12.4 | 1.4 |
| 5 | p-type ZnSe$_{1-x}$Te$_x$:H(1) i-type A—SiGe:H:F n-type A—Si:H:F | 2.2 | 74 | 2.2:7.8 | 0.60 | 20.5 | 1.3 |
| 6 | p-type ZnSe$_{1-x}$Te$_x$:H(1) i-type polycrystal A—Si:H:F | 2.2 | 74 | 2.2:7.8 | 0.55 | 18.2 | 1.0 |

TABLE 22-continued

| Sample No. | semiconductor layer* | characteristics of p-type ZnSe$_{1-x}$Te$_x$ | | | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|---|
| | | content of hydrogen atoms [atomic %] | volume percentage of crystal grain [%] | quantitative ratio of Se to Te | | | |
| 7 | n-type A—Si:H:F p-type ZnSe$_{1-x}$Te$_x$:H(1) i-type A—Si:H:F n-type A—Si:H:F | 2.2 | 74 | 2.2:7.8 | 0.92 | 17.7 | 1.8 |
| 8 | p-type ZnSe$_{1-x}$Te$_x$:H(1) i-type A—Si:H:F n-type Znse$_{1-x}$Te$_x$:H | 2.2 | 74 | 2.2:7.8 | 0.93 | 18.0 | 2.0 |

Note*: the numeral mentioned in the parenthesis indicates the corresponding preparation method.

TABLE 23

| Sample No. | semiconductor layer* | characteristics of p-type ZnSe$_{1-x}$Te$_x$ | | | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|---|
| | | content of hydrogen atoms [atomic %] | volume percentage of crystal grain [%] | quantitative ratio of Se to Te | | | |
| 1' | p-type A—Si:H:F i-type A—Si:H:F n-type A—Si:H:F | — | — | — | 0.75 | 14.0 | 1 |
| 2' | p-type ZnSe$_{1-x}$Te$_x$:H(1) i-type A—Si:H:F n-type A—Si:H:F | 0.1 | 89 | 2.1:7.9 | 0.34 | 6.2 | 0.12 |
| 3' | p-type ZnSe$_{1-x}$Te$_x$:H(1) i-type A—Si:H:F n-type A—Si:H:F | 2.2 | 28 | 2.2:7.8 | 0.57 | 10.2 | 0.47 |
| 4' | p-type ZnSe$_{1-x}$Te$_x$:H(1) i-type A—Si:H:F n-type A—Si:H:F | 2.7 | 48 | 4.9:5.1 | 0.72 | 13.8 | 0.96 |
| 5' | p-type ZnSe$_{1-x}$Te$_x$:H(1) i-type A—Si n-type A—Si:H:F | 2.2 | 74 | 2.2:7.8 | 0.17 | 2.4 | 0.05 |
| 6' | p-type ZnSe$_{1-x}$Te$_x$:H(1) i-type A—SiC n-type A—Si:H:F | 2.2 | 74 | 2.2:7.8 | 0.02 | 1.1 | 0.01 |
| 7' | p-type ZnSe$_{1-x}$Te$_x$:H(1) i-type A—SiGe n-type A—Si:H:F | 2.2 | 74 | 2.2:7.8 | 0.05 | 1.8 | 0.03 |

Note*: the numeral mentioned in the parenthesis indicates the corresponding preparation method.

TABLE 24

| Sample No. | semiconductor layer* | open-circuit voltage under irradiation of AM-1.5 light Voc [volt] | short-circuit photocurrent under irradiation of AM-1.5 light Isc [mA/cm$^2$] | rate of change in conversion efficienc after irradiation of AM-1.5 light for 10 hours [$\Delta\eta/\eta_0$] |
|---|---|---|---|---|
| 9 (Example 9) | p-type ZnSe$_{1-x}$Te$_x$(1) i-type A-SiC:H:F n-type A—Si:H:F p-type ZnSe$_{1-x}$Te$_x$(1) i-type A—Si:H:F n-type A—Se:H:F p-type ZnSe$_{1-x}$Te$_x$:H(1) i-type A—SiGe:H:F n-type A—Si:H:F | 2.65 | 7.1 | 2.3 |
| 8' (Comparative example 5) | p-type A—Si:H:F i-type A—SiC:H:F n-type A—Si:H:F p-type A—Si:H:F i-type A—Si:H:F n-type A—Si:H:F p-type A—Si:H:F i-type A—SiGe:H:F n-type A—Si:H:F | 2.31 | 6.1 | 2.7 |

Note*: the numeral mentioned in the parenthesis indicates the corresponding preparation method.

TABLE 25

| Sample No. | semiconductor layer* | characteristics of p-type $ZnSe_{1-x}Te_x$ | | | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|---|
| | | content of hydrogen atoms [atomic %] | volume percentage of crystal grain [%] | quantitative ratio of Se to Te | | | |
| 10 | p-type $ZnSe_{1-x}Te_x$:H(1) | 2.3 | 74 | 2.2:7.8 | | | |
|    | i-type A—Si:H:F | | | | 0.92 | 17.9 | 1.8 |
|    | n-type ZnSe | | | | | | |
| 11 | p-type $ZnSe_{1-x}Te_x$:H(1) | 2.2 | 74 | 2.2:7.8 | | | |
|    | i-type A—Si:H:F | | | | 0.93 | 17.7 | 1.7 |
|    | n-type A—SiGe:H:F | | | | | | |
| 12 | p type $ZnSe_{1-x}Te_x$:H(1) | 2.2 | 75 | 2.3:7.7 | | | |
|    | i-type A—Si:H:F | | | | 0.98 | 18.1 | 1.9 |
|    | n-type A—SiC:H:F | | | | | | |
| 13 | p-type $ZnSe_{1-x}Te_x$:H(1) | 2.3 | 75 | 2.2:7.8 | | | |
|    | i-type A—Si:H:F | | | | 0.96 | 17.8 | 1.7 |
|    | n-type GaAs | | | | | | |
| 14 | p-type $ZnSe_{1-x}Te_x$:H(1) | 2.3 | 75 | 2.3:7.7 | | | |
|    | i-type A—Si:H | | | | 0.94 | 17.8 | 1.8 |
|    | n-type $ZnSe_{1-x}Te_x$:H(1) | 2.1 | 74 | 2.2:7.8 | | | |
| 15 | p-type $ZnSe_{1-x}Te_x$:H(1) | 2.2 | 74 | 2.1:7.9 | | | |
|    | i-type A—SiGe:H | | | | 0.59 | 20.1 | 1.3 |
|    | n-type $ZnSe_{1-x}Te_x$:H(1) | 2.2 | 75 | 2.2:7.7 | | | |
| 16 | p-type $ZnSe_{1-x}Te_x$:H(1) | 2.3 | 74 | 2.3:7.8 | | | |
|    | i-type A—SiC:H | | | | 1.12 | 12.2 | 1.4 |
|    | n-type $ZnSe_{1-x}Te_x$:H(1) | 2.2 | 75 | 2.2:7.8 | | | |
| 17 | p-type $ZnSe_{1-x}Te_x$:H(1) | 2.1 | 74 | 2.3:7.7 | | | |
|    | i-type A—Si:F | | | | 0.94 | 17.8 | 1.9 |
|    | n-type $ZnSe_{1-x}Te_x$:H(1) | 2.2 | 74 | 2.2:7.8 | | | |
| 18 | p-type $ZnSe_{1-x}Te_x$:H(1) | 2.2 | 74 | 2.2:7.7 | | | |
|    | i-type A—SiGeC:H | | | | 0.58 | 19.8 | 1.2 |
|    | p-type $ZnSe_{1-x}Te_x$:H(1) | 2.2 | 75 | 2.2:7.8 | | | |
| 19 | p-type $ZnSe_{1-x}Te_x$:H(1) | 2.8 | 74 | 2.3:7.7 | | | |
|    | i-type poly-Si:H | | | | 0.53 | 18.5 | 1.1 |
|    | n-type $ZnSe_{1-x}Te_x$:H(1) | 2.1 | 74 | 2.3:7.8 | | | |

Note*: the numeral mentioned in the parenthesis indicates the corresponding preparation method.

TABLE 26

| Sample No. | semiconductor layer* | characteristics of p-type $ZnSe_{1-x}Te_x$ | | | open-circuit voltage under irradiation of AM-1.5 light Voc [volt] | short-circuit photocurrent under irradiation of AM-1.5 light Isc [mA/cm$^2$] | output value under irradiation of AM-1.5 light (using 450 nm interference filter) [relative value] |
|---|---|---|---|---|---|---|---|
| | | content of hydrogen atoms [atomic %] | volume percentage of crystal grain [%] | quantitative ratio of Se to Te | | | |
| 20 | p-type A—Si:H:F | | | | | | |
|    | i-type A—Si:H:F | | | | 0.77 | 14.3 | 1.2 |
|    | n-type $ZnSe_{1-x}Te_x$:H(1) | 2.8 | 75 | 2.1:7.9 | | | |
| 21 | p-type A—SiC:H:F | | | | | | |
|    | i-type A—Si:H:F | | | | 0.95 | 17.2 | 1.4 |
|    | n-type $ZnSe_{1-x}Te_x$:H(1) | 2.8 | 78 | 2.2:7.8 | | | |
| 22 | p-type ZnTe | | | | | | |
|    | i-type A—Si:H:F | | | | 0.98 | 17.7 | 1.6 |
|    | n-type $ZnSe_{1-x}Te_x$:H(1) | 2.7 | 76 | 2.3:7.7 | | | |
| 23 | p-type GaP | | | | | | |
|    | i-type A—Si:H:F | | | | 0.97 | 17.5 | 1.5 |
|    | n-type $ZnSe_{1-x}Te_x$:H(1) | 2.8 | 75 | 2.4:7.6 | | | |

Note*: the numeral mentioned in the parenthesis indicates the corresponding preparation method.

What we claim is:

1. An improved pin junction photovoltaic element which comprises a p-type semiconductor layer, an i-type semiconductor layer and an n-type semiconductor layer being stacked, characterized in that at least one of said p-type semiconductor layer and said n-type semiconductor layer comprises a p-type or n-type film comprised of zinc atoms, selenium atoms, tellurium atoms and hydrogen atoms; the quantitative ratio of said selenium atoms to said tellurium atoms is in the range of from 1:9 to 3:7 in terms of atomic ratio in said film: the amount of said hydrogen atoms in said film is in the range of from 1 to 4 atomic %; said film contains crystal grain domains in a proportion of 65 to 85 vol % per unit volume; and said film contains a dopant of p-type or n-type; and said i-type semiconductor layer comprises a non-single crystal film containing silicon atoms and at least one kind of hydrogen atoms and fluorine atoms.

2. The pin junction photovoltaic element according to claim 1, wherein said p-type dopant to be contained in said deposited film to constitute the p-type semiconductor layer is a member selected from the group consisting of Group IA elements and Group VA elements of the Periodic Table.

3. The pin junction photovoltaic element according to claim 2, wherein said member is lithium.

4. The pin junction photovoltaic element according to claim 1, wherein said n-type dopant to be contained in said deposited film to constitute the n-type semiconductor layer is a member selected from the group consisting of Group IIIA elements and Group IVA elements of the Periodic Table.

5. The pin junction photovoltaic element according to claim 4, wherein said element is aluminum or gallium.

6. The pin junction photovoltaic element according to claim 1, wherein said non-single crystal film to constitute the i-type semiconductor layer further contains at least one kind of carbon atoms and germanium atoms.

7. An improved pin junction photovoltaic element which comprises a p-type semiconductor layer, an i-type semiconductor layer and an n-type semiconductor layer being stacked, characterized in that said p-type semiconductor layer comprises a p-type film comprised of zinc atoms, selenium atoms, tellurium atoms and hydrogen atoms; the quantitative ratio of said selenium atoms to said tellurium atoms is in the range of from 1:9 to 3:7 in terms of atomic ratio in said film; the amount of said hydrogen atoms in said film is in the range of from 1 to 4 atomic %; said film contains crystal grain domains in a proportion of 65 to 85 vol % per unit volume; and said film contains a p-type dopant selected from the group consisting of Group IA elements and Group VA elements of the Periodic Table; said i-type semiconductor layer comprises a non-single crystal film selected from the group consisting of non-single crystal films containing silicon atoms as the matrix and at least one kind of hydrogen atoms and fluorine atoms and non-single crystal films containing silicon atoms, at least one kind of carbon atoms and germanium atoms and at least one kind of hydrogen atoms and germanium atoms; and said n-type semiconductor layer comprises an n-type film comprised of zinc atoms, selenium atoms, tellurium atoms and hydrogen atoms; the quantitative ratio of said selenium atoms to said tellurium atoms is in the range of from 1:9 to 3:7 in terms of atomic ratio in said film; the amount of said hydrogen atoms in said film is in the range of from 1 to 4 atomic %; said film contains crystal grain domains in a proportion of 65 to 85 vol % per unit volume and said film contains an n-type dopant selected from the group consisting of Group IIIA elements and Group IVA elements of the Periodic Table.

8. The pin junction photovoltaic element according to claim 7, wherein said p-type dopant is lithium and said n-type dopant is aluminum or gallium.

* * * * *

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

It is certified that error appears in the above-identified patent and that said Letters Patent is hereby corrected as shown below:

On the title page, in item [54], "P OR" should read --P- OR--; "AMOUNT" should read --AN AMOUNT--; and "DOPAND" should read --DOPANT--.

IN [56] REFERENCES CITED

OTHER PUBLICATIONS, "Transistor" should read --Transistors--; "Polycrystalline Silicon Film"," should read --Polycrystalline-Silicon Films", IEEE Electron Device Letters, Vol. EDL-1, No. 8, August,--; and "Crystal"," should read --Crystals", J. Appl. Phys., Vol. 43, No. 1, January 1972,--.

IN [57] ABSTRACT

Line 7, "typed or n-typed $ZSnSe_{1-x}Te_x$:H:M film," should read --type or n-type $ZnSe_{1-x}Te_x$:H:M film,--.

IN THE DRAWINGS:
SHEET 7 OF 16

FIG. 6, "conduetivity" should read --conductivity--.

COLUMN 1

Line 3, "P OR" should read --P- OR--.
    Line 6, "AMOUNT" should read --AN AMOUNT-- and "DOPAND" should read --DOPANT--.

COLUMN 3

Line 8, "commerically" should read --commercially--.
    Line 55, "defines" should read --is defined--.

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

It is certified that error appears in the above-identified patent and that said Letters Patent is hereby corrected as shown below:

COLUMN 5

Line 22, "a" should be deleted.
Line 53, "that" should read --a--.
Line 59, "film"), the" should read --film"). The--.

COLUMN 6

Line 11, "(1) a pin" should read --¶ (1) a pin--.
Line 63, "Nos. 1'12'" should read --Nos. 1'- 12'--.

COLUMN 7

Line 8, "contining" should read --containing--.
Line 10, "chaning" should read --changing--.

COLUMN 9

Line 22, "One" should read --The--.
Line 23, "(1.0 X $10^{10}$mol/min)" should read --(1.0 X $10^{-10}$mol/min)--.
Line 31, "The" should read --One--.
Line 62, "contains" should read --contain--.

COLUMN 10

Line 21, "domans" should read --domains--.

COLUMN 11

Line 5, "intese" should read --intense--.
Line 16, "to" should be deleted.
Line 48, "as" should be deleted.

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

Page 3 of 12

It is certified that error appears in the above-identified patent and that said Letters Patent is hereby corrected as shown below:

COLUMN 12

Line 22, "being" should read --is made--.
Line 35, "determin" should read --determine--.
Line 37, "being as" should read --ratio being--.
Line 52, "of" should be deleted.

COLUMN 13

Line 29, "determin" should read --determine--.
Line 39, "pendency of d" should read --dependency--.
Line 43, "of" should be deleted.

COLUMN 14

Line 53, "non doped" should read --non-doped--.
Line 54, "ZnSe$_{1-x}$:H:M" should read --ZnSe$_{1-x}$Te$_x$:H:M--.

COLUMN 15

Line 2, "(p-typed)" should read --(p-type)--.
Line 3, "(n-typed)" should read --(n-type)--.
Line 52, "n-typed" should read --n-type--.

COLUMN 16

Line 7, "n-typed" should read --n-type--.
Line 20, "ZnSe$_{1-x}$Te$_x$H:Mn" should read --ZnSe$_{1-x}$Te$_x$:H:Mn--.
Line 21, "p-typed" should read --p-type--.
Line 29, "p-typed" should read --p-type--.
Line 30, "p-typed" should read --p-type--.
Line 52, "p-typed" should read --p-type--.

UNITED STATES PATENT AND TRADEMARK OFFICE
CERTIFICATE OF CORRECTION

PATENT NO.  : 5,008,726
DATED       : April 16, 1991
INVENTOR(S) : KATSUMI NAKAGAWA, ET AL.

It is certified that error appears in the above-identified patent and that said Letters Patent is hereby corrected as shown below:

COLUMN 17

Line 42, "the" should read --with the-- and "is that" should be deleted.
    Line 43, "being" should be deleted.
    Line 53, "$ZnSe_{1-x}Te_xH$" should read --$ZnSe_{1-x}Te_x:H$--.
    Line 54, "bounds" should read --bonds--.
    Line 66, "contains" should be deleted.

COLUMN 18

Line 41, "lattic" should read --lattice--.
    Line 48, "crystl" should read --crystal--.
    Line 49, "case" should read --cause--.
    Line 60, "greately" should read --greatly--.
    Line 61, "$ZnSe_{1-x}Te_x:HM$" should read --$ZnSe_{1-x}Te_x:M$--.

COLUMN 19

Line 1, "ray" should read --rays--.
    Line 22, "become to" should be deleted.
    Line 57, "whitelight" should read --white-light--.

COLUMN 20

Line 47, "the others place" should read --place of the other--.

COLUMN 21

Line 31, "as" should read --of--.
    Line 64, "the" (second occurrence) should read --of--.

UNITED STATES PATENT AND TRADEMARK OFFICE
CERTIFICATE OF CORRECTION

PATENT NO. : 5,008,726

DATED : April 16, 1991

INVENTOR(S) : KATSUMI NAKAGAWA, ET AL.

It is certified that error appears in the above-identified patent and that said Letters Patent is hereby corrected as shown below:

COLUMN 22

Line 6, "a" should read --an--.
    Line 57, "to" should be deleted.

COLUMN 23

Line 37, "of" should be deleted.

COLUMN 24

Line 37, "evaluate" should read --evaluated--.
    Line 50, "are" should read --film are--.
    Line 54, "belonging" should read --film belonging--.

COLUMN 25

Line 11, "affored" should read --afforded--.
    Line 22, "type" should be deleted.
    Line 39, "resulting" should read --result--.
    Line 42, "resulting" should read --result--.
    Line 68, "$ZnSe_{1-x}Te_xH$" should read --$ZnSe_{1-x}Te_x:H$--.

COLUMN 26

Line 12, "$ZnSe_{1-x}Te_xH$" should read --$ZnSe_{1-x}Te_x:H$--.
    Line 20, "and form" should read --, forming--.
    Line 37, "preapre" should read --prepare--.

COLUMN 28

Line 64, "$ZnSe_{1-x}Te_xH$" should read --$ZnSe_{1-x}Te_x:H$--.

UNITED STATES PATENT AND TRADEMARK OFFICE
CERTIFICATE OF CORRECTION

PATENT NO. : 5,008,726

DATED : April 16, 1991

INVENTOR(S) : KATSUMI NAKAGAWA, ET AL.

Page 6 of 12

It is certified that error appears in the above-identified patent and that said Letters Patent is hereby corrected as shown below:

COLUMN 29

Line 14, "is produced" should be deleted.
    Line 24, "4 W/cm$^2$" should read --4 W/cm$^2$.--.
    Line 28, "1 X 10$^1$ Torr," should read --1 X 10$^{-1}$ Torr,--.
    Line 47, "process" should read --processes--.
    Line 51, "Non-Si(C.,Ge)(H,F)" should read
           --Non-Si(C,Ge)(H,F)--.
    Line 54, "Non-Si(C.-" should read --Non-Si(C- --.

COLUMN 30

Line 4, "innert" should read --inert--.
    Line 40, "GeH$_4$s" should read --GeH$_4$ as--.
    Line 44, "regards" should read --regard--.
    Line 54, "regards" should read --regard--.

COLUMN 31

Line 18, "ipipe" should read --pipe--.
    Line 28, "gase" should read --gas--.
    Line 34, "on" should read --of--.

COLUMN 32

Line 30, "ZnSe$_{1-x}$Te$_x$H" should read --ZnSe$_{1-x}$Te$_x$:H--.

COLUMN 33

Line 16, "being" should read --was being--.
    Line 49, "1.0 X 10$^6$ mol/min." should read
           --1.0 X 10$^{-6}$ mol/min.--.

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

It is certified that error appears in the above-identified patent and that said Letters Patent is hereby corrected as shown below:

COLUMN 33

Line 52, "1.0 X $10^9$ mol/min." should read --1.0 X $10^{-9}$ mol/min.--.
Line 55, "3.0 X $10^6$ mol/min." should read --3.0 X $10^{-6}$ mol/min.-- and "8.0 X $10^6$ mol/min." should read --8.0 X $10^{-6}$ mol/min.--.
Line 56, "DEZn" should read --DEZn.--.
Line 58, "being" should read --was being--.

COLUMN 34

Line 54, "$ZnSe_{1-x}Te_xH:Li$" should read --$ZnSe_{1-x}Te_x:H:Li$--.

COLUMN 35

Line 25, "$ZnSe_{1-x}Te_xH:Li$" should read --$ZnSe_{1-x}Te_x:H:Li$--.

COLUMN 36

Line 3, "pipe 401." should read --pipe 408.--.
Line 24, "place" should read --plate--.
Line 35, "by" should read --was prepared by--.
Line 40, "$10^{-5}$" should read --$10^{-5}$ Torr--.
Line 61, "by" should read --was prepared by--.
Line 66, "$10^{-5}$" should read --$10^{-5}$ Torr--.

UNITED STATES PATENT AND TRADEMARK OFFICE
CERTIFICATE OF CORRECTION

PATENT NO. : 5,008,726

DATED : April 16, 1991

INVENTOR(S) : KATSUMI NAKAGAWA, ET AL.

It is certified that error appears in the above-identified patent and that said Letters Patent is hereby corrected as shown below:

COLUMN 37

Line 19, "by" should read --was prepared by--.
Line 24, "$10^{-5}$" should read --$10^{-5}$ Torr--.
Line 45, "using" should read --was prepared using--.
Line 54, "A-Si:H:F:P," should read --A-Si:H:F:P film,--.

COLUMN 38

Line 2, "$ZnSe_{1-x}Te_xH$ Al" should read --$ZnSe_{1-x}Te_x$:H:Al--.
Line 5, "in stead" should read --instead--.
Line 19, "with" should read --manner with--.
Line 24, "being" should read --was being--.

COLUMN 39

Line 9, "a" should read --as--.
Line 37, "gaps." should read --gaps was prepared.--.
Line 47, "Example" should read --Example 7--.
Line 65, "com-shaped" should read --comb-shaped--.

COLUMN 40

Line 13, "Example 1" should read --Example 1.--.
Line 36, "by" should read --out by--.
Line 51, "by" should read --out by--.

COLUMN 42

Line 7, "CVD" should be deleted.
Line 29, "in" should read --instead--.
Line 30, "stead" should be deleted.

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

It is certified that error appears in the above-identified patent and that said Letters Patent is hereby corrected as shown below:

COLUMN 42

Line 52, "in" should read --instead--.
Line 53, "stead" should be deleted.
Line 65, "$ZnSe_{1-x}Te_xH:Al$" should read --$ZnSe_{1-x}Te_x:H:Al$--.

COLUMN 43

Line 66, "n-typed" should read --n-type--.

COLUMN 44

Line 9, "phtovoltaic" should read --photovoltaic--.
Line 22, "an" should be deleted.

COLUMN 45

Line 34, "$\Delta\eta$" should read --$\eta$o--.

COLUMN 47

TABLE 3-continued,

"DETe (mol/min)          should          --DETe (mol/min)
         0                read                    0
    $1 \times 10^{-6}$                        $1 \times 10^{-6}$
    $2 \times 10^{-6}$                        $2 \times 10^{-6}$
    $3 \times 10^{-5}$"                       $3 \times 10^{-6}$--.

UNITED STATES PATENT AND TRADEMARK OFFICE
CERTIFICATE OF CORRECTION

PATENT NO. : 5,008,726

DATED : April 16, 1991

INVENTOR(S) : KATSUMI NAKAGAWA, ET AL.

It is certified that error appears in the above-identified patent and that said Letters Patent is hereby corrected as shown below:

COLUMN 48

TABLE 5, "Isc [mA/cm²]    Voc [volt]    evaluation

| Isc [mA/cm²] | Voc [volt] | evaluation |
|---|---|---|
| Δ | Δ | Δ |
| Δ | X | X |
| X | Δ | X |
|   | X | X |
| Δ | Δ | Δ |
| Δ | Δ | Δ |
| X | X | X |
| X | Δ | X |
| X | X | X |

"

should read --Isc [mA/cm²]    Voc [volt]    evaluation

| Isc [mA/cm²] | Voc [volt] | evaluation |
|---|---|---|
| O | O | O |
| O | O | O |
| O | ⊙ | ⊙ |
| ⊙ | O | ⊙ |
| Δ | Δ | Δ |
| Δ | X | X |
| Δ | Δ | X |
| X | X | X |
| O | Δ | Δ |
| Δ | Δ | Δ |
| Δ | Δ | X |
| X | X | X |
| X | Δ | X |
| X | X |   |

--.

UNITED STATES PATENT AND TRADEMARK OFFICE
CERTIFICATE OF CORRECTION

PATENT NO. : 5,008,726

DATED : April 16, 1991

INVENTOR(S) : KATSUMI NAKAGAWA, ET AL.

It is certified that error appears in the above-identified patent and that said Letters Patent is hereby corrected as shown below:

COLUMN 49

TABLE 5-continued, " :good" should read --O:good--.
TABLE 6, "DETe: $(D_2H_4)_2Te$" should read --DETe: $(C_2H_4)_2Te$--.

COLUMN 50

TABLE 12, "flow rate of $Si_2F_4$ gas" should read
--flow rate of $SiF_4$ gas--.

COLUMN 53

TABLE 22-continued,
"n-type $Znse_{1-x}Te_x:H$" should read
--n-type $ZnSe_{1-x}Te_x:H$--.

TABLE 23, "0.96      should      --0.96
            0.05      read        0.04
            0.01"                 0.01--.

TABLE 24, "n-type A-Se:H:F" should read
--n-type A-Si:H:F--.

COLUMN 54

TABLE 24, "efficienc" should read --efficiency--.

UNITED STATES PATENT AND TRADEMARK OFFICE
CERTIFICATE OF CORRECTION

PATENT NO. : 5,008,726
DATED : April 16, 1991
INVENTOR(S) : KATSUMI NAKAGAWA, ET AL.

It is certified that error appears in the above-identified patent and that said Letters Patent is hereby corrected as shown below:

COLUMN 55

TABLE 25, "p-type $ZnSe_{1-x}Te_x:H(1)$" should read --n-type $ZnSe_{1-x}Te_x:H(1)$--.

TABLE 25, "2.2    74    should      --2.2    75
          2.2    74    read          2.3    74
          2.2    75                  2.2    75
          2.8    74                  2.3    74
          2.1    74"                 2.1    74--.

Line 64, "film:" should read --film;--.
Line 68, "volume:" should read --volume--.

COLUMN 57

Line 22, "volume:" should read --volume--.

Signed and Sealed this

Fourteenth Day of February, 1995

Attest:

BRUCE LEHMAN

Attesting Officer       Commissioner of Patents and Trademarks